(12) United States Patent
Sasagawa et al.

(10) Patent No.: US 9,853,165 B2
(45) Date of Patent: Dec. 26, 2017

(54) METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shinya Sasagawa, Kanagawa (JP); Akihisa Shimomura, Kanagawa (JP); Katsuaki Tochibayashi, Kanagawa (JP); Yuta Endo, Kanagawa (JP); Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/853,542

(22) Filed: Sep. 14, 2015

(65) Prior Publication Data

US 2016/0087105 A1  Mar. 24, 2016

(30) Foreign Application Priority Data

Sep. 19, 2014  (JP) ................................. 2014-191690

(51) Int. Cl.
*H01L 29/786* (2006.01)
*H01L 21/311* (2006.01)
(Continued)

(52) U.S. Cl.
CPC .... *H01L 29/7869* (2013.01); *H01L 21/31116* (2013.01); *H01L 21/31138* (2013.01);
(Continued)

(58) Field of Classification Search
CPC ........... H01L 21/76802; H01L 21/0337; H01L 21/02274; H01L 21/02063
See application file for complete search history.

(56) References Cited

U.S. PATENT DOCUMENTS 5,731,856 A    3/1998  Kim et al.
5,744,864 A    4/1998  Cillessen et al.
(Continued)

FOREIGN PATENT DOCUMENTS

CN    102714180 A    10/2012
EP      1737044 A    12/2006
(Continued)

OTHER PUBLICATIONS

International Search Report (Application No. PCT/IB2015/056728) Dated Dec. 15, 2015.
(Continued)

*Primary Examiner* — Karen Kusumakar
(74) *Attorney, Agent, or Firm* — Fish & Richardson P.C.

(57) ABSTRACT

A method for manufacturing a semiconductor device, including the steps of forming a semiconductor over a substrate; forming a first conductor over the semiconductor; forming a first insulator over the first conductor; forming a resist over the first insulator; performing light exposure and development on the resist to make a second region and a third region remain and expose part of the first insulator; applying a bias in a direction perpendicular to a top surface of the substrate and generating plasma using a gas containing carbon and halogen; and depositing and etching an organic substance with the plasma. The etching rate of the organic substance is higher than the deposition rate of the organic substance in an exposed part of the first insulator, and the deposition rate of the organic substance is higher than the etching rate of the organic substance in a side surface of the second region.

15 Claims, 53 Drawing Sheets

(51) Int. Cl.
 *H01L 21/3213* (2006.01)
 *H01L 27/12* (2006.01)
(52) U.S. Cl.
 CPC .. *H01L 21/31144* (2013.01); *H01L 21/32136* (2013.01); *H01L 21/32139* (2013.01); *H01L 27/1225* (2013.01); *H01L 29/78648* (2013.01)

(56) References Cited

U.S. PATENT DOCUMENTS

| | | | |
|---|---|---|---|
| 6,228,775 B1 * | 5/2001 | Coburn | H01L 21/31116 216/67 |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,875,419 B2 | 1/2011 | Nagai et al. | |
| 8,389,417 B2 | 3/2013 | Yamazaki et al. | |
| 8,432,187 B2 | 4/2013 | Kato et al. | |
| 8,629,445 B2 | 1/2014 | Tanaka et al. | |
| 8,642,483 B2 * | 2/2014 | Honda | H01L 21/0212 257/E21.214 |
| 8,779,479 B2 | 7/2014 | Yamazaki et al. | |
| 9,048,265 B2 | 6/2015 | Hondo et al. | |
| 9,048,323 B2 | 6/2015 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2005/0253272 A1 * | 11/2005 | Ohtake | H01L 21/31138 257/759 |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108160 A1 | 5/2007 | Ngo et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0191711 A1 * | 7/2009 | Rui | G03F 7/40 438/695 |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0114945 A1 | 5/2011 | Yamazaki et al. | |
| 2011/0187410 A1 | 8/2011 | Kato et al. | |
| 2012/0025191 A1 | 2/2012 | Yamazaki | |
| 2013/0140554 A1 | 6/2013 | Yamazaki et al. | |
| 2013/0161605 A1 | 6/2013 | Sasagawa et al. | |
| 2013/0161621 A1 | 6/2013 | Isobe et al. | |
| 2013/0187151 A1 | 7/2013 | Yamazaki | |
| 2013/0187161 A1 | 7/2013 | Yamazaki | |
| 2013/0285050 A1 | 10/2013 | Yamazaki et al. | |
| 2014/0103346 A1 | 4/2014 | Yamazaki | |
| 2014/0106504 A1 | 4/2014 | Yamazaki et al. | |
| 2014/0183529 A1 | 7/2014 | Yamazaki et al. | |
| 2014/0209898 A1 | 7/2014 | Yamamoto et al. | |
| 2014/0239294 A1 | 8/2014 | Yamazaki | |
| 2014/0264323 A1 | 9/2014 | Sasagawa et al. | |
| 2014/0287552 A1 | 9/2014 | Muraoka et al. | |
| 2014/0312346 A1 | 10/2014 | Yamazaki et al. | |
| 2015/0200657 A1 | 7/2015 | Kato et al. | |
| 2015/0280003 A1 | 10/2015 | Yamazaki et al. | |
| 2015/0280013 A1 | 10/2015 | Yamazaki et al. | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-186111 A | 7/1996 |
| JP | 08-264794 A | 10/1996 |

(56) References Cited

FOREIGN PATENT DOCUMENTS

| | | |
|---|---|---|
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-124557 A | 6/2011 |
| JP | 2011-142621 A | 7/2011 |
| JP | 2012-049514 A | 3/2012 |
| JP | 2013-251534 A | 12/2013 |
| JP | 2014-209593 A | 11/2014 |
| KR | 2012-0091450 A | 8/2012 |
| KR | 2013-0122554 A | 11/2013 |
| TW | 201135913 | 10/2011 |
| TW | 201140581 | 11/2011 |
| TW | 201220352 | 5/2012 |
| WO | WO-2004/114391 | 12/2004 |
| WO | WO-2011/058913 | 5/2011 |
| WO | WO-2011/070905 | 6/2011 |
| WO | WO-2012/014786 | 2/2012 |

OTHER PUBLICATIONS

Written Opinion (Application No. PCT/IB2015/056728) Dated Dec. 15, 2015.

Fortunato.E et al., "Wide-Bandgap High-Mobility ZnO Thin-Film Transistors Produced At Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White TANDEM OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transistion:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AMOLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In'Ga–Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

* cited by examiner 2200   2100

2200   2100

FIG. 32A1
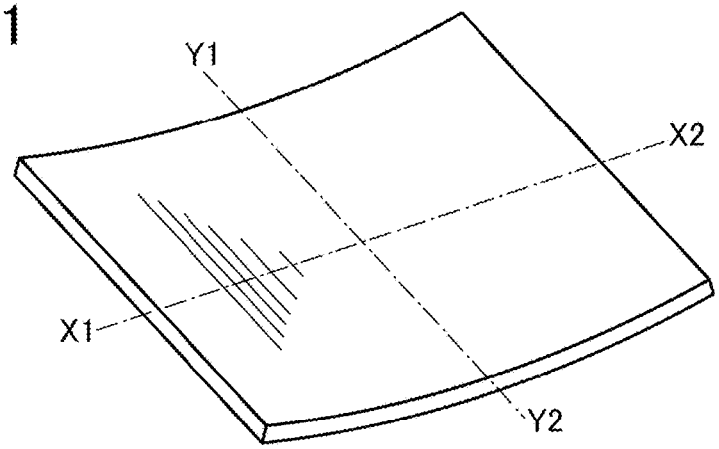
FIG. 32A2
FIG. 32A3
FIG. 32B1
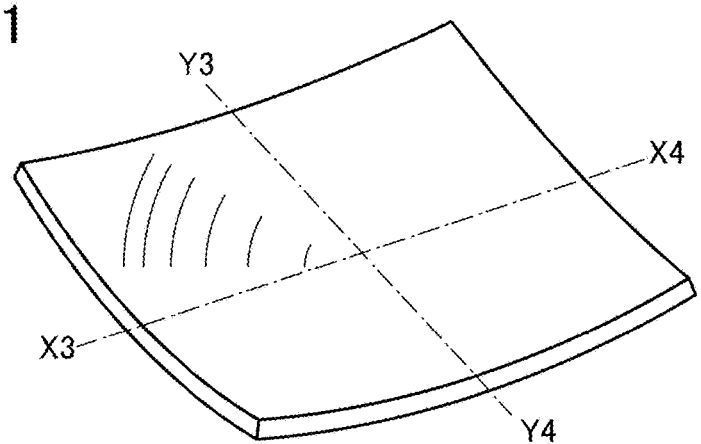
FIG. 32B2
FIG. 32B3
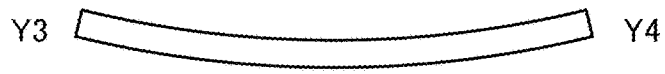

FIG. 41A
FIG. 41B
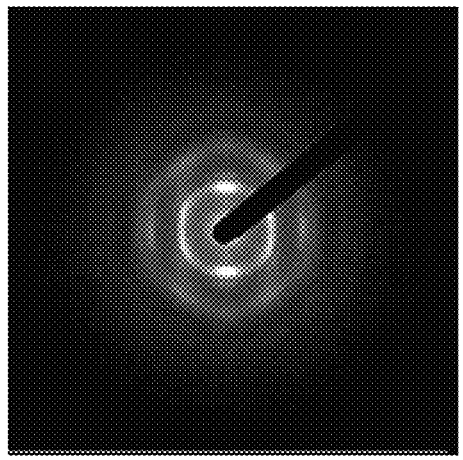
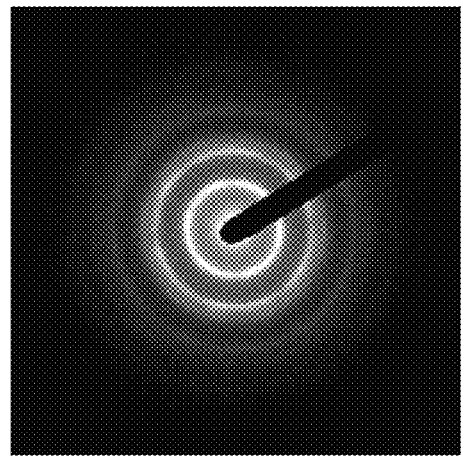

METHOD FOR MANUFACTURING SEMICONDUCTOR DEVICE

TECHNICAL FIELD

The present invention relates to, for example, a semiconductor, a conductor, an insulator, a transistor, or a semiconductor device. The present invention relates to, for example, a method for manufacturing a semiconductor, a conductor, an insulator, a transistor, or a semiconductor device. The present invention relates to, for example, a semiconductor, a conductor, an insulator, a display device, a light-emitting device, a lighting device, a power storage device, a memory device, a processor, or an electronic device. The present invention relates to a method for manufacturing a semiconductor, a conductor, an insulator, a display device, a liquid crystal display device, a light-emitting device, a memory device, or an electronic device. The present invention relates to a driving method of a semiconductor device, a display device, a liquid crystal display device, a light-emitting device, a memory device, or an electronic device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a semiconductor circuit, and an electronic device include a semiconductor device in some cases.

BACKGROUND ART

A technique for forming a transistor by using a semiconductor over a substrate having an insulating surface has attracted attention. The transistor is applied to a wide range of semiconductor devices such as an integrated circuit and a display device. Silicon is known as a semiconductor applicable to a transistor.

As silicon which is used as a semiconductor of a transistor, either amorphous silicon or polycrystalline silicon is used depending on the purpose. For example, in the case of a transistor included in a large display device, it is preferable to use amorphous silicon, which can be used to form a film on a large substrate with the established technique. In the case of a transistor included in a high-performance display device where a driver circuit and a pixel circuit are formed over the same substrate, it is preferable to use polycrystalline silicon, which can be used to form a transistor having a high field-effect mobility. As a method for forming polycrystalline silicon, high-temperature heat treatment or laser light treatment which is performed on amorphous silicon has been known.

In recent years, transistors including oxide semiconductors (typically, In—Ga—Zn oxide) have been actively developed.

Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

The transistor including an oxide semiconductor has different features from a transistor including amorphous silicon or polycrystalline silicon. For example, a display device in which a transistor including an oxide semiconductor is used is known to have small power consumption. An oxide semiconductor can be formed by a sputtering method or the like, and thus can be used in a transistor included in a large display device. Because a transistor including an oxide semiconductor has high field-effect mobility, a high-performance display device in which, for example, a driver circuit and a pixel circuit are formed over the same substrate can be obtained. In addition, there is an advantage that capital investment can be reduced because part of production equipment for a transistor including amorphous silicon can be retrofitted and utilized.

REFERENCE

Patent Document

[Patent Document 1] Japanese Published Patent Application No. S63-239117
[Patent Document 2] Japanese translation of PCT international application No. H11-505377

DISCLOSURE OF INVENTION

An object is to provide a minute shape. Another object is to provide a transistor with a small channel length. Another object is to provide a transistor with a small subthreshold swing value. Another object is to provide a transistor having a small short-channel effect. Another object is to provide a transistor with normally-off electrical characteristics. Another object is to provide a transistor having a low leakage current in an off state. Another object is to provide a transistor with excellent electrical characteristics. Another object is to provide a highly reliable transistor. Another object is to provide a transistor with high frequency characteristics.

Another object is to provide a semiconductor device including the transistor. Another object is to provide a module including the semiconductor device. Another object is to provide an electronic device including the semiconductor device or the module. Another object is to provide a novel semiconductor device. Another object is to provide a novel module. Another object is to provide a novel electronic device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a method for manufacturing a semiconductor device, including the steps of forming a semiconductor over a substrate; forming a first conductor over the semiconductor; forming a first insulator over the first conductor; forming a resist over the first insulator; performing light exposure and development on the resist to make a second region and a third region of the resist remain and expose part of the first insulator; applying a bias in a direction perpendicular to a top surface of the substrate and generating plasma using a gas containing carbon and halogen; depositing and etching an organic substance with the plasma; etching the first insulator using the organic substance, the second region, and the third region as masks to form a second insulator and a third insulator and expose the first conductor; etching the first conductor using the second insulator and the third insulator as masks to form a second conductor and a third conductor and expose the semiconductor; removing the organic substance, the second region, and the third region; forming a fourth insulator over an exposed part of the semiconductor; and forming a fourth conductor over the fourth insulator. In the embodiment, an etching rate of the organic substance is higher than a deposition rate of the organic substance in the exposed part of the first insulator, and the deposition rate of the organic substance is higher than the etching rate of the organic substance in a side surface of the second region.

In the above structure of one embodiment of the present invention, a distance between the second conductor and the third conductor is less than or equal to 80% of a distance between the second region and the third region.

A minute shape can be provided. A transistor with a small channel length can be provided. A transistor with a small subthreshold swing value can be provided. A transistor having a small short-channel effect can be provided. A transistor with normally-off electrical characteristics can be provided. A transistor having a low leakage current in an off state can be provided. A transistor with excellent electrical characteristics can be provided. A highly reliable transistor can be provided. A transistor with high frequency characteristics can be provided.

A semiconductor device including the transistor can be provided. A module including the semiconductor device can be provided. An electronic device including the semiconductor device or the module can be provided. A novel semiconductor device can be provided. A novel module can be provided. A novel electronic device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 32A1 to 32A3 and 32B1 to 32B3 are perspective views and cross-sectional views of semiconductor devices of one embodiment of the present invention.

FIGS. 41A and 41B show electron diffraction patterns of a CAAC-OS.

BEST MODE FOR CARRYING OUT THE INVENTION

Figure 1A:
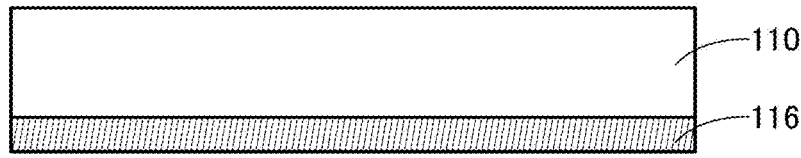
FIGS. 1A to 1E are cross-sectional views illustrating a method for manufacturing a semiconductor device of one embodiment of the present invention.

Hereinafter, embodiments and examples of the present invention will be described in detail with the reference to the drawings. However, the present invention is not limited to the description below, and it is easily understood by those skilled in the art that modes and details disclosed herein can be modified in various ways. Further, the present invention is not construed as being limited to description of the embodiments and the examples. In describing structures of the present invention with reference to the drawings, common reference numerals are used for the same portions in different drawings. Note that the same hatched pattern is applied to similar parts, and the similar parts are not especially denoted by reference numerals in some cases.

Note that the size, the thickness of films (layers), or regions in drawings is sometimes exaggerated for simplicity.

In this specification, the terms "film" and "layer" can be interchanged with each other.

A voltage usually refers to a potential difference between a given potential and a reference potential (e.g., a source potential or a ground potential (GND)). A voltage can be referred to as a potential and vice versa. Note that in general, a potential (a voltage) is relative and is determined depending on the amount relative to a certain potential. Therefore, a potential which is represented as a "ground potential" or the like is not always 0 V. For example, the lowest potential in a circuit may be represented as a "ground potential". Alternatively, a substantially intermediate potential in a circuit may be represented as a "ground potential". In these cases, a positive potential and a negative potential are set using the potential as a reference.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

Note that a "semiconductor" has characteristics of an "insulator" in some cases when the conductivity is sufficiently low, for example. Further, a "semiconductor" and an "insulator" cannot be strictly distinguished from each other in some cases because a border therebetween is not clear. Accordingly, a "semiconductor" in this specification can be called an "insulator" in some cases. Similarly, an "insulator" in this specification can be called a "semiconductor" in some cases.

Further, a "semiconductor" has characteristics of a "conductor" in some cases when the conductivity is sufficiently high, for example. Further, a "semiconductor" and a "conductor" cannot be strictly distinguished from each other in some cases because a border therebetween is not clear. Accordingly, a "semiconductor" in this specification can be called a "conductor" in some cases. Similarly, a "conductor" in this specification can be called a "semiconductor" in some cases.

Note that an impurity in a semiconductor refers to, for example, elements other than the main components of the semiconductor. For example, an element with a concentration of lower than 0.1 atomic % is an impurity. When an impurity is contained, the density of states (DOS) may be formed in a semiconductor, the carrier mobility may be decreased, or the crystallinity may be decreased. In the case where the semiconductor is an oxide semiconductor, examples of an impurity which changes characteristics of the semiconductor include Group 1 elements, Group 2 elements, Group 14 elements, Group 15 elements, and transition metals other than the main components; specifically, there are hydrogen (included in water), lithium, sodium, silicon, boron, phosphorus, carbon, and nitrogen, for example. In the case of an oxide semiconductor, oxygen vacancies may be formed by entry of impurities such as hydrogen. In the case where the semiconductor is silicon, examples of an impurity which changes characteristics of the semiconductor include oxygen, Group 1 elements except hydrogen, Group 2 elements, Group 13 elements, and Group 15 elements.

In this specification, the phrase "A has a region with a concentration B" includes, for example, "the concentration of the entire region in a region of A in the depth direction is B", "the average concentration in a region of A in the depth direction is B", "the median value of a concentration in a region of A in the depth direction is B", "the maximum value of a concentration in a region of A in the depth direction is B", "the minimum value of a concentration in a region of A in the depth direction is B", "a convergence value of a concentration in a region of A in the depth direction is B", and "a concentration in a region of A in which a probable value is obtained in measurement is B".

In this specification, the phrase "A has a region with a size B, a length B, a thickness B, a width B, or a distance B" includes, for example, "the size, the length, the thickness, the width, or the distance of the entire region in a region of A is B", "the average value of the size, the length, the thickness, the width, or the distance of a region of A is B", "the median value of the size, the length, the thickness, the width, or the distance of a region of A is B", "the maximum value of the size, the length, the thickness, the width, or the distance of a region of A is B", "the minimum value of the size, the length, the thickness, the width, or the distance of a region of A is B", "a convergence value of the size, the length, the thickness, the width, or the distance of a region of A is B", and "the size, the length, the thickness, the width, or the distance of a region of A in which a probable value is obtained in measurement is B".

Note that the channel length refers to, for example, the distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a plan view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where a current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that depending on transistor structures, a channel width in a region where a channel is formed actually (hereinafter referred to as an effective channel width) is different from a channel width shown in a plan view of a transistor (hereinafter referred to as an apparent channel width) in some cases. For example, in a transistor having a three-dimensional structure, an effective channel width is greater than an apparent channel width shown in a plan view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the plan view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a plan view of a transistor, an apparent channel width that is a length of a portion where a source and a drain face each other in a region where a semiconductor and a gate electrode overlap with each other is referred to as a surrounded channel width (SCW) in some cases. Further, in this specification, in the case where the term "channel width" is simply used, it may denote a surrounded channel width and an apparent channel width. Alternatively, in this specification, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, the values might be different from those calculated by using an effective channel width.

Note that in this specification, the description "A has a shape such that an end portion extends beyond an end portion of B" may indicate, for example, the case where at least one of end portions of A is positioned on an outer side than at least one of end portions of B in a top view or a cross-sectional view. Thus, the description "A has a shape such that an end portion extends beyond an end portion of B" can be read as the description "one end portion of A is positioned on an outer side than one end portion of B in a top view," for example.

In this specification, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. A term "substantially perpendicular" indicates that the angle formed between two straight lines is greater than or equal to 60° and less than or equal to 120°.

In this specification, trigonal and rhombohedral crystal systems are included in a hexagonal crystal system.

<Processing Method 1>

A method for processing a conductor, an insulator, or a semiconductor of one embodiment of the present invention is described below.

First, a layer 116 and a layer 110 over the layer 116 are prepared (see FIG. 1A). A conductor, an insulator, or a semiconductor can be used as the layer 116. In addition, a conductor, an insulator, or a semiconductor can be used as the layer 110.

The conductor may be formed to have a single-layer structure or a stacked-layer structure including a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound may be used, for example, and a conductor containing aluminum, a conductor containing copper and titanium, a conductor containing copper and manganese, a conductor containing indium, tin, and oxygen, a conductor containing titanium and nitrogen, or the like may be used.

The insulator may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used as the insulator. In particular, an oxide containing silicon is preferably used.

As the semiconductor, a Group 14 semiconductor such as silicon or germanium, a compound semiconductor such as silicon carbide, germanium silicide, gallium arsenide, indium phosphide, zinc selenide, cadmium sulfide, or an oxide semiconductor, an organic semiconductor, or the like may be used. An oxide semiconductor is described later.

Next, a bottom anti-reflective coating (BARC) is formed. Then, a resist is formed. After that, the resist is processed. To process the resist, first, the resist is exposed to light using a photomask or the like. At this time, the action of the BARC can inhibit halation. Next, a light-exposed region is removed or left using a developing solution, so that resists 122 are formed. For the light exposure of the resist, KrF excimer laser light, ArF excimer laser light, extreme ultraviolet (EUV) light, or the like may be used. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam.

Figure 1B:
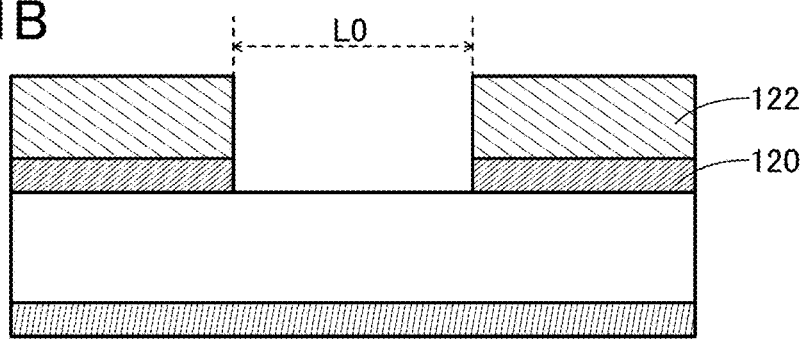

Next, the BARC is etched using the resists 122 as masks to form BARCs 120 (see FIG. 1B). Note that in some cases, an organic or inorganic substance without a function of an anti-reflection layer may be used instead of the BARCs 120. A structure without the BARCs 120 may be employed in some cases.

The distance between the resists 122 is denoted by L0. The minimum (also referred to as the minimum feature size) of L0 is determined by a light-exposure apparatus, a resist, or the like.

Next, plasma treatment is performed. The plasma treatment can be performed by a parallel plate reactive ion etching (RIE) method, an inductively coupled plasma (ICP) etching method, or the like.

Plasma is generated with the use of a gas containing carbon and halogen. The plasma reacts with carbon, hydrogen, and the like contained in the resists 122 and the like, whereby an organic substance is deposited over the processing surfaces (e.g., the top and side surfaces of the resists 122, the side surfaces of the BARCs 120, and an exposed part of the layer 110). The organic substance is deposited isotropically. Here, when a bias is applied in a direction perpendicular to the top surfaces of the layers 116 and 110, deposition and etching of the organic substance occur concurrently. The etching of the organic substance is performed anisotropically because the etching rate in the direction of the bias application is high.

As the gas containing carbon and halogen, for example, a gas containing carbon and fluorine, such as a trifluoromethane gas, a tetrafluoromethane gas, a hexafluoroethane gas, a hexafluoropropane gas, an octafluoropropane gas, or an octafluorocyclobutane gas; a gas containing carbon and chlorine, such as a carbon tetrachloride gas; or the like can be used. Alternatively, hydrogen, a rare gas such as helium or argon, and the like may be mixed to be used.

The deposition and etching rates of the organic substance are determined by the composite action of various conditions. For example, increasing the proportion of carbon in the gas used for generating plasma increases the deposition rate, whereas increasing the proportion of halogen in the gas increases the etching rate. Furthermore, for example, reducing the bias reduces the etching rate, whereas increasing the bias increases the etching rate. Here, conditions that make the etching rate higher than the deposition rate in the direction of the bias application are used. Therefore, the organic substance on the top surfaces of the resists 122 and the exposed part of the layer 110 is etched almost as soon as it is deposited. Furthermore, the exposed part of the layer 110 is also etched. Note that it is possible not to etch the exposed part of the layer 110, according to the conditions of the plasma treatment. Furthermore, the conditions of the plasma treatment can be changed in stages, e.g., in two stages or three stages.

Figure 1C:
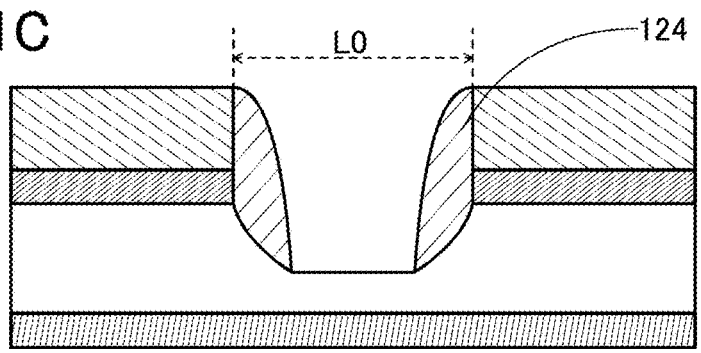

Meanwhile, the etching rate of the organic substance is lower than the deposition rate thereof on the side surfaces of the resists 122 and on the side surfaces of the BARCs 120. Accordingly, an organic substance 124 is deposited on the regions (see FIG. 1C).

Figure 1D:
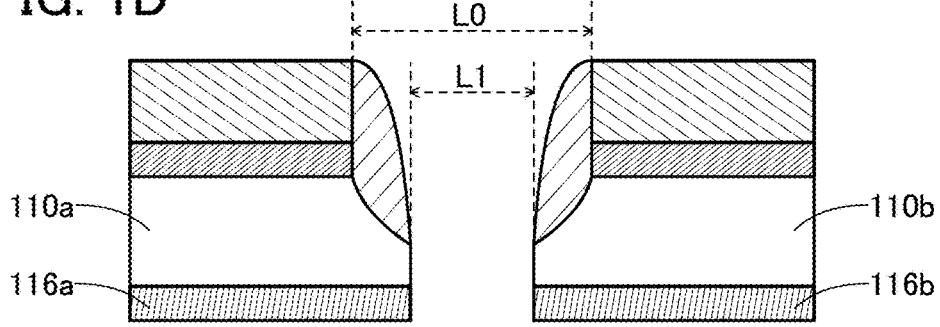

Next, the layer 110 and the layer 116 are etched using the organic substance 124, the resists 122, and the BARCs 120 as masks to form layers 110a and 110b and layers 116a and 116b (see FIG. 1D). The etching of the layer 110 and the layer 116 can be performed by dry etching and/or wet etching. At this time, the organic substance 124 may be removed. Note that the layer 110a and the layer 110b may be connected to each other in the depth direction. Furthermore, the layer 116a and the layer 116b may be connected to each other in the depth direction.

The distance between the layers 116a and 116b is denoted by L1. L1 is smaller than L0 by the thickness of the organic substance 124. That is, a shape smaller than the minimum feature size determined by a light-exposure apparatus or a resist can be obtained.

Figure 1E:
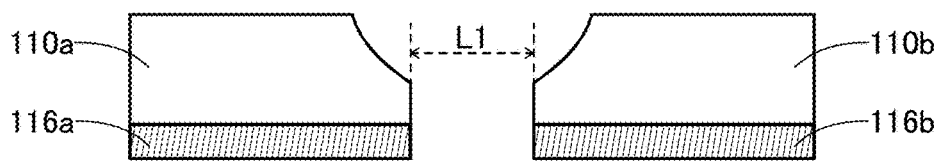

Next, the organic substance 124, the resists 122, and the BARCs 120 are removed, whereby a hole smaller than the minimum feature size can be formed (see FIG. 1E). The removal of the organic substance 124, the resists 122, and the BARCs 120 can be performed by dry etching such as plasma ashing and/or wet etching.

At this time, the layer 110a includes a first region, a second region, and a third region. The second region is located between the first region and the third region. The first region is a flat region. The second region and the third region each have a slope. The slope of the second region is more gentle than that of the third region. In the second region, there may be variation in the degree of the slope between the vicinity of the first region and the vicinity of the third region. For example, the vicinity of the first region may have a steep slope, and the vicinity of the third region may have a gentle slope. Such a shape of the layer 110a can increase step coverage with a layer to be formed over the layer 110a; therefore, a defect in shape is less likely to occur. The same applies to the layer 110b. Note that the slope refers to a change in the thickness, and the slope angle may be a right angle.

<Processing Method 2>

It is possible to obtain a shape different from that in FIG. 1E by changing the conditions for the plasma treatment, as shown in FIGS. 2A to 2E.

Figure 2A:
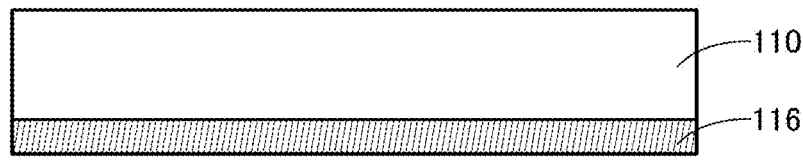
FIGS. 2A to 2E are cross-sectional views illustrating a method for manufacturing a semiconductor device of one embodiment of the present invention.
Figure 2B:
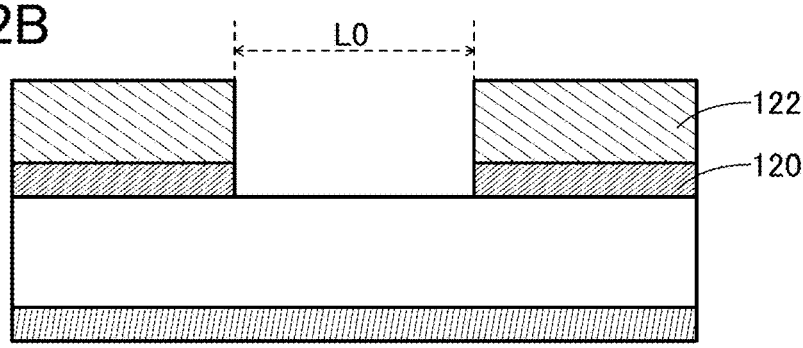
Figure 2C:
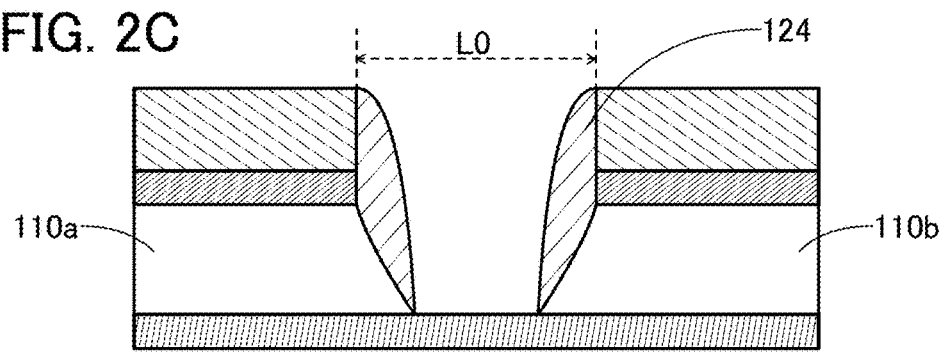

Since FIGS. 2A and 2B are the same as FIGS. 1A and 1B, respectively, the description thereof is omitted.

Next, plasma treatment is performed. The plasma treatment causes deposition and etching of an organic substance. Furthermore, the exposed part of the layer 110 is also etched. Here, the layer 110 is etched until the layer 116 is exposed while the organic substance 124 is deposited on the side surfaces of the resists 122 and the BARCs 120, whereby the layer 110a and the layer 110b are formed (see FIG. 2C). Note that the layer 110a and the layer 110b may be connected to each other in the depth direction.

Figure 2D:
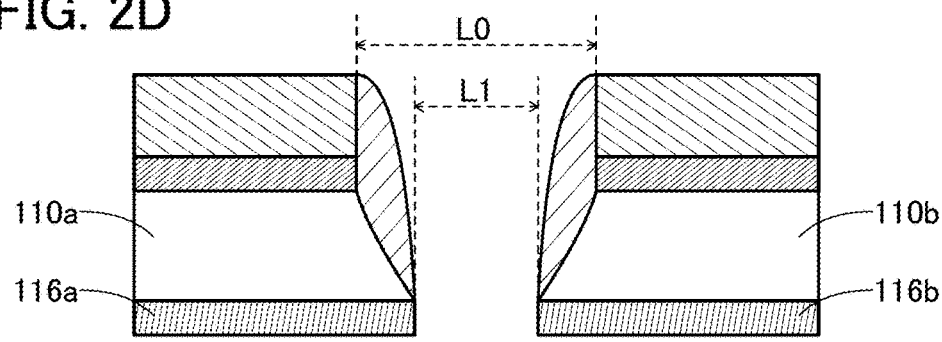

Next, the layer 116 is etched using the organic substance 124, the resists 122, and the BARCs 120 as masks to form the layers 116a and 116b (see FIG. 2D). The etching of the layer 116 can be performed by dry etching and/or wet etching. At this time, the organic substance 124 may be removed. Note that the layer 116a and the layer 116b may be connected to each other in the depth direction.

The distance between the layers 116a and 116b is denoted by L1. L1 is smaller than L0 by the thickness of the organic substance 124. That is, a shape smaller than the minimum feature size determined by a light-exposure apparatus or a resist can be obtained.

Figure 2E:
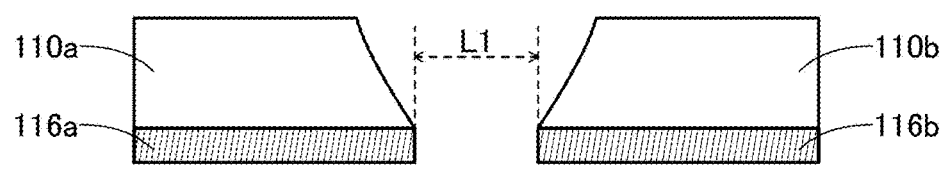

Next, the organic substance 124, the resists 122, and the BARCs 120 are removed, whereby a hole smaller than the minimum feature size can be formed (see FIG. 2E). The removal of the organic substance 124, the resists 122, and the BARCs 120 can be performed by dry etching such as plasma ashing and/or wet etching.

At this time, the layer 110a includes a first region and a second region. The first region is a flat region. The second region has a slope. In the second region, there may be variation in the degree of the slope. For example, the second region may have a shape in which the vicinity of the first region has a steep slope, and the slope gradually becomes gentle as the distance from the first region is increased. Such a shape of the layer 110a can increase step coverage with a layer to be formed over the layer 110a; therefore, a defect in shape is less likely to occur. The same applies to the layer 110b.

<Processing Method 3>

It is possible to obtain a shape different from those in FIG. 1E and FIG. 2E by changing the conditions for the plasma treatment, as shown in FIGS. 3A to 3D.

Figure 3A:
FIGS. 3A to 3D are cross-sectional views illustrating a method for manufacturing a semiconductor device of one embodiment of the present invention.
Figure 3B:
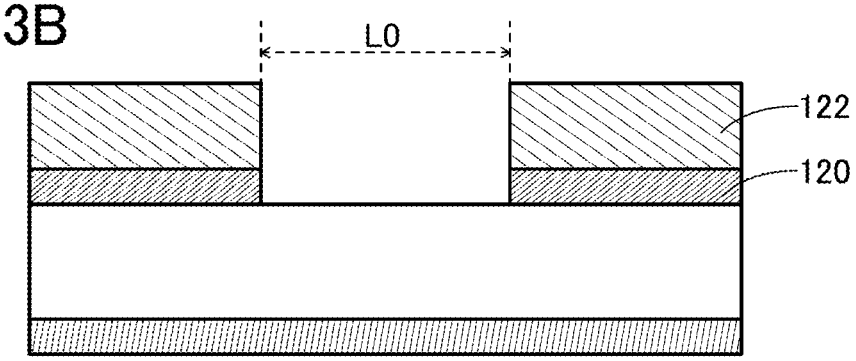
Figure 3C:
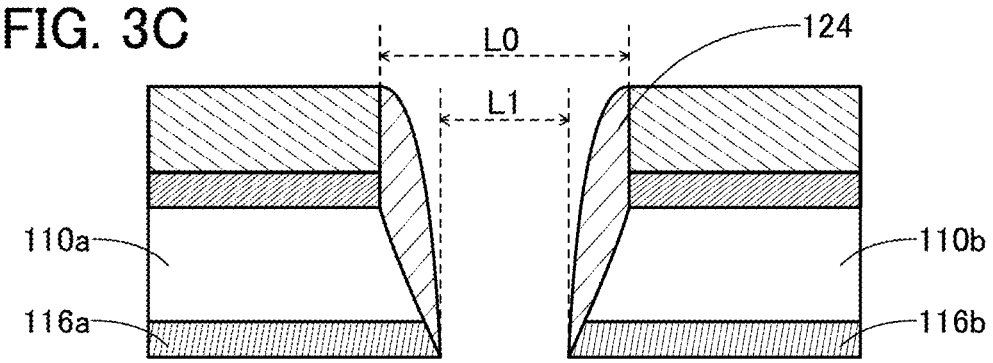

Since FIGS. 3A and 3B are the same as FIGS. 1A and 1B, respectively, the description thereof is omitted.

Next, plasma treatment is performed. The plasma treatment causes deposition and etching of an organic substance. Furthermore, the exposed part of the layer 110 is also etched. Here, the layer 110 and the layer 116 are etched while the organic substance 124 is deposited on the side surfaces of the resists 122 and the BARCs 120, whereby the layers 110a and 110b and the layers 116a and 116b are formed (see FIG. 3C). Note that the layer 110a and the layer 110b may be connected to each other in the depth direction. Furthermore, the layer 116a and the layer 116b may be connected to each other in the depth direction.

The distance between the layers 116a and 116b is denoted by L1. L1 is smaller than L0 by the thickness of the organic substance 124. That is, a shape smaller than the minimum feature size determined by a light-exposure apparatus or a resist can be obtained.

Figure 3D:
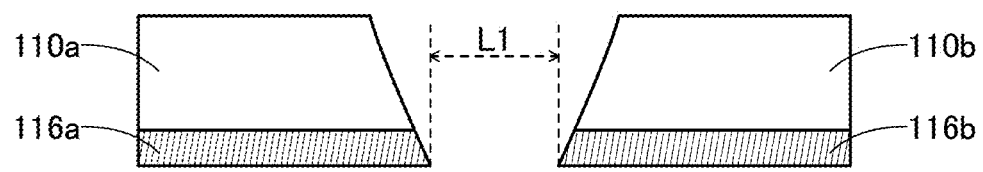

Next, the organic substance 124, the resists 122, and the BARCs 120 are removed, whereby a hole smaller than the minimum feature size can be formed (see FIG. 3D). The removal of the organic substance 124, the resists 122, and the BARCs 120 can be performed by dry etching such as plasma ashing and/or wet etching.

At this time, the layer 110a includes a first region and a second region. The first region is a flat region. The second region has a slope. In the second region, there may be variation in the degree of the slope. For example, the second region may have a shape in which the vicinity of the first region has a steep slope, and the slope gradually becomes gentle as the distance from the first region is increased. Furthermore, the layer 116a includes a third region and a fourth region. The third region is a flat region. The fourth region has a slope. In the fourth region, there may be variation in the degree of the slope. For example, the fourth region may have a shape in which the vicinity of the third region has a steep slope, and the slope gradually becomes gentle as the distance from the third region is increased. Such shapes of the layer 110a and the layer 116a can increase step coverage with layers to be formed over the layer 110a and the layer 116a; therefore, a defect in shape is less likely to occur. The same applies to the layer 110b and the layer 116b.

<Processing Method 4>

It is also possible to obtain a shape different from those in FIG. 1E, FIG. 2E, and FIG. 3D by adding an etching step, as shown in FIGS. 4A to 4E.

Figure 4A:
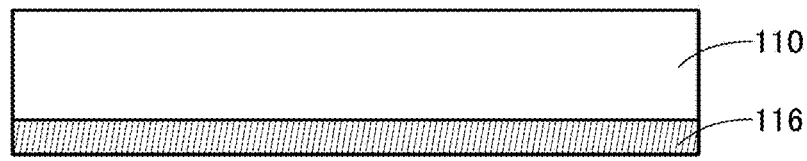
FIGS. 4A to 4E are cross-sectional views illustrating a method for manufacturing a semiconductor device of one embodiment of the present invention.
Figure 4B:
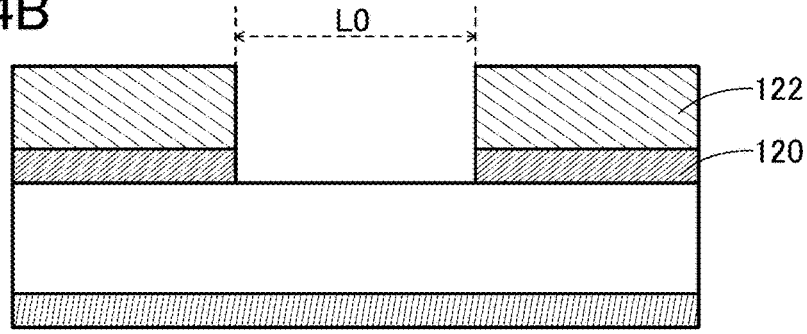

Since FIGS. 4A and 4B are the same as FIGS. 1A and 1B, respectively, the description thereof is omitted.

Figure 4C:
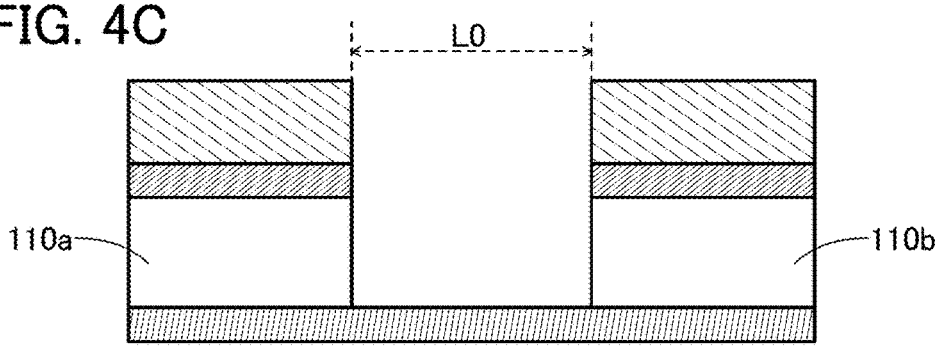

Next, the layer 110 is etched using the resists 122 and the BARCs 120 as masks so that the layer 116 is exposed, whereby the layer 110a and the layer 110b are formed (see FIG. 4C). The etching of the layer 110 can be performed by dry etching and/or wet etching. Note that the layer 110a and the layer 110b may be connected to each other in the depth direction.

Next, plasma treatment is performed. Next, plasma treatment is performed. The plasma treatment causes deposition and etching of an organic substance. Furthermore, the exposed part of the layer 116 is also etched. Note that it is also possible not to etch the exposed part of the layer 116, according to the conditions for the plasma treatment.

Meanwhile, the etching rate of the organic substance is lower than the deposition rate thereof on the side surfaces of the resists 122, on the side surfaces of the BARCs 120, and on the side surfaces of the layers 110a and 110b. Accordingly, the organic substance 124 is deposited on the regions.

Figure 4D:
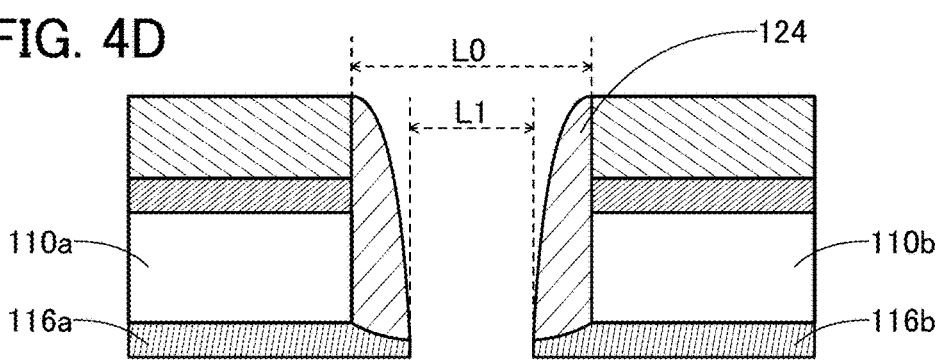

Next, the layer 116 is etched using the organic substance 124, the resists 122, and the BARCs 120 as masks to form the layers 116a and 116b (see FIG. 4D). The etching of the layer 116 can be performed by dry etching and/or wet etching. At this time, the organic substance 124 may be removed. Note that the layer 116a and the layer 116b may be connected to each other in the depth direction.

The distance between the layers 116a and 116b is denoted by L1. L1 is smaller than L0 by the thickness of the organic substance 124. That is, a shape smaller than the minimum feature size determined by a light-exposure apparatus or a resist can be obtained.

Figure 4E:
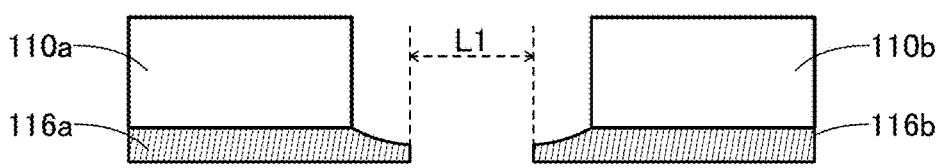

Next, the organic substance 124, the resists 122, and the BARCs 120 are removed, whereby a hole smaller than the minimum feature size can be formed (see FIG. 4E). The removal of the organic substance 124, the resists 122, and the BARCs 120 can be performed by dry etching such as plasma ashing and/or wet etching.

At this time, the layer 116a includes a first region, a second region, and a third region. The second region is located between the first region and the third region. The first region is a flat region. The second region and the third region each have a slope. The slope of the second region is more gentle than that of the third region. In the second region, there may be variation in the degree of the slope between the vicinity of the first region and the vicinity of the third region. For example, the vicinity of the first region may have a steep slope, and the vicinity of the third region may have a gentle slope. Such a shape of the layer 116a can increase step coverage with a layer to be formed over the layer 116a; therefore, a defect in shape is less likely to occur. The same applies to the layer 116b.

<Processing Method 5>

It is also possible to obtain a shape different from those in FIG. 1E, FIG. 2E, FIG. 3D, and FIG. 4E by adding an etching step and changing the conditions for the plasma treatment, as illustrated in FIGS. 5A to 5E.

Figure 5A:
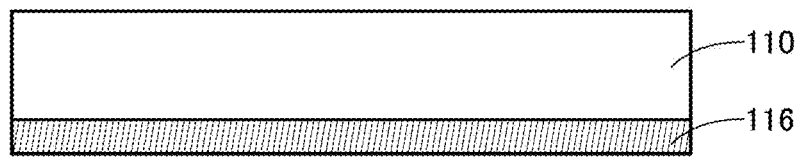
FIGS. 5A to 5E are cross-sectional views illustrating a method for manufacturing a semiconductor device of one embodiment of the present invention.
Figure 5B:
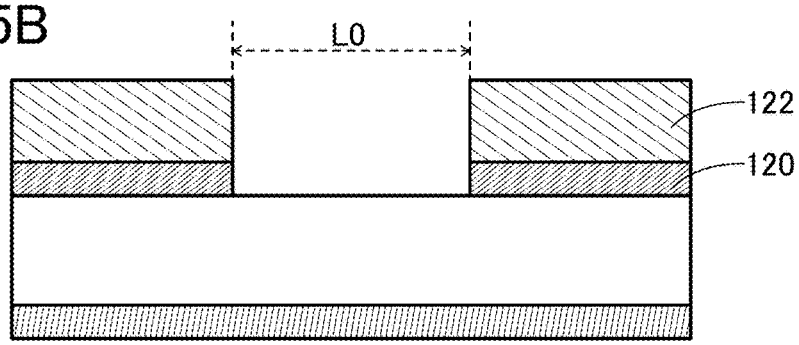
Figure 5C:
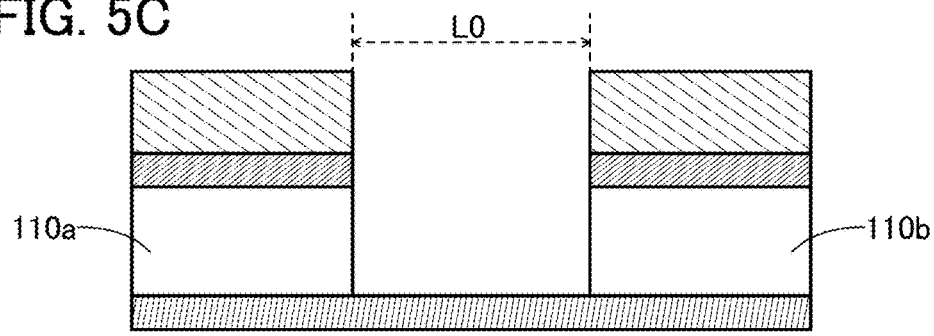
Figure 5D:
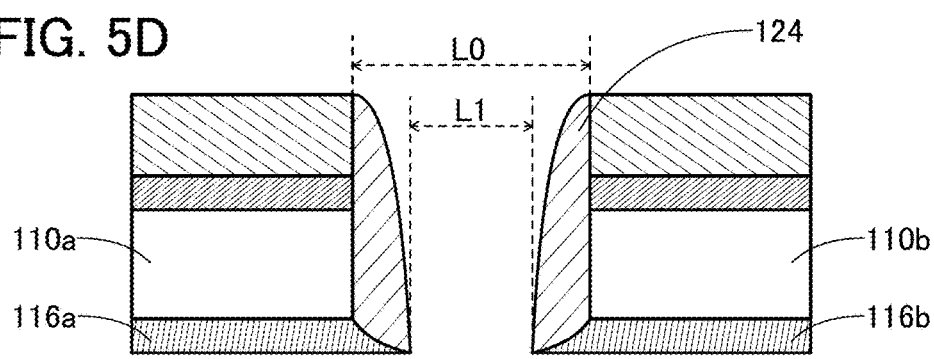

Since FIGS. 5A and 5B are the same as FIGS. 1A and 1B, respectively, the description thereof is omitted. Since FIG. 5C is the same as FIG. 4C, the description thereof is omitted.

Next, plasma treatment is performed. The plasma treatment causes deposition and etching of an organic substance. Furthermore, the exposed part of the layer 116 is also etched, whereby the layer 116a and the layer 116b are formed. Note that the layer 116a and the layer 116b may be connected to each other in the depth direction.

Meanwhile, the etching rate of the organic substance is lower than the deposition rate thereof on the side surfaces of the resists 122, on the side surfaces of the BARCs 120, and on the side surfaces of the layer 110a and 110b. Accordingly, the organic substance 124 is deposited on the regions (see FIG. 5D).

The distance between the layers 116a and 116b is denoted by L1. L1 is smaller than L0 by the thickness of the organic substance 124. That is, a shape smaller than the minimum feature size determined by a light-exposure apparatus or a resist can be obtained.

Figure 5E:

Next, the organic substance 124, the resists 122, and the BARCs 120 are removed, whereby a hole smaller than the minimum feature size can be formed (see FIG. 5E). The removal of the organic substance 124, the resists 122, and the BARCs 120 can be performed by dry etching such as plasma ashing and/or wet etching.

At this time, the layer 116a includes a first region and a second region. The first region is a flat region. The second region has a slope. In the second region, there may be variation in the degree of the slope. For example, the second region may have a shape in which the vicinity of the first region has a steep slope, and the slope gradually becomes gentle as the distance from the first region is increased. Such a shape of the layer 116a can increase step coverage with a layer to be formed over the layer 116a; therefore, a defect in shape is less likely to occur. The same applies to the layer 116b.

<Processing Method 6>

It is also possible to obtain a shape different from those in FIG. 1E, FIG. 2E, FIG. 3D, FIG. 4E, and FIG. 5E by not providing the layer 110, as illustrated in FIGS. 6A to 6E.

Figure 6A:
FIGS. 6A to 6E are cross-sectional views illustrating a method for manufacturing a semiconductor device of one embodiment of the present invention.

First, the layer 116 is prepared (see FIG. 6A).

Next, a BARC is formed. Then, a resist is formed. After that, the resist is processed to form the resists 122.

Figure 6B:
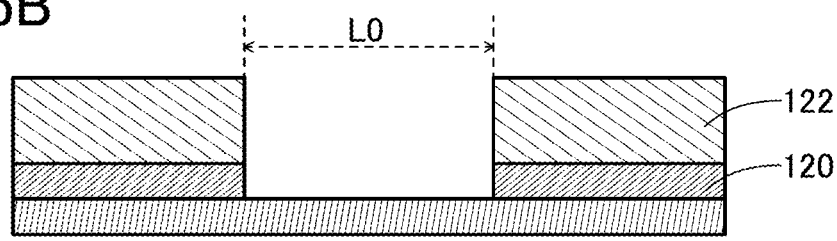
Figure 6C:
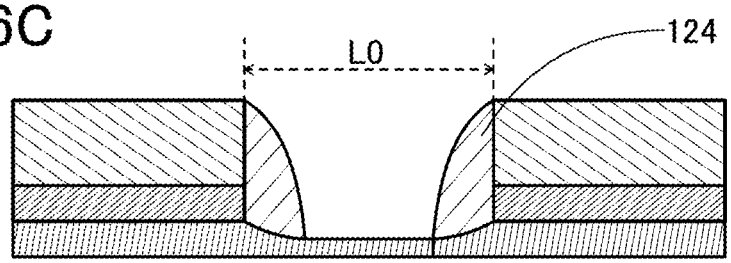

Next, the BARC is etched using the resists 122 as masks, whereby the BARCs 120 are formed (see FIG. 6B). Note that it is possible not to provide the BARCs 120 in some cases.

The distance between the resists 122 is denoted by L0.

Next, plasma treatment is performed. Next, plasma treatment is performed. The plasma treatment causes deposition and etching of an organic substance. Furthermore, the exposed part of the layer 110 is also etched. Note that it is also possible not to etch the exposed part of the layer 110, according to the conditions for the plasma treatment.

Meanwhile, the etching rate of the organic substance is lower than the deposition rate thereof on the side surfaces of the resists 122 and on the side surfaces of the BARCs 120. Accordingly, the organic substance 124 is deposited on the regions (see FIG. 6C).

Figure 6D:
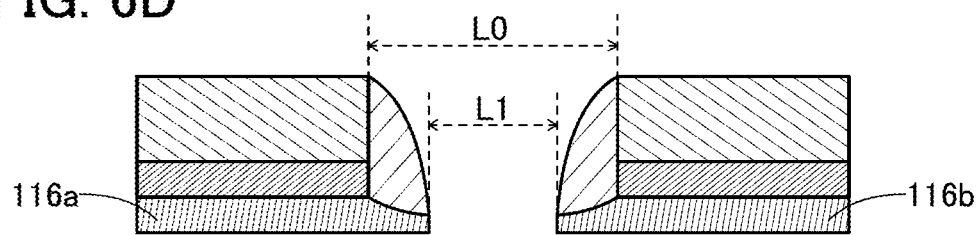

Next, the layer 116 is etched using the organic substance 124, the resists 122, and the BARCs 120 as masks to form the layers 116a and 116b (see FIG. 6D). The etching of the layer 116 can be performed by dry etching and/or wet etching. At this time, the organic substance 124 may be removed. Note that the layer 116a and the layer 116b may be connected to each other in the depth direction.

The distance between the layers 116a and 116b is denoted by L1. L1 is smaller than L0 by the thickness of the organic substance 124. That is, a shape smaller than the minimum feature size determined by a light-exposure apparatus or a resist can be obtained.

Figure 6E:
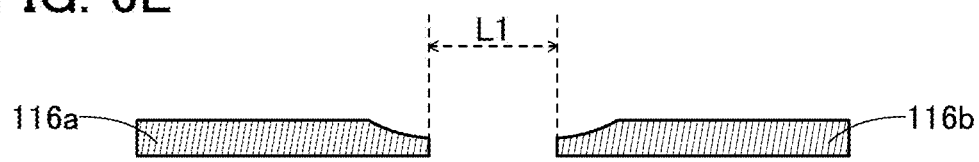

Next, the organic substance 124, the resists 122, and the BARCs 120 are removed, whereby a hole smaller than the minimum feature size can be formed (see FIG. 6E). The removal of the organic substance 124, the resists 122, and the BARCs 120 can be performed by dry etching such as plasma ashing and/or wet etching. A shape similar to that in FIG. 6E can also be obtained in such a manner that the layer 110a and the layer 110b are removed after the shape in FIG. 4E is obtained.

At this time, the layer 116a includes a first region, a second region, and a third region. The second region is located between the first region and the third region. The first region is a flat region. The second region and the third region each have a slope. The slope of the second region is more gentle than that of the third region. In the second region, there may be variation in the degree of the slope between the vicinity of the first region and the vicinity of the third region. For example, the vicinity of the first region may have a steep slope, and the vicinity of the third region may have a gentle slope. Such a shape of the layer 116a can increase step coverage with a layer to be formed over the layer 116a; therefore, a defect in shape is less likely to occur. The same applies to the layer 116b.

<Processing Method 7>

It is also possible to obtain a shape different from those in FIG. 1E, FIG. 2E, FIG. 3D, FIG. 4E, FIG. 5E, and FIG. 6E by changing the conditions for the plasma treatment and the like, as illustrated in FIGS. 7A to 7D.

Figure 7A:
FIGS. 7A to 7D are cross-sectional views illustrating a method for manufacturing a semiconductor device of one embodiment of the present invention.
Figure 7B:
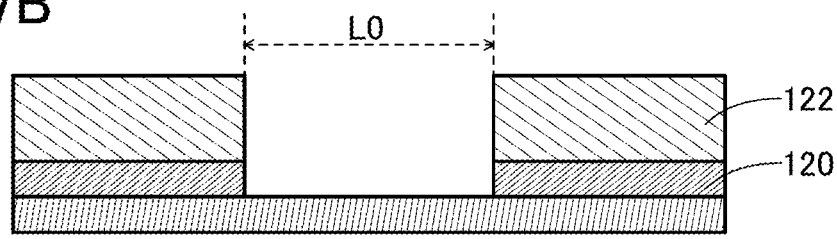
Figure 7C:
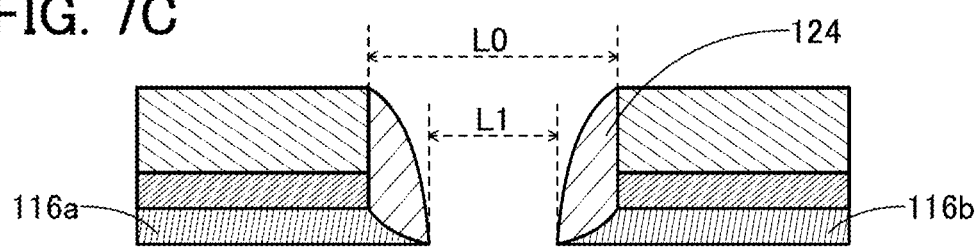

Since FIGS. 7A and 7B are the same as FIGS. 6A and 6B, respectively, the description thereof is omitted.

Next, plasma treatment is performed. The plasma treatment causes deposition and etching of an organic substance. Furthermore, the exposed part of the layer 116 is also etched, whereby the layer 116a and the layer 116b are formed. Note that the layer 116a and the layer 116b may be connected to each other in the depth direction.

Meanwhile, the etching rate of the organic substance is lower than the deposition rate thereof on the side surfaces of the resists 122 and on the side surfaces of the BARCs 120. Accordingly, the organic substance 124 is deposited on the regions (see FIG. 7C).

The distance between the layers 116a and 116b is denoted by L1. L1 is smaller than L0 by the thickness of the organic substance 124. That is, a shape smaller than the minimum feature size determined by a light-exposure apparatus or a resist can be obtained.

Figure 7D:
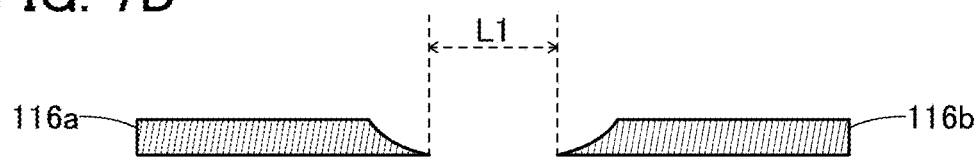

Next, the organic substance 124, the resists 122, and the BARCs 120 are removed, whereby a hole smaller than the minimum feature size can be formed (see FIG. 7D). The removal of the organic substance 124, the resists 122, and the BARCs 120 can be performed by dry etching such as plasma ashing and/or wet etching. A shape similar to that in FIG. 7D can also be obtained in such a manner that the layer 110a and the layer 110b are removed after the shape in FIG. 5E is obtained.

At this time, the layer 116a includes a first region and a second region. The first region is a flat region. The second region has a slope. In the second region, there may be variation in the degree of the slope. For example, the second region may have a shape in which the vicinity of the first region has a steep slope, and the slope gradually becomes gentle as the distance from the first region is increased. Such a shape of the layer 116a can increase step coverage with a layer to be formed over the layer 116a; therefore, a defect in shape is less likely to occur. The same applies to the layer 116b.

As described above, any of the processing methods of one embodiment of the present invention makes it possible to process a layer in a size smaller than the minimum feature size. Furthermore, any of the processing methods enables formation of a layer that is less likely to have a defect in shape.

<Transistor 1>

A transistor of one embodiment of the present invention is described below.

FIG. 8A, FIG. 9A, FIG. 10A, and FIG. 11A are top views illustrating a method for manufacturing a transistor. FIG. 8B, FIG. 9B, FIG. 10B, and FIG. 11B are each a cross-sectional view taken along dashed dotted lines A1-A2 and A3-A4 shown in the corresponding top view.

First, a substrate 400 is prepared.

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a single material semiconductor substrate of silicon, germanium, or the like or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The thickness of the substrate 400 is, for example, greater than or equal to 5 μm and less than or equal to 700 μm, preferably greater than or equal to 10 μm and less than or equal to 500 μm, or further preferably greater than or equal to 15 μm and less than or equal to 300 μm. When the substrate 400 has a small thickness, the weight of the semiconductor device can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a durable semiconductor device can be provided.

For the substrate 400 which is a flexible substrate, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

Next, a conductor is formed. The conductor may be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can include a metal CVD (MCVD) method and a metal organic CVD (MOCVD) method depending on a source gas.

In the case of a PECVD method, a high quality film can be obtained at relatively low temperature. Furthermore, a TCVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. Such plasma damage is not caused in the case of using a TCVD method, and thus the yield of a semiconductor device can be increased. In addition, since plasma damage does not occur in the deposition by a TCVD method, a film with few defects can be obtained.

An ALD method also causes less plasma damage to an object. An ALD method does not cause plasma damage during deposition, so that a film with few defects can be obtained.

Unlike in a deposition method in which particles ejected from a target or the like are deposited, in a CVD method and an ALD method, a film is formed by reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening portion with a high aspect ratio, for example. On the other hand, an ALD method has a relatively low deposition rate; thus, it is sometimes preferable to combine an ALD method with another deposition method with a high deposition rate such as a CVD method.

When a CVD method or an ALD method is used, composition of a film to be formed can be controlled with a flow rate ratio of the source gases. For example, by the CVD method or the ALD method, a film with a desired composition can be formed by adjusting the flow ratio of a source gas. Moreover, with a CVD method or an ALD method, by changing the flow rate ratio of the source gases while forming the film, a film whose composition is continuously changed can be formed. In the case where the film is formed while changing the flow rate ratio of the source gases, as compared to the case where the film is formed using a plurality of deposition chambers, time taken for the deposition can be reduced because time taken for transfer and pressure adjustment is omitted. Thus, semiconductor devices can be manufactured with improved productivity.

Next, a resist or the like is formed over the conductor and processing is performed using the resist, whereby a conductor 413 is formed. Note that the case where the resist is simply formed also includes the case where a BARC is formed below the resist.

The resist is removed after the object is processed by etching or the like. For the removal of the resist, plasma treatment and/or wet etching are/is used. Note that as the plasma treatment, plasma ashing is preferable. In the case where the removal of the resist or the like is not enough, the remaining resist or the like may be removed using ozone water and/or hydrofluoric acid at a concentration higher than or equal to 0.001 volume % and lower than or equal to 1 volume %, and the like.

Any of the processing methods illustrated in FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D may be used for processing the conductor to form the conductor 413.

The conductor to be the conductor 413 may be formed to have a single-layer structure or a stacked-layer structure using a conductor containing, for example, one or more of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Then, an insulator 402 is formed. The insulator 402 can be formed by a sputtering method, a CVD method, an MBE method, a PLD method, an ALD method, or the like.

The insulator 402 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 402 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator 402 may have a function of preventing diffusion of impurities from the substrate 400.

Next, a semiconductor is formed. The semiconductor can be formed by a sputtering method, a CVD method, an MBE method, a PLD method, an ALD method, or the like.

Next, heat treatment is preferably performed. By the heat treatment, the hydrogen concentration in the semiconductor can be reduced in some cases. Furthermore, oxygen vacancies in the semiconductor can be reduced in some cases.

Figure 8A:
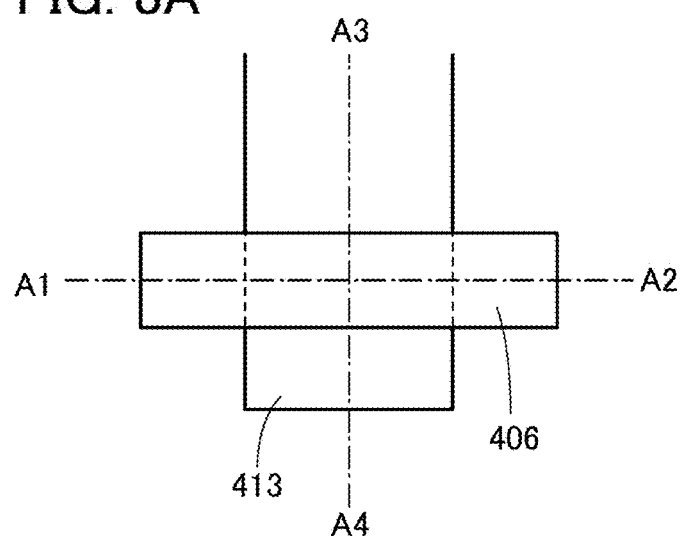
FIGS. 8A and 8B are a top view and a cross-sectional view illustrating a method for manufacturing a transistor of one embodiment of the present invention.
Figure 8B:
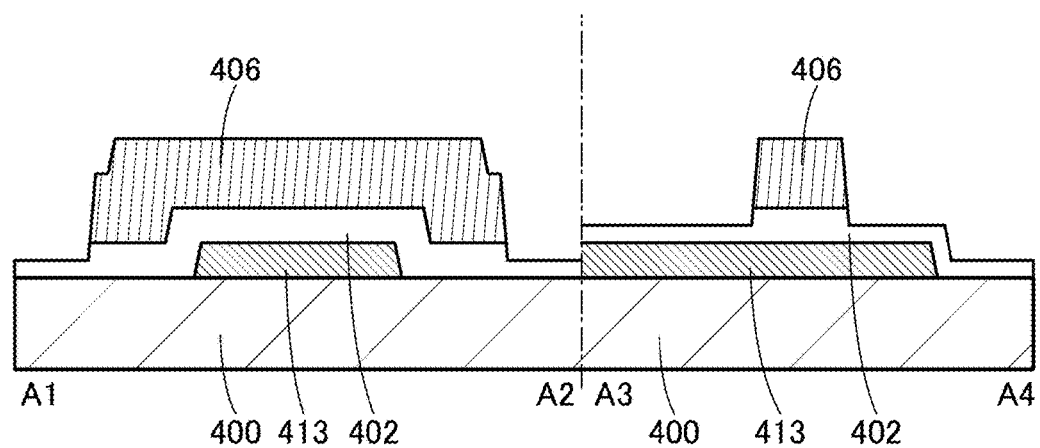

Then, a resist or the like is formed over the semiconductor and processing is performed using the resist, whereby a semiconductor 406 is formed (see FIGS. 8A and 8B). At this time, part of the insulator 402 over which the semiconductor 406 is not provided may be etched. In this manner, the insulator 402 has a projection. When the insulator 402 has a projection, an s-channel structure, which is described later, can be easily obtained.

Any of the processing methods illustrated in FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D may be used for processing the semiconductor to form the semiconductor 406.

Next, a conductor 416 is formed. The conductor 416 can be formed by a sputtering method, a CVD method, an MBE method, a PLD method, an ALD method, or the like.

The conductor 416 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 9A:
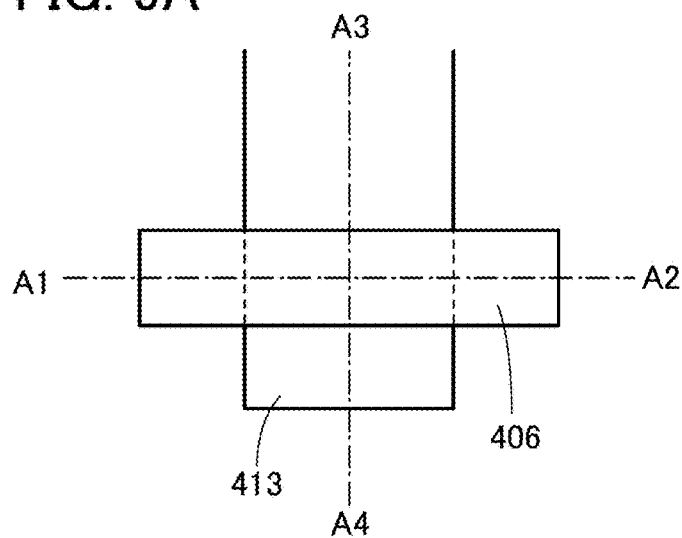
FIGS. 9A and 9B are a top view and a cross-sectional view illustrating a method for manufacturing a transistor of one embodiment of the present invention.
Figure 9B:
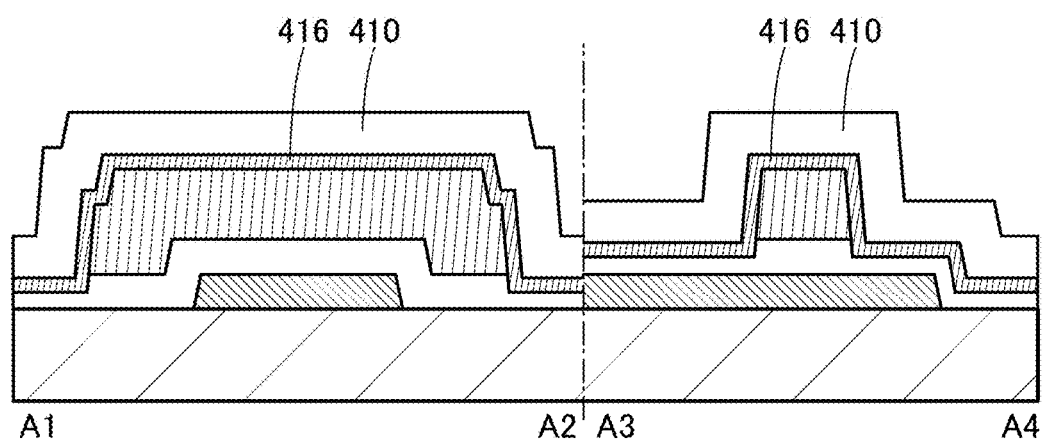

Next, an insulator 410 is formed (see FIGS. 9A and 9B). The insulator 410 can be formed by a sputtering method, a CVD method, an MBE method, a PLD method, an ALD method, or the like.

The insulator 410 may have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator 410 may be formed using aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

Figure 10A:
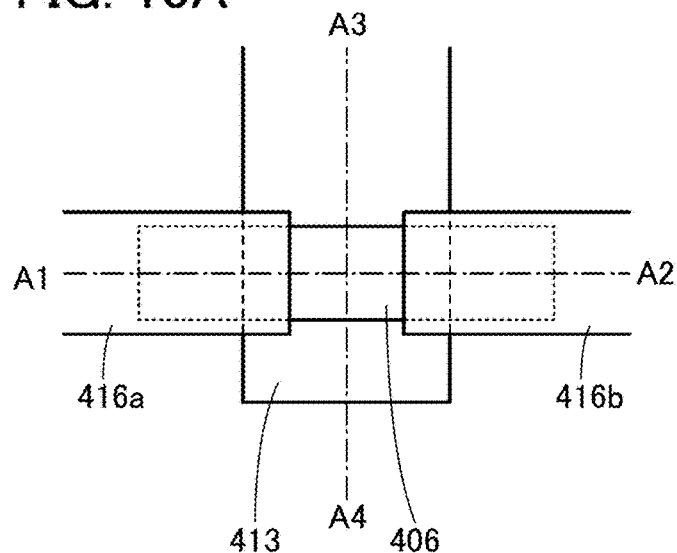
FIGS. 10A and 10B are a top view and a cross-sectional view illustrating a method for manufacturing a transistor of one embodiment of the present invention.
Figure 10B:
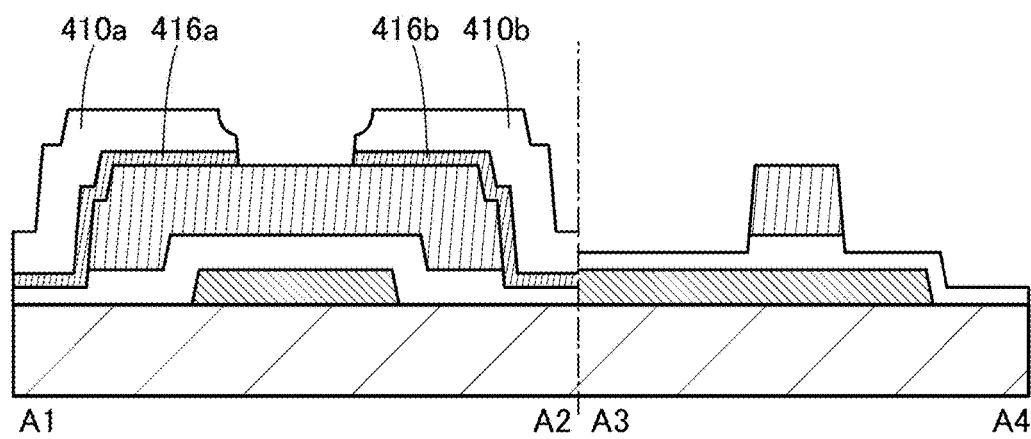

Next, a resist or the like is formed over the insulator 410 and processing is performed using the resist, whereby insulators 410a and 410b and conductors 416a and 416b are formed (see FIGS. 10A and 10B).

At this time, any of the processing methods illustrated in FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D may be used. For example, in each of FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D, the layer 116 and the layer 110 may be replaced with the conductor 416 and the insulator 410, respectively. Here, the case where the insulator 410 and the conductor 416 are processed using a method similar to the processing method in FIGS. 1A to 1E is illustrated.

For example, when the conductor 413, the insulator 402, the conductor 416a, and the conductor 416b serve as a gate electrode, a gate insulator, a source electrode, and a drain electrode, respectively, a bottom-gate transistor may be obtained by completing the steps up to FIGS. 10A and 10B.

Next, an insulator is formed. The insulator can be formed by a sputtering method, a CVD method, an MBE method, a PLD method, an ALD method, or the like.

Next, a conductor is formed. The conductor can be formed by a sputtering method, a CVD method, an MBE method, a PLD method, an ALD method, or the like.

Then, a resist or the like is formed over the conductor and processing is performed using the resist, whereby a conductor 404 is formed. In addition, the insulator is processed using the resist or the conductor 404, whereby an insulator 412 is formed (see FIGS. 11A and 11B). Here, the processing is performed so that the insulator 412 and the conductor 404 have the same shape when seen from the above; however, the shapes are not limited thereto. For example, the insulator 412 and the conductor 404 may be processed using different resists. For example, after the insulator 412 is formed, the conductor to be the conductor 404 may be formed; or after the conductor 404 is formed, a resist or the like may be formed over the insulator to be the insulator 412.

At this time, any of the processing methods illustrated in FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D may be used. For example, in each of FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D, the layer 116 and the layer 110 may be replaced with the insulator to be the insulator 412 and the conductor to be the conductor 404, respectively.

The insulator to be the insulator 412 may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator to be the insulator 412 may be formed using, for example, aluminum oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The conductor to be the conductor 404 may be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Next, an insulator may be formed. The insulator can be formed by a sputtering method, a CVD method, an MBE method, a PLD method, an ALD method, or the like.

The insulator may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator may be formed to have a single-layer structure or a stacked-layer structure including an insulator containing, for example, aluminum oxide, silicon nitride oxide, silicon nitride, gallium oxide, yttrium oxide, zirconium oxide, lanthanum oxide, neodymium oxide, hafnium oxide, or tantalum oxide.

The insulator preferably has a function of a barrier layer. The insulator has, for example, a function of blocking oxygen and/or hydrogen. For example, the insulator preferably has a higher capability of blocking oxygen and/or hydrogen than any of the insulator 402 and the insulator 412.

Through the above process, the transistor of one embodiment of the present invention can be manufactured.

Figure 11A:
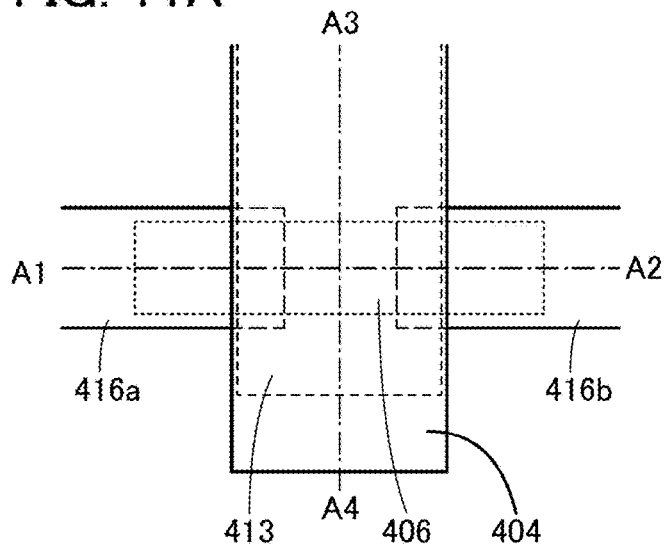
FIGS. 11A and 11B are a top view and a cross-sectional view illustrating a method for manufacturing a transistor of one embodiment of the present invention.
Figure 11B:
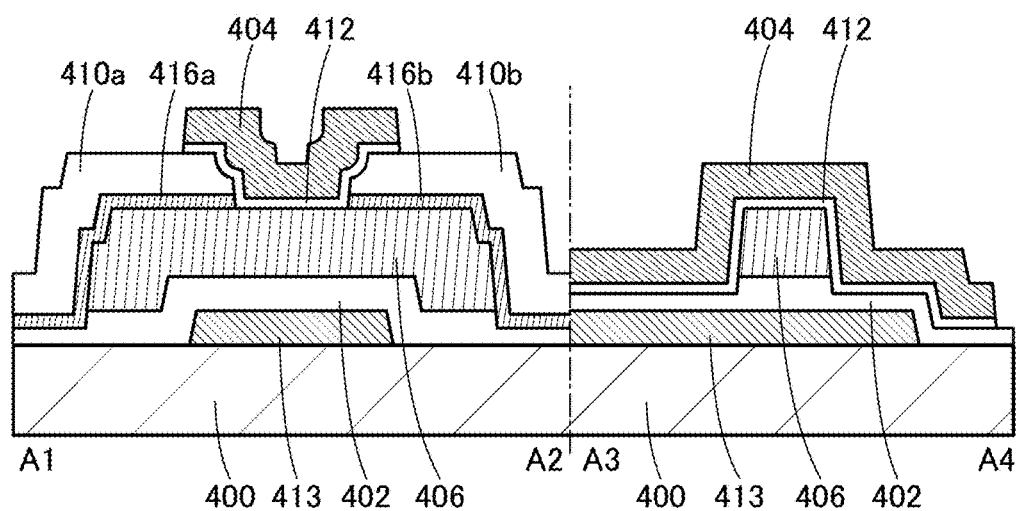

In the transistor illustrated in FIG. 11B, the insulator 410a is provided between the conductor 416a and the conductor 404, and the insulator 410b is provided between the conductor 416b and the conductor 404. Thus, parasitic capacitance due to the conductor 416a, the conductor 416b, or the like is small. Therefore, a semiconductor device using the transistor illustrated in FIG. 11B has high frequency characteristics.

As illustrated in FIG. 11B, the side surface of the semiconductor 406 is in contact with the conductors 416a and 416b. The semiconductor 406 can be electrically surrounded by an electric field of the conductor 404 (a structure in which a semiconductor is electrically surrounded by an electric field of a conductor is referred to as a surrounded channel (s-channel) structure). Therefore, a channel is formed in the entire semiconductor 406 (the top, bottom, and side surfaces). In the s-channel structure, a large amount of current can flow between a source and a drain of the transistor, so that a high on-state current can be achieved.

In the case where the transistor has the s-channel structure, a channel is formed also in the side surface of the semiconductor 406. Therefore, as the semiconductor 406 has a larger thickness, the channel region becomes larger. In other words, the thicker the semiconductor 406 is, the larger the on-state current of the transistor is. In addition, when the semiconductor 406 is thicker, the proportion of the region with a high carrier controllability increases, leading to a smaller subthreshold swing value. For example, the semiconductor 406 has a region with a thickness greater than or equal to 10 nm, preferably greater than or equal to 20 nm, further preferably greater than or equal to 40 nm, still further preferably greater than or equal to 60 nm, yet further preferably greater than or equal to 100 nm. In addition, to prevent a decrease in the productivity of the semiconductor device, the semiconductor 406 has a region with a thickness, for example, less than or equal to 300 nm, preferably less than or equal to 200 nm, further preferably less than or equal to 150 nm. In some cases, when the channel formation region is reduced in size, electrical characteristics of the transistor with a smaller thickness of the semiconductor 406 may be improved. Therefore, the semiconductor 406 may have a thickness less than 10 nm.

The s-channel structure is suitable for a miniaturized transistor because a high on-state current can be achieved. A semiconductor device including the miniaturized transistor can have a high integration degree and high density. For example, the transistor includes a region having a channel length of preferably less than or equal to 40 nm, further preferably less than or equal to 30 nm, still further preferably less than or equal to 20 nm and a region having a channel width of preferably less than or equal to 40 nm, further preferably less than or equal to 30 nm, still further preferably less than or equal to 20 nm.

Figure 12A:
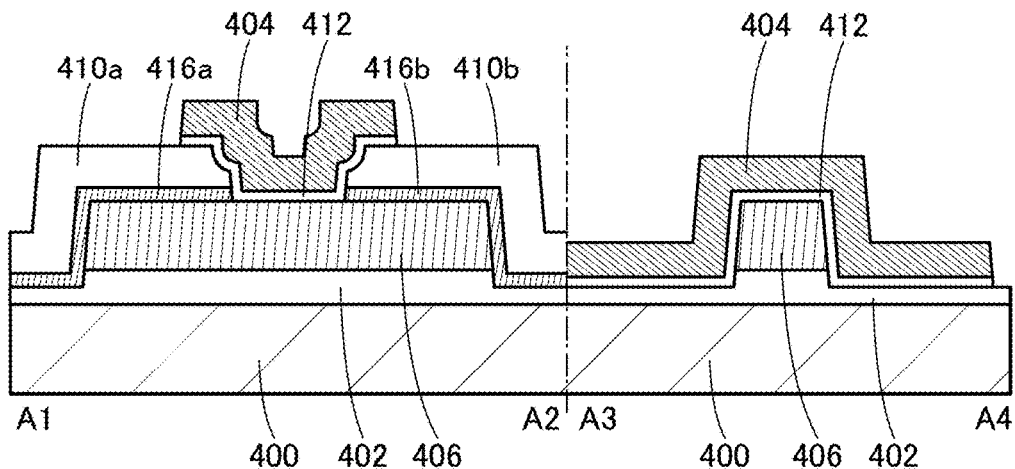
FIGS. 12A to 12C are cross-sectional views illustrating a method for manufacturing a transistor of one embodiment of the present invention.
Figure 12B:
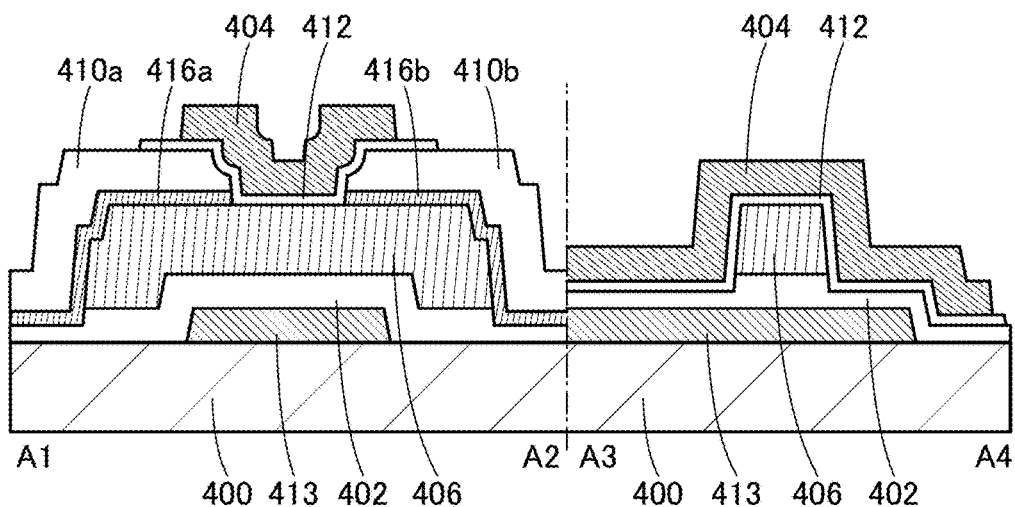
Figure 12C:
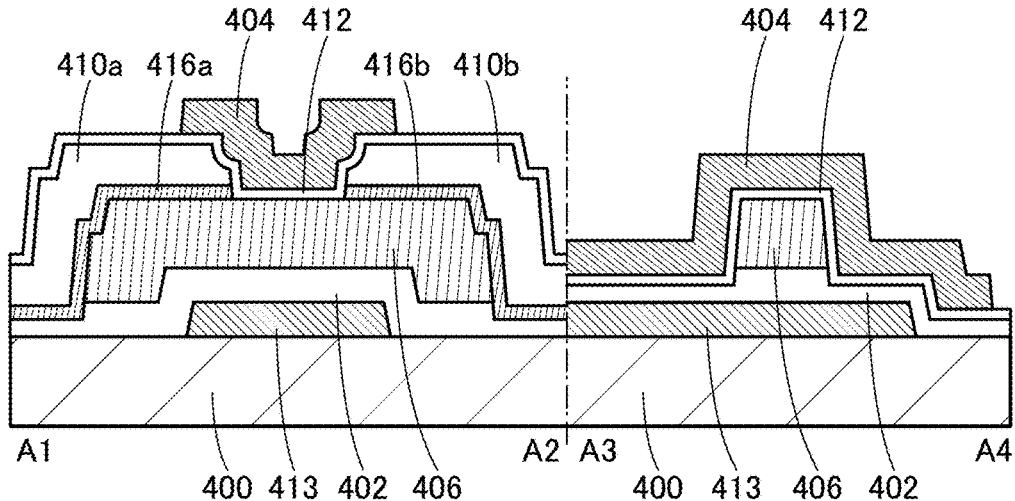

Note that the conductor 413 is not necessarily formed (see FIG. 12A). A shape in which the insulator 412 protrudes from the conductor 404 may be employed (see FIG. 12B). Furthermore, the insulator to be the insulator 412 is not necessarily processed (see FIG. 12C).

Figure 51A:
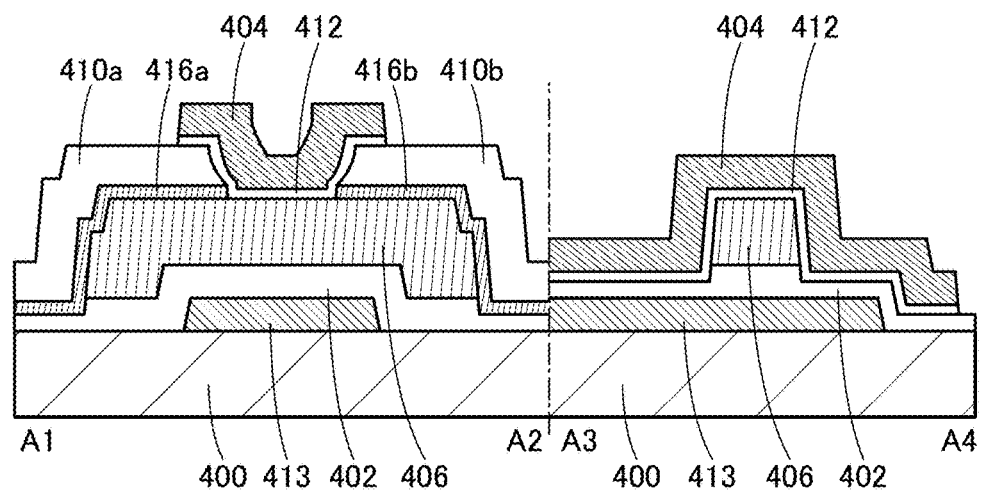
FIGS. 51A to 51C are cross-sectional views each illustrating a transistor of one embodiment of the present invention.
Figure 51B:
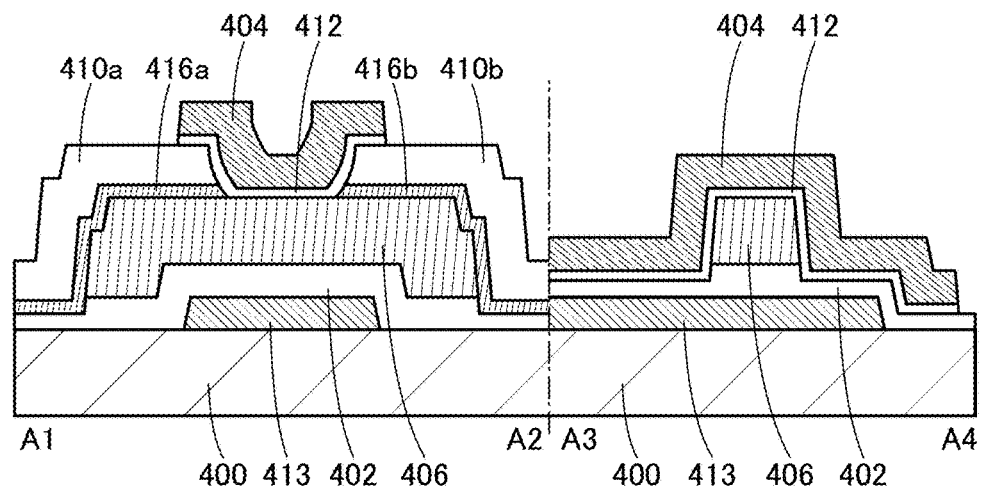
Figure 51C:
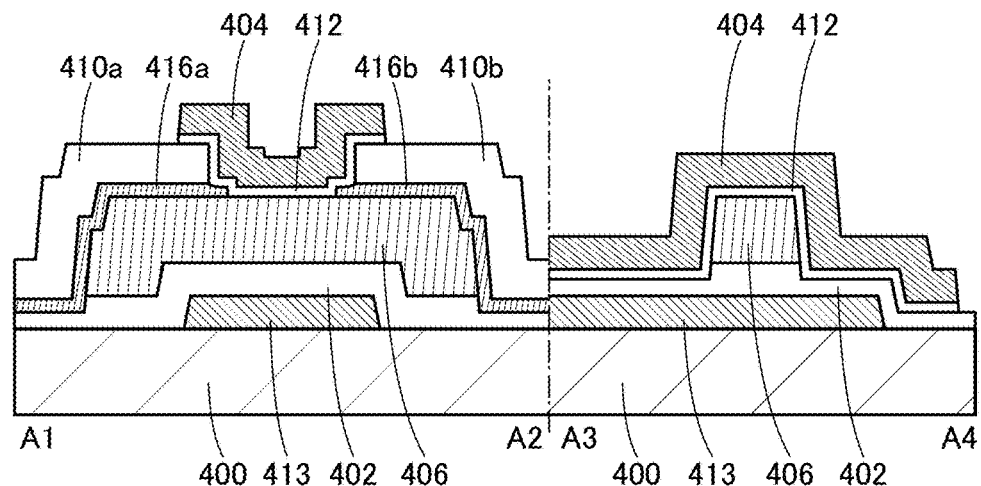
Figure 52A:
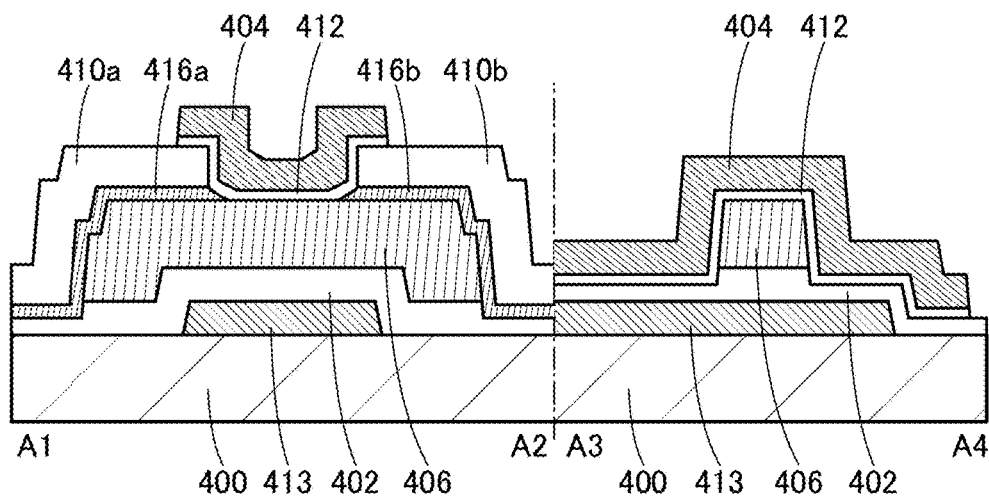
FIGS. 52A to 52C are cross-sectional views each illustrating a transistor of one embodiment of the present invention.
Figure 52B:
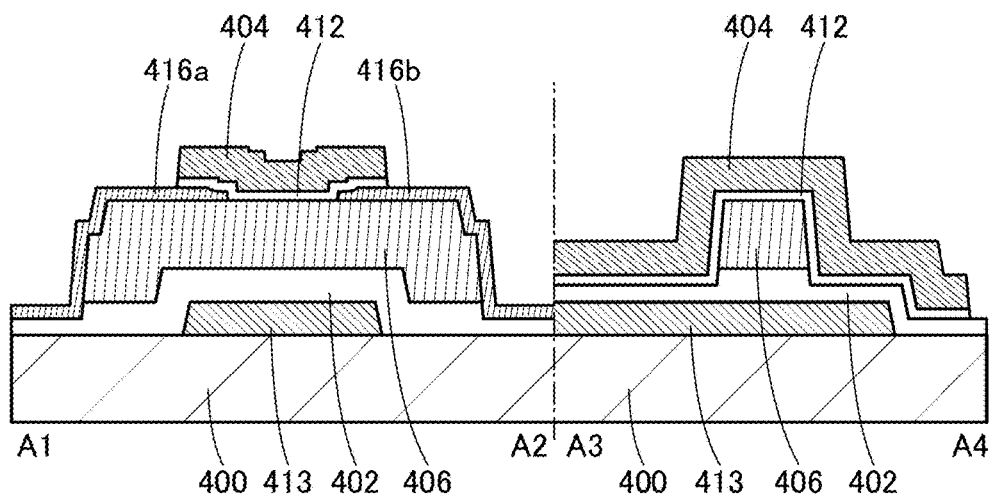
Figure 52C:
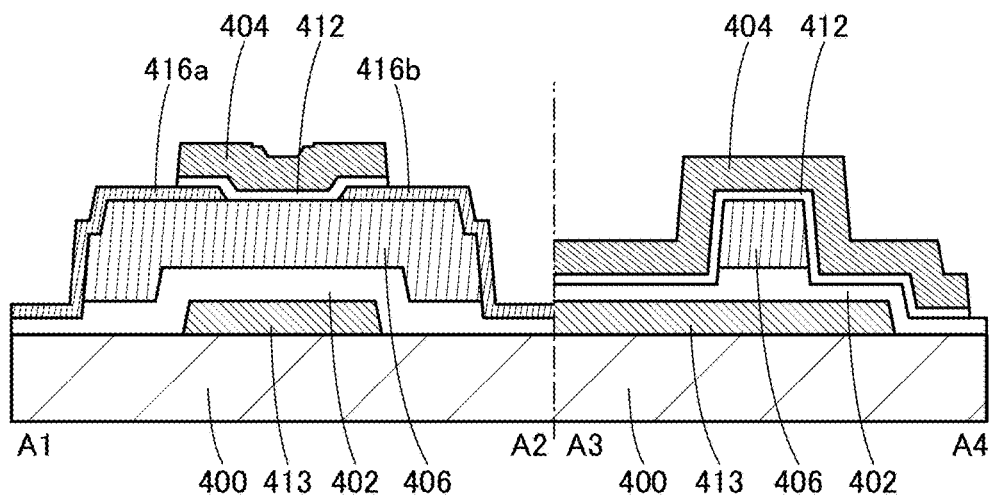
Figure 53A:
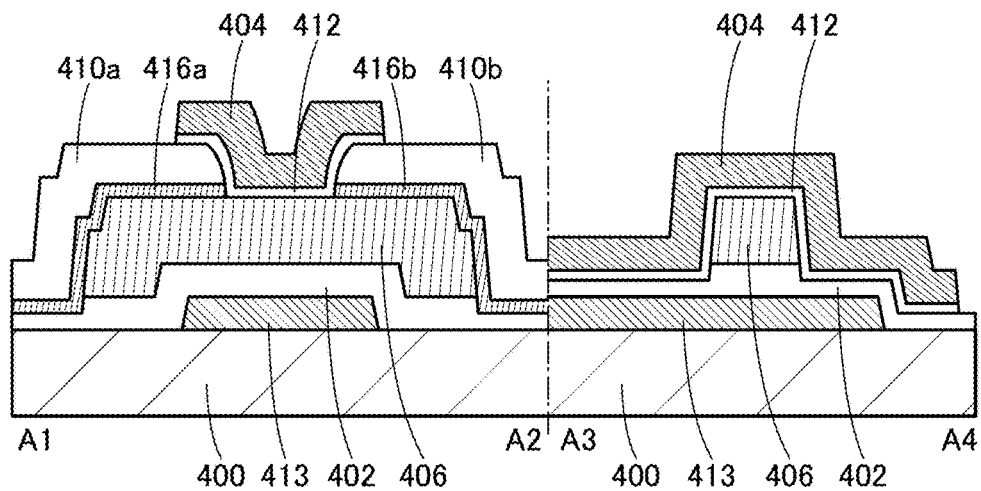
FIGS. 53A to 53C are cross-sectional views each illustrating a transistor of one embodiment of the present invention.
Figure 53B:
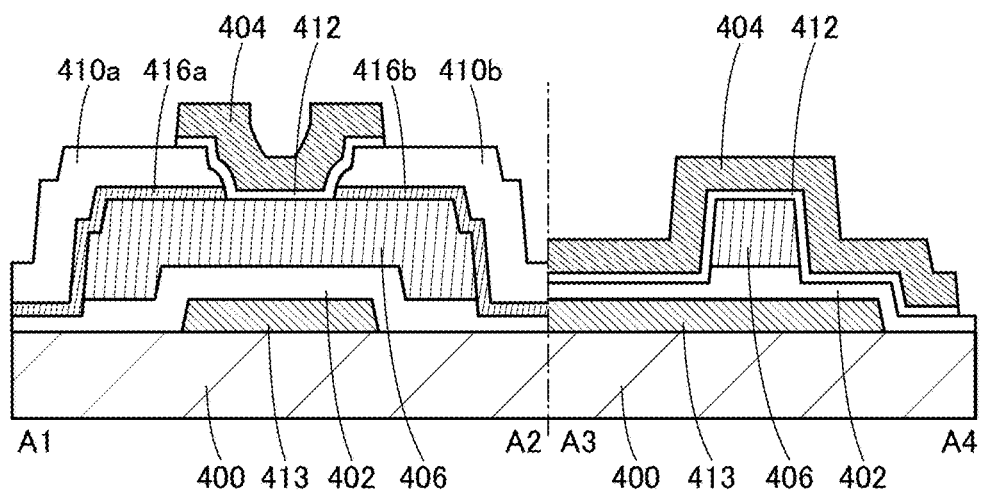
Figure 53C:
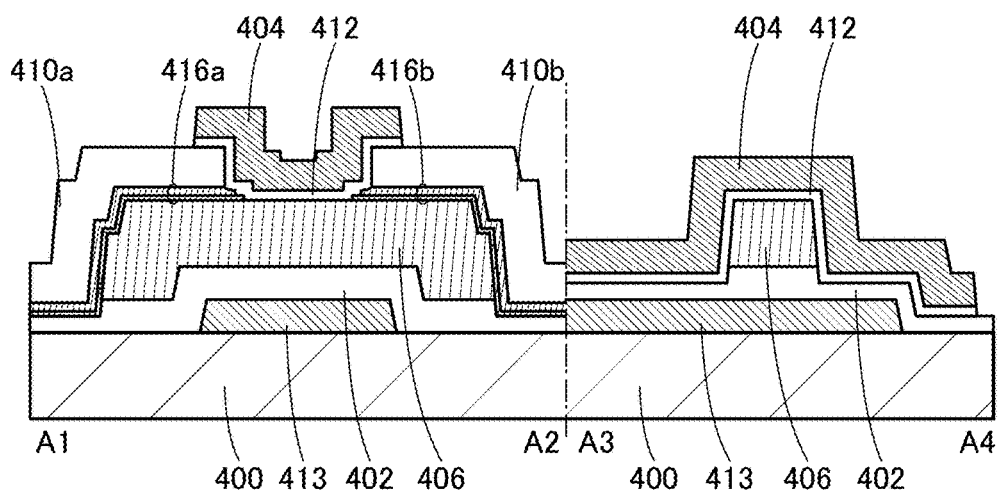

Although the case where the conductors 416a and 416b and the insulators 410a and 410b have the same shapes as those in FIGS. 1A to 1E is illustrated in FIG. 11B and the like as a typical example, one embodiment of the present invention is not limited thereto. For example, as illustrated in FIG. 51A, a shape similar to that in FIG. 2E may be employed. As illustrated in FIG. 51B, a shape similar to that in FIG. 3D may be employed. As illustrated in FIG. 51C, a shape similar to that in FIG. 4D may be employed. As illustrated in FIG. 52A, a shape similar to that in FIG. 5E may be employed. As illustrated in FIG. 52B, a shape similar to that in FIG. 6E may be employed. As illustrated in FIG. 52C, a shape similar to that in FIG. 7D may be employed. As illustrated in FIG. 53A, the insulators 410a and 410b each may have a slope which becomes steeper gradually toward the edge portion. Alternatively, as illustrated in FIG. 53B, each edge portion of the insulators 410a and 410b may have a region whose slope angle is changed stepwise. Alternatively, as illustrated in FIG. 53C, the conductors 416a and 416b each may have a stacked-layer structure. In the stacked-layer structure, the bottom layer may protrude from the top layer, for example. These shapes can be used in combination. The shapes can be individually obtained by change in the conditions for plasma treatment, addition of an etching step, or the like.

<Semiconductor>

By placing a semiconductor over and under the semiconductor 406, electrical characteristics of the transistor can be increased in some cases. The semiconductor 406 and semiconductors placed over and under the semiconductor 406 are described in detail below with reference to FIGS. 13A to 13E.

Figure 13A:
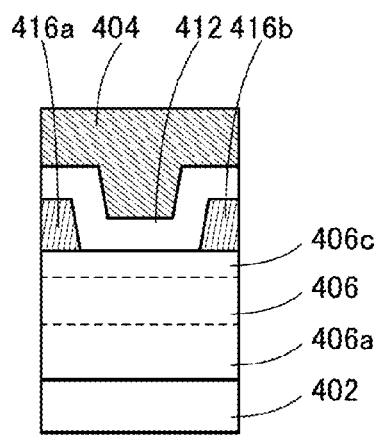
FIGS. 13A to 13E are cross-sectional views and a band diagram of a transistor of one embodiment of the present invention.
Figure 13B:
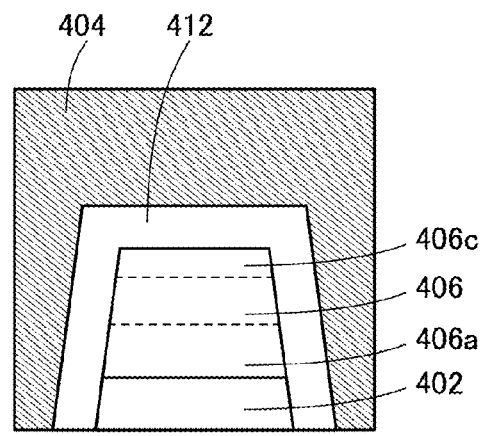

FIG. 13A is an enlarged cross-sectional view illustrating the semiconductor 406 and its vicinity of the transistor illustrated in FIG. 11B in the channel length direction. FIG. 13B is an enlarged cross-sectional view illustrating the semiconductor 406 and its vicinity of the transistor illustrated in FIG. 11B in the channel width direction.

In the transistor structure illustrated in FIGS. 13A and 13B, a semiconductor 406a is placed between the insulator 402 and the semiconductor 406. In addition, a semiconductor 406c is placed between the semiconductor 406 and the conductors 416a and 416b and between the semiconductor 406 and the insulator 412.

Figure 13C:
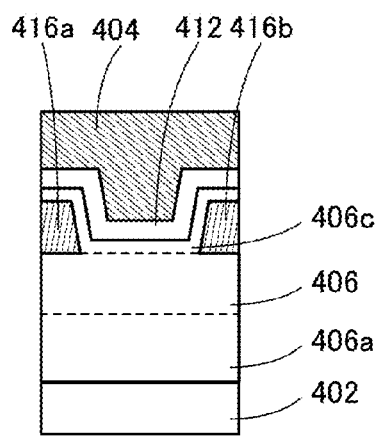
Figure 13D:
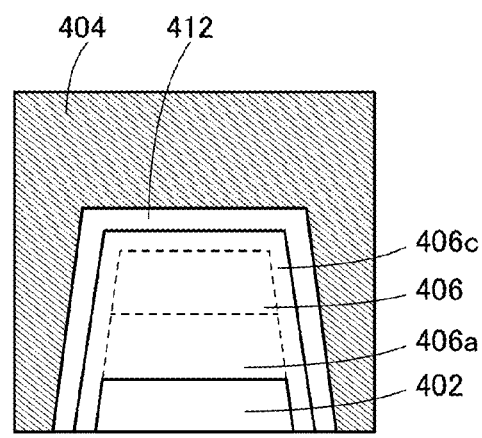
Figure 13E:
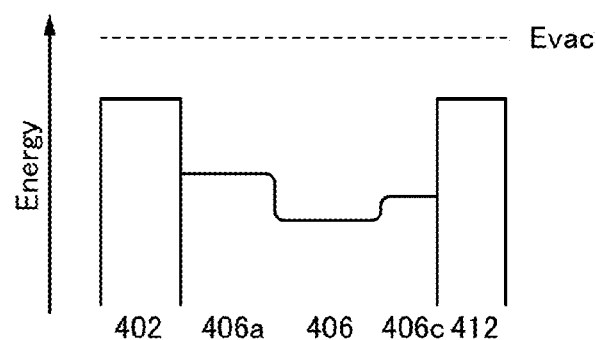

Alternatively, the transistor may have a structure illustrated in FIGS. 13C and 13D.

FIG. 13C is an enlarged cross-sectional view illustrating the semiconductor 406 and its vicinity of the transistor illustrated in FIG. 11B in the channel length direction. FIG. 13D is an enlarged cross-sectional view illustrating the semiconductor 406 and its vicinity of the transistor illustrated in FIG. 11B in the channel width direction.

In the transistor structure illustrated in FIGS. 13C and 13D, the semiconductor 406a is placed between the insulator 402 and the semiconductor 406. In addition, the semiconductor 406c is placed between the insulator 412 and the insulator 402, the conductors 416a and 416b, the semiconductor 406a, and the semiconductor 406.

The semiconductor 406 is an oxide semiconductor containing indium, for example. The oxide semiconductor 406 can have high carrier mobility (electron mobility) by containing indium, for example. The semiconductor 406 preferably contains an element M. The element M is preferably aluminum, gallium, yttrium, tin, or the like. Other elements which can be used as the element M are boron, silicon, titanium, iron, nickel, germanium, zirconium, molybdenum, lanthanum, cerium, neodymium, hafnium, tantalum, tungsten, and the like. Note that two or more of the above elements may be used in combination as the element M. The element M is an element having high bonding energy with oxygen, for example. The element M is an element whose bonding energy with oxygen is higher than that of indium. The element M is an element that can increase the energy gap of the oxide semiconductor, for example. Furthermore, the semiconductor 406 preferably contains zinc. When the oxide semiconductor contains zinc, the oxide semiconductor is easily crystallized, in some cases.

Note that the semiconductor 406 is not limited to the oxide semiconductor containing indium. The semiconductor 406 may be, for example, an oxide semiconductor which does not contain indium and contains zinc, an oxide semiconductor which does not contain indium and contains gallium, or an oxide semiconductor which does not contain indium and contains tin, e.g., a zinc tin oxide or a gallium tin oxide.

For the semiconductor 406, an oxide with a wide energy gap may be used, for example. For example, the energy gap of the semiconductor 406 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

For example, the semiconductor 406a and the semiconductor 406c are oxide semiconductors including one or more elements, or two or more elements other than oxygen included in the semiconductor 406. Since the semiconductor 406a and the semiconductor 406c each include one or more elements, or two or more elements other than oxygen included in the semiconductor 406, a defect state is less likely to be formed at the interface between the semiconductor 406a and the semiconductor 406 and the interface between the semiconductor 406 and the semiconductor 406c.

The semiconductor 406a, the semiconductor 406, and the semiconductor 406c preferably include at least indium. In the case of using an In—M—Zn oxide as the semiconductor 406a, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. In the case of using an In—M—Zn oxide as the semiconductor 406, when the summation of In and M is assumed to be 100 atomic %, the proportions of In and M are preferably set to be greater than 25 atomic % and less than 75 atomic %, respectively, further preferably greater than 34 atomic % and less than 66 atomic %, respectively. In the case of using an In—M—Zn oxide as the semiconductor 406c, when the summation of In and M is assumed to be 100 atomic %, the proportions of In and M are preferably set to be less than 50 atomic % and greater than 50 atomic %, respectively, further preferably less than 25 atomic % and greater than 75 atomic %, respectively. Note that the semiconductor 406c may be an oxide that is of the same type as the oxide of the semiconductor 406a. Note that the semiconductor 406a and/or the semiconductor 406c do/does not necessarily contain indium in some cases. For example, the semiconductor 406a and/or the semiconductor 406c may be gallium oxide. Note that the atomic ratios of the elements included in the semiconductor 406a, the semiconductor 406, and the semiconductor 406c are not necessarily simple ratios of integers.

As the semiconductor 406, an oxide having an electron affinity higher than those of the semiconductors 406a and 406c is used. For example, as the semiconductor 406, an oxide having an electron affinity higher than those of the semiconductors 406a and 406c by 0.07 eV or higher and 1.3 eV or lower, preferably 0.1 eV or higher and 0.7 eV or lower, further preferably 0.15 eV or higher and 0.4 eV or lower is used. Note that the electron affinity refers to an energy difference between the vacuum level and the conduction band minimum.

An indium gallium oxide has small electron affinity and a high oxygen-blocking property. Therefore, the semiconductor 406c preferably includes an indium gallium oxide. The gallium atomic ratio [Ga/(In+Ga)] is, for example, higher than or equal to 70%, preferably higher than or equal to 80%, further preferably higher than or equal to 90%.

At this time, when a gate voltage is applied, a channel is formed in the semiconductor 406 having the highest electron affinity in the semiconductors 406a, 406, and 406c.

Here, in some cases, there is a mixed region of the semiconductor 406a and the semiconductor 406 between the semiconductor 406a and the semiconductor 406. Furthermore, in some cases, there is a mixed region of the semiconductor 406 and the semiconductor 406c between the semiconductor 406 and the semiconductor 406c. The mixed region has a low density of defect states. For that reason, the stack including the semiconductor 406a, the semiconductor 406, and the semiconductor 406c has a band structure where energy is changed continuously at each interface and in the vicinity of the interface (continuous junction) (see FIG. 13E). Note that boundaries of the semiconductor 406a, the semiconductor 406, and the semiconductor 406c are not clear in some cases.

At this time, electrons move mainly in the semiconductor 406, not in the semiconductor 406a and the semiconductor 406c. As described above, when the density of defect states at the interface between the semiconductor 406a and the semiconductor 406 and the density of defect states at the interface between the semiconductor 406 and the semiconductor 406c are decreased, electron movement in the semiconductor 406 is less likely to be inhibited and the on-state current of the transistor can be increased.

As factors of inhibiting electron movement are decreased, the on-state current of the transistor can be increased. For example, in the case where there is no factor of inhibiting electron movement, electrons are assumed to be efficiently moved. Electron movement is inhibited, for example, in the case where physical unevenness of the channel formation region is large.

To increase the on-state current of the transistor, for example, root mean square (RMS) roughness with a measurement area of 1 μm×1 μm of a top surface or a bottom surface of the semiconductor 406 (a formation surface; here, the semiconductor 406a) is less than 1 nm, preferably less than 0.6 nm, further preferably less than 0.5 nm, still further preferably less than 0.4 nm. The average surface roughness (also referred to as Ra) with the measurement area of 1 μm×1 μm is less than 1 nm, preferably less than 0.6 nm, further preferably less than 0.5 nm, still further preferably less than 0.4 nm. The maximum difference (P–V) with the measurement area of 1 μm×1 μm is less than 10 nm, preferably less than 9 nm, further preferably less than 8 nm, still further preferably less than 7 nm. RMS roughness, Ra, and P–V can be measured using a scanning probe microscope SPA-500 manufactured by SII Nano Technology Inc.

Moreover, the thickness of the semiconductor 406c is preferably as small as possible to increase the on-state current of the transistor. For example, the semiconductor 406c is formed to include a region having a thickness of less than 10 nm, preferably less than or equal to 5 nm, further preferably less than or equal to 3 nm. Meanwhile, the semiconductor 406c has a function of blocking entry of elements other than oxygen (such as hydrogen and silicon) included in the adjacent insulator into the semiconductor 406 where a channel is formed. For this reason, it is preferable that the semiconductor 406c have a certain thickness. For example, the semiconductor 406c is formed to include a region having a thickness of greater than or equal to 0.3 nm, preferably greater than or equal to 1 nm, further preferably greater than or equal to 2 nm. The semiconductor 406c preferably has an oxygen blocking property to suppress outward diffusion of oxygen released from the insulator 402 and the like.

To improve reliability, preferably, the thickness of the semiconductor 406a is large and the thickness of the semiconductor 406c is small. For example, the semiconductor 406a includes a region with a thickness of, for example, greater than or equal to 10 nm, preferably greater than or equal to 20 nm, further preferably greater than or equal to 40 nm, still further preferably greater than or equal to 60 nm. When the thickness of the semiconductor 406a is made large, a distance from an interface between the adjacent insulator and the semiconductor 406a to the semiconductor 406 in which a channel is formed can be large. Since the productivity of the semiconductor device might be decreased, the semiconductor 406a has a region with a thickness of, for example, less than or equal to 200 nm, preferably less than or equal to 120 nm, further preferably less than or equal to 80 nm.

For example, a region with a silicon concentration measured by secondary ion mass spectrometry (SIMS) of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406 and the semiconductor 406a. A region with a silicon concentration measured by SIMS of higher than or equal to $1\times10^{16}$ atoms/cm$^3$ and lower than or equal to $1\times10^{19}$ atoms/cm$^3$, preferably higher than or equal to $1\times10^{16}$ atoms/cm$^3$ and lower than or equal to $5\times10^{18}$ atoms/cm$^3$, further preferably higher than or equal to $1\times10^{16}$ atoms/cm$^3$ and lower than or equal to $2\times10^{18}$ atoms/cm$^3$ is provided between the semiconductor 406 and the semiconductor 406c.

The semiconductor 406 includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. It is preferable to reduce the hydrogen concentration in the semiconductor 406a and the semiconductor 406c in order to reduce the hydrogen concentration in the semiconductor 406. The semiconductor 406a and the semiconductor 406c each includes a region with a hydrogen concentration measured by SIMS of higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, further preferably higher than or equal to $1\times10^{16}$ atoms/cm$^3$ and lower than or equal to $1\times10^{19}$ atoms/cm$^3$, or still further preferably higher than or equal to $1\times10^{16}$ atoms/cm$^3$ and lower than or equal to $5\times10^{18}$ atoms/cm$^3$. Furthermore, the semiconductor 406 includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$. It is preferable to reduce the nitrogen concentration in the semiconductor 406a and the semiconductor 406c in order to reduce the nitrogen concentration in the semiconductor 406. The semiconductor 406a and the semiconductor 406c includes a region with a nitrogen concentration measured by SIMS of higher than or equal to $1\times10^{15}$ atoms/cm$^3$ and lower than or equal to $5\times10^{19}$ atoms/cm$^3$, preferably higher than or equal to $1\times10^{15}$ atoms/cm$^3$ and lower than or equal to $5\times10^{18}$ atoms/cm$^3$, further preferably higher than or equal to $1\times10^{15}$ atoms/cm$^3$ and lower than or equal to $1\times10^{18}$ atoms/cm$^3$, or still further preferably higher than or equal to $1\times10^{15}$ atoms/cm$^3$ and lower than or equal to $5\times10^{17}$ atoms/cm$^3$.

The above three-layer structure is an example. For example, a two-layer structure without the semiconductor 406a or the semiconductor 406c may be employed. Alternatively, a four-layer structure in which any one of the semiconductors described as examples of the semiconductor 406a, the semiconductor 406, and the semiconductor 406c is provided under or over the semiconductor 406a or under or over the semiconductor 406c may be employed. An n-layer structure (n is an integer of 5 or more) in which one or more of the semiconductors described as examples of the semiconductor 406a, the semiconductor 406, and the semiconductor 406c is provided at two or more of the following positions: over the semiconductor 406a, under the semiconductor 406a, over the semiconductor 406c, and under the semiconductor 406c.

<Structure of Oxide Semiconductor>

A structure of an oxide semiconductor is described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and a microcrystalline oxide semiconductor.

First, a CAAC-OS is described. Note that a CAAC-OS can be referred to as an oxide semiconductor including c-axis aligned nanocrystals (CANC).

A CAAC-OS is one of oxide semiconductors having a plurality of c-axis aligned crystal parts (also referred to as pellets).

In a combined analysis image (also referred to as a high-resolution TEM image) of a bright-field image and a diffraction pattern of a CAAC-OS, which is obtained using a transmission electron microscope (TEM), a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 38A:
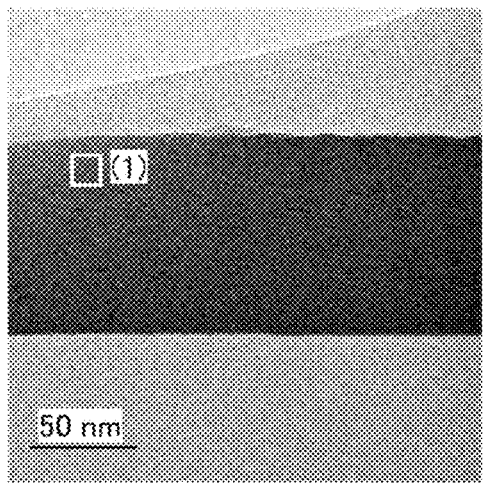
FIGS. 38A to 38C are Cs-corrected high-resolution TEM images of a cross section of a CAAC-OS and FIG. 38D is a schematic cross-sectional view of the CAAC-OS.

A CAAC-OS observed with TEM is described below. FIG. 38A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 38B:
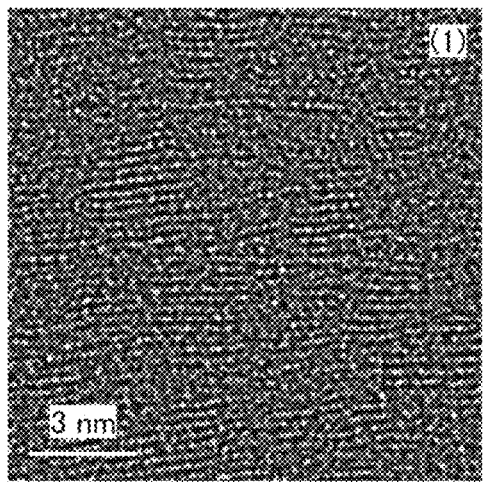

FIG. 38B is an enlarged Cs-corrected high-resolution TEM image of a region (1) in FIG. 38A. FIG. 38B shows that metal atoms are arranged in a layered manner in a pellet. Each metal atom layer has a configuration reflecting unevenness of a surface over which the CAAC-OS is formed (hereinafter, the surface is referred to as a formation surface) or a top surface of the CAAC-OS, and is arranged parallel to the formation surface or the top surface of the CAAC-OS.

Figure 38C:
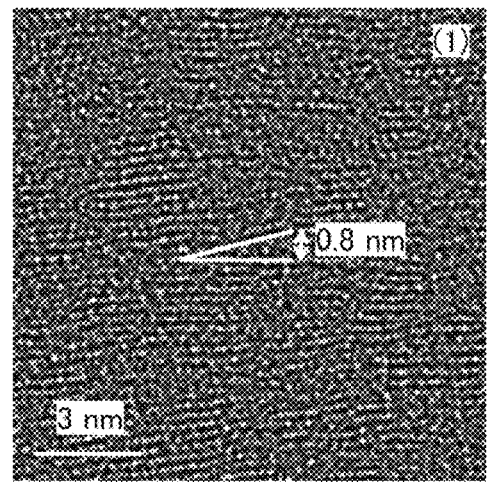

As shown in FIG. 38B, the CAAC-OS has a characteristic atomic arrangement. The characteristic atomic arrangement is denoted by an auxiliary line in FIG. 38C. FIGS. 38B and 38C prove that the size of a pellet is approximately 1 nm to 3 nm, and the size of a space caused by tilt of the pellets is approximately 0.8 nm. Therefore, the pellet can also be referred to as a nanocrystal (nc).

Figure 38D:
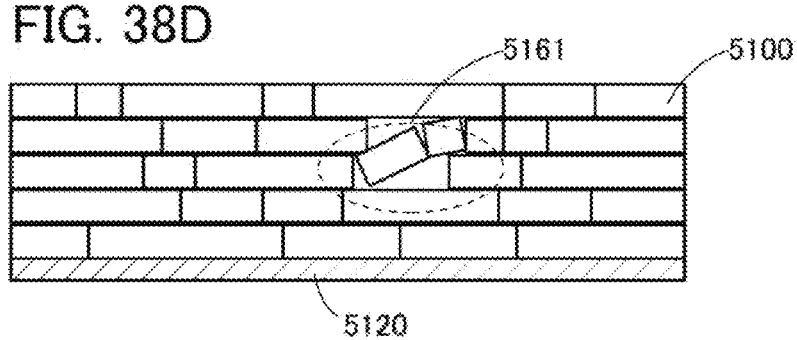

Here, according to the Cs-corrected high-resolution TEM images, the schematic arrangement of pellets 5100 of a CAAC-OS over a substrate 5120 is illustrated by such a structure in which bricks or blocks are stacked (see FIG. 38D). The part in which the pellets are tilted as observed in FIG. 38C corresponds to a region 5161 shown in FIG. 38D.

Figure 39A:
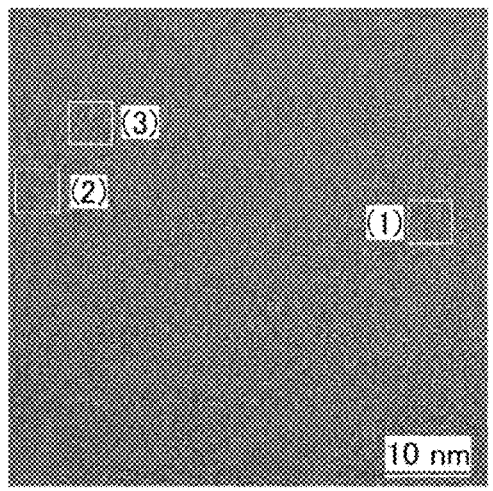
FIGS. 39A to 39D are Cs-corrected high-resolution TEM images of a plane of a CAAC-OS.
Figure 39B:
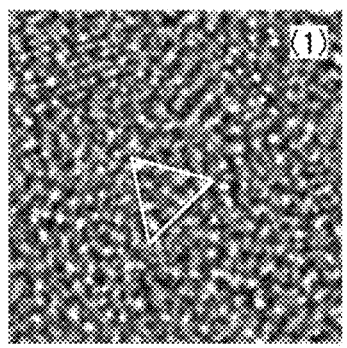
Figure 39C:
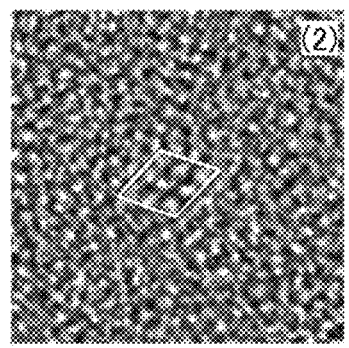
Figure 39D:
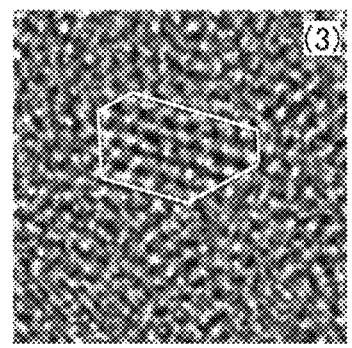

FIG. 39A shows a Cs-corrected high-resolution TEM image of a plane of the CAAC-OS observed from a direction substantially perpendicular to the sample surface. FIGS. 39B, 39C, and 39D are enlarged Cs-corrected high-resolution TEM images of regions (1), (2), and (3) in FIG. 39A, respectively. FIGS. 39B, 39C, and 39D indicate that metal atoms are arranged in a triangular, quadrangular, or hexagonal configuration in a pellet. However, there is no regularity of arrangement of metal atoms between different pellets.

Figure 40A:
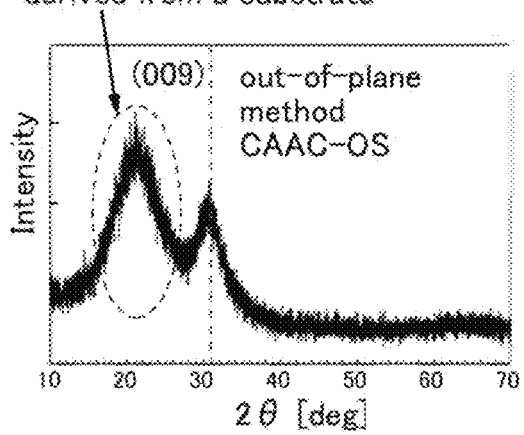
FIGS. 40A to 40C show structural analysis of a CAAC-OS and a single crystal oxide semiconductor by XRD.

Next, a CAAC-OS analyzed by X-ray diffraction (XRD) is described. For example, when the structure of a CAAC-OS including an InGaZnO$_4$ crystal is analyzed by an out-of-plane method, a peak appears at a diffraction angle (2θ) of around 31° as shown in FIG. 40A. This peak is derived from the (009) plane of the InGaZnO$_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak at 2θ of around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 40B:
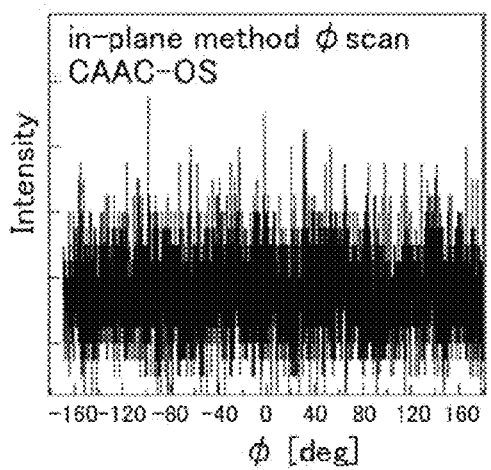
Figure 40C:
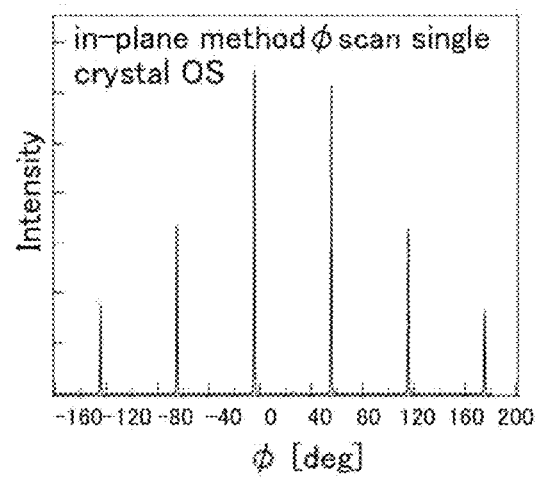

On the other hand, in structural analysis of the CAAC-OS by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 40B, a peak is not clearly observed. In contrast, in the case of a single crystal oxide semiconductor of InGaZnO$_4$, when φ scan is performed with 2θ fixed at around 56°, as shown in FIG. 40C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an InGaZnO$_4$ crystal in a direction parallel to the sample surface, a diffraction pattern (also referred to as a selected-area transmission electron diffraction pattern) shown in FIG. 41A can be obtained. In this diffraction pattern, spots derived from the (009) plane of an InGaZnO$_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 41B shows a diffraction pattern obtained in such a manner that an electron beam with a probe diameter of 300 nm is incident on the same sample in a direction perpendicular to the sample surface. As shown in FIG. 41B, a ring-like diffraction pattern is observed. Thus, the electron diffraction also indicates that the a-axes and b-axes of the pellets included in the CAAC-OS do not have regular alignment. The first ring in FIG. 41B is considered to be derived from the (010) plane, the (100) plane, and the like of the InGaZnO$_4$ crystal. The second ring in FIG. 41B is considered to be derived from the (110) plane and the like.

Moreover, the CAAC-OS is an oxide semiconductor having a low density of defect states. Defects in the oxide semiconductor are, for example, a defect due to impurity and oxygen vacancies. Therefore, the CAAC-OS can be regarded as an oxide semiconductor with a low impurity concentration, or an oxide semiconductor having a small number of oxygen vacancies.

The impurity contained in the oxide semiconductor might serve as a carrier trap or serve as a carrier generation source. Furthermore, oxygen vacancies in the oxide semiconductor serve as carrier traps or serve as carrier generation sources when hydrogen is captured therein.

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

An oxide semiconductor having a low density of defect states (a small number of oxygen vacancies) can have a low carrier density. Such an oxide semiconductor is referred to as a highly purified intrinsic or substantially highly purified intrinsic oxide semiconductor. A CAAC-OS has a low impurity concentration and a low density of defect states. That is, a CAAC-OS is likely to be highly purified intrinsic or substantially highly purified intrinsic oxide semiconductor. Thus, a transistor including a CAAC-OS rarely has negative threshold voltage (is rarely normally on). The highly purified intrinsic or substantially highly purified intrinsic oxide semiconductor has few carrier traps. An electric charge trapped by the carrier traps in the oxide semiconductor takes a long time to be released. The trapped electric charge may behave like a fixed electric charge. Thus, the transistor which includes the oxide semiconductor having a high impurity concentration and a high density of defect states might have unstable electrical characteristics. However, a transistor including a CAAC-OS has small variation in electrical characteristics and high reliability.

Since the CAAC-OS has a low density of defect states, carriers generated by light irradiation or the like are less likely to be trapped in defect states. Therefore, in a transistor using the CAAC-OS, change in electrical characteristics due to irradiation with visible light or ultraviolet light is small.

<Microcrystalline Oxide Semiconductor>

Next, a microcrystalline oxide semiconductor is described.

A microcrystalline oxide semiconductor has a region in which a crystal part is observed and a region in which a crystal part is not clearly observed in a high-resolution TEM image. In most cases, the size of a crystal part included in the microcrystalline oxide semiconductor is greater than or equal to 1 nm and less than or equal to 100 nm, or greater than or equal to 1 nm and less than or equal to 10 nm. An oxide semiconductor including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS). In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an amorphous oxide semiconductor, depending on an analysis method. For example, when the nc-OS is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS when an electron beam having a probe diameter close to or smaller than the size of a pellet is applied. Moreover, in a nanobeam electron diffraction pattern of the nc-OS, regions with high luminance in a circular (ring) pattern are shown in some cases.

Also in a nanobeam electron diffraction pattern of the nc-OS, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an amorphous oxide semiconductor. Note that there is no regularity of crystal orientation between different pellets in the nc-OS. Therefore, the nc-OS has a higher density of defect states than the CAAC-OS.

<Amorphous Oxide Semiconductor>

Next, an amorphous oxide semiconductor is described.

The amorphous oxide semiconductor is an oxide semiconductor having disordered atomic arrangement and no crystal part and exemplified by an oxide semiconductor which exists in an amorphous state as quartz.

In a high-resolution TEM image of the amorphous oxide semiconductor, crystal parts cannot be found.

When the amorphous oxide semiconductor is subjected to structural analysis by an out-of-plane method with an XRD apparatus, a peak which shows a crystal plane does not appear. A halo pattern is observed when the amorphous oxide semiconductor is subjected to electron diffraction. Furthermore, a spot is not observed and only a halo pattern appears when the amorphous oxide semiconductor is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor to be called an amorphous oxide semiconductor as long as even a negligible degree of ordering is present in an atomic arrangement. At least an oxide semiconductor having long-term ordering cannot be called an amorphous oxide semiconductor. Accordingly, because of the presence of crystal part, for example, a CAAC-OS and an nc-OS cannot be called an amorphous oxide semiconductor or a completely amorphous oxide semiconductor.

<Amorphous-Like Oxide Semiconductor>

Note that an oxide semiconductor may have a structure intermediate between the nc-OS and the amorphous oxide semiconductor. The oxide semiconductor having such a structure is specifically referred to as an amorphous-like oxide semiconductor (a-like OS).

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it includes a void. To verify that an a-like OS has an unstable structure as compared with a CAAC-OS and an nc-OS, a change in structure caused by electron irradiation is described below.

An a-like OS (referred to as Sample A), an nc-OS (referred to as Sample B), and a CAAC-OS (referred to as Sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 42:
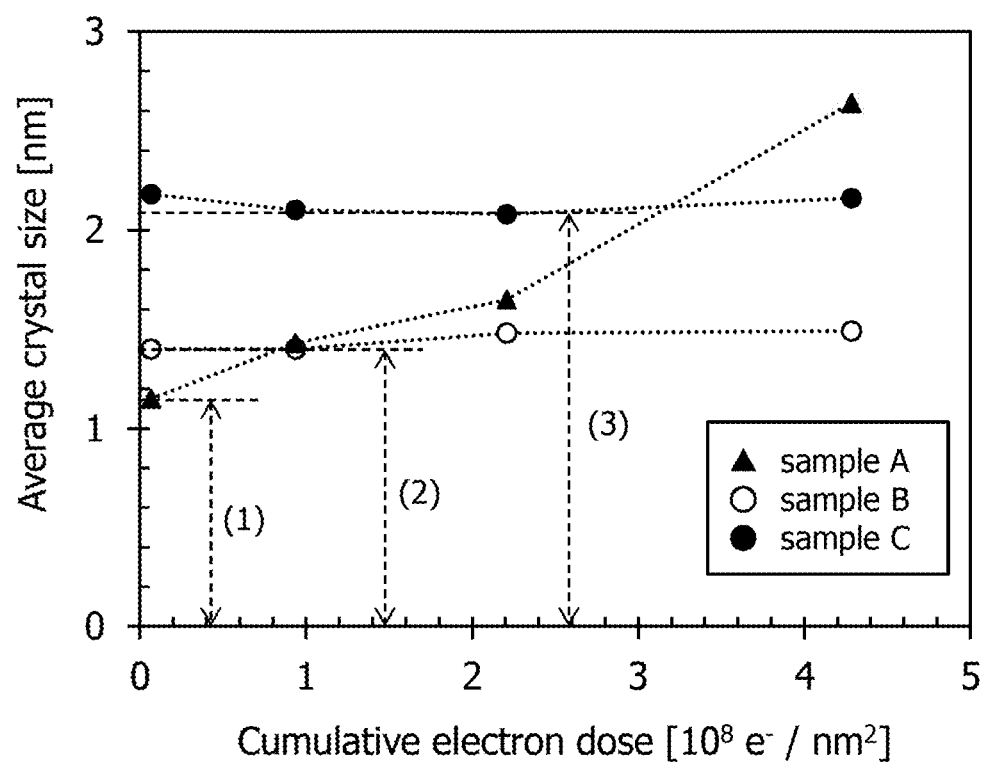
FIG. 42 shows a change of crystal parts of an In—Ga—Zn oxide owing to electron irradiation.

FIG. 42 shows change in the average size of crystal parts (at 22 points to 45 points) in each sample. Note that the crystal part size corresponds to the length of a lattice fringe. FIG. 42 indicates that the crystal part size in the a-like OS increases with an increase in the cumulative electron dose. Specifically, as shown by (1) in FIG. 42, a crystal part of approximately 1.2 nm (also referred to as an initial nucleus) at the start of TEM observation grows to a size of approximately 2.6 nm at a cumulative electron dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^{-1}/nm^2$. Specifically, as shown by (2) and (3) in FIG. 42, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more films of an amorphous oxide semiconductor, an a-like OS, a microcrystalline oxide semiconductor, and a CAAC-OS, for example.

<Deposition Model>

Examples of deposition models of a CAAC-OS and an nc-OS are described below.

Figure 43A:
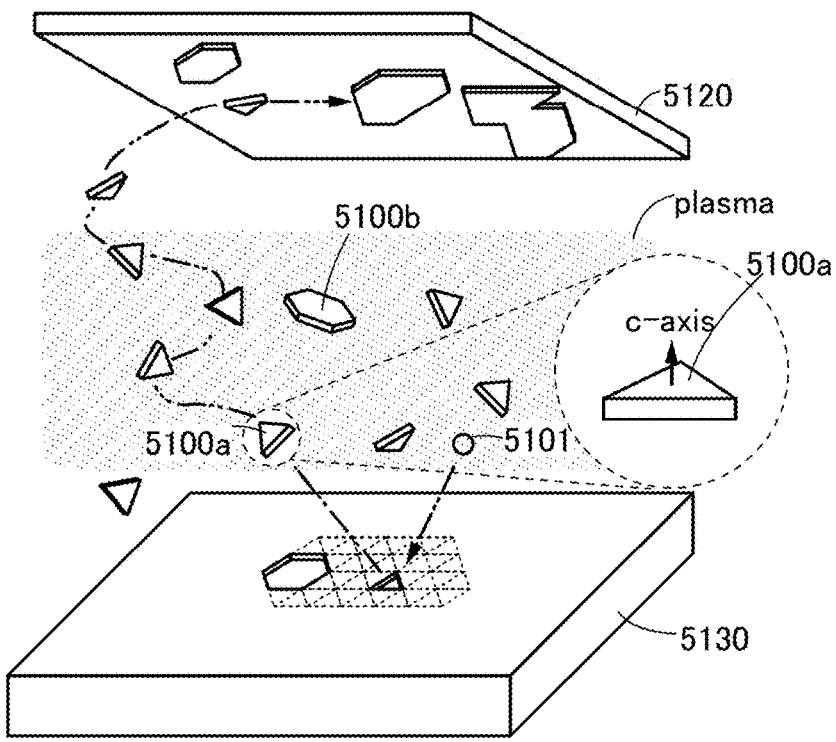
FIGS. 43A and 43B are schematic views showing deposition models of a CAAC-OS and an nc-OS.

FIG. 43A is a schematic view of the inside of a deposition chamber where a CAAC-OS is deposited by a sputtering method.

A target 5130 is attached to a backing plate. A plurality of magnets is provided to face the target 5130 with the backing plate positioned therebetween. The plurality of magnets generates a magnetic field. A sputtering method in which the disposition rate is increased by utilizing a magnetic field of magnets is referred to as a magnetron sputtering method.

The substrate 5120 is placed to face the target 5130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 5 vol % or higher) and the pressure in the deposition chamber is controlled to be higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 5130, and plasma is observed. The magnetic field forms a high-density plasma region in the vicinity of the target 5130. In the high-density plasma region, the deposition gas is ionized, so that an ion 5101 is generated. Examples of the ion 5101 include an oxygen cation ($O^+$) and an argon cation ($Ar^+$).

Figure 44A:
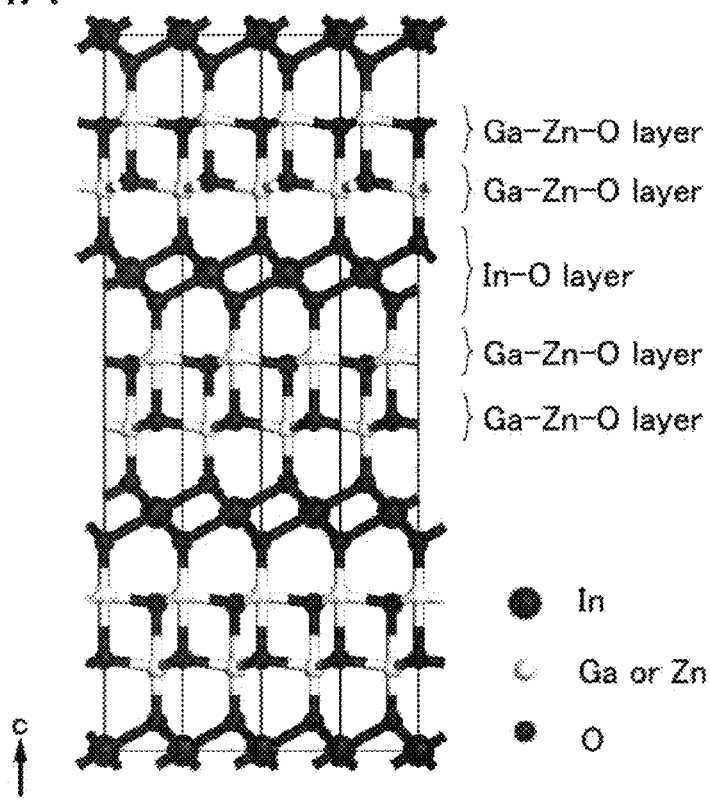
FIGS. 44A to 44C show an InGaZnO$_4$ crystal and a pellet.

Here, the target 5130 has a polycrystalline structure which includes a plurality of crystal grains and in which a cleavage plane exists in at least one crystal grain. FIG. 44A shows a structure of an $InGaZnO_4$ crystal included in the target 5130 as an example. Note that FIG. 44A shows a structure of the case where the $InGaZnO_4$ crystal is observed from a direction parallel to the b-axis. FIG. 44A indicates that oxygen atoms in a Ga—Zn—O layer are positioned close to those in an adjacent Ga—Zn—O layer. The oxygen atoms have negative charge, whereby repulsive force is generated between the two adjacent Ga—Zn—O layers. As a result, the $InGaZnO_4$ crystal has a cleavage plane between the two adjacent Ga—Zn—O layers.

The ion 5101 generated in the high-density plasma region is accelerated toward the target 5130 side by an electric field, and then collides with the target 5130. At this time, a pellet 5100a and a pellet 5100b which are flat-plate-like (pellet-like) sputtered particles are separated and sputtered from the cleavage plane. Note that structures of the pellet 5100a and the pellet 5100b may be distorted by an impact of collision of the ion 5101.

The pellet 5100a is a flat-plate-like (pellet-like) sputtered particle having a triangle plane, e.g., regular triangle plane. The pellet 5100b is a flat-plate-like (pellet-like) sputtered particle having a hexagon plane, e.g., regular hexagon plane. Note that flat-plate-like (pellet-like) sputtered particles such as the pellet 5100a and the pellet 5100b are collectively called pellets 5100. The shape of a flat plane of the pellet 5100 is not limited to a triangle or a hexagon. For example, the flat plane may have a shape formed by combining two or more triangles. For example, a quadrangle (e.g., rhombus) may be formed by combining two triangles (e.g., regular triangles).

Figure 44B:
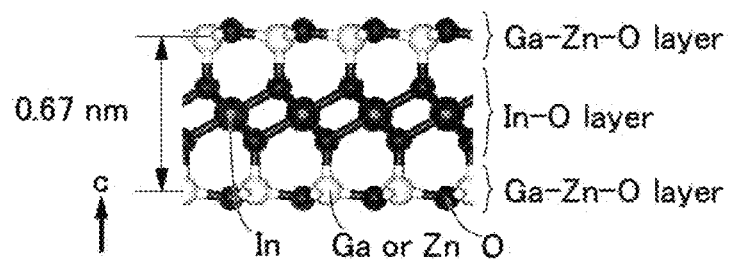
Figure 44C:
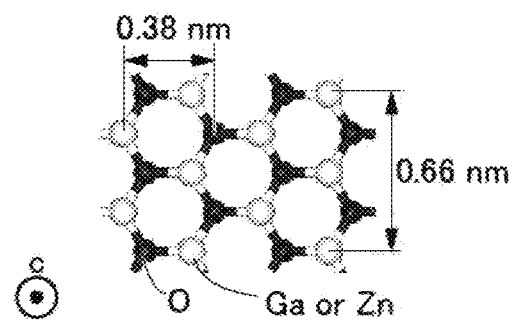

The thickness of the pellet 5100 is determined depending on the kind of deposition gas and the like. The thicknesses of the pellets 5100 are preferably uniform; the reason for this is described later. In addition, the sputtered particle preferably has a pellet shape with a small thickness as compared to a dice shape with a large thickness. For example, the thickness of the pellet 5100 is greater than or equal to 0.4 nm and less than or equal to 1 nm, preferably greater than or equal to 0.6 nm and less than or equal to 0.8 nm. In addition, for example, the width of the pellet 5100 is greater than or equal to 1 nm and less than or equal to 3 nm, preferably greater than or equal to 1.2 nm and less than or equal to 2.5 nm. The pellet 5100 corresponds to the initial nucleus in the description of (1) in FIG. 42. For example, when the ion 5101 collides with the target 5130 including an In—Ga—Zn oxide, the pellet 5100 that includes three layers of a Ga—Zn—O layer, an In—O layer, and a Ga—Zn—O layer as shown in FIG. 44B is separated. Note that FIG. 44C shows the structure of the separated pellet 5100 which is observed from a direction parallel to the c-axis. The pellet 5100 has a nanometer-sized sandwich structure including two Ga—Zn—O layers (pieces of bread) and an In—O layer (filling).

The pellet 5100 may receive a charge when passing through the plasma, so that side surfaces thereof are negatively or positively charged. In the pellet 5100, for example, an oxygen atom positioned on its side surface may be negatively charged. When the side surfaces are charged with the same polarity, charges repel each other, and accordingly, the pellet 5100 can maintain a flat-plate (pellet) shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, or a zinc atom is negatively charged. In addition, the pellet 5100 may grow by being bonded with an indium atom, a gallium atom, a zinc atom, an oxygen atom, or the like when passing through plasma. A difference in size between (2) and (1) in FIG. 42 corresponds to the amount of growth in plasma. Here, in the case where the temperature of the substrate 5120 is at around room temperature, the pellet 5100 on the substrate 5120 hardly grows; thus, an nc-OS is formed (see FIG. 43B). An nc-OS can be deposited when the substrate 5120 has a large size because the deposition of an nc-OS can be carried out at room temperature. Note that in order that the pellet 5100 grows in plasma, it is effective to increase deposition power in sputtering. High deposition power can stabilize the structure of the pellet 5100.

Figure 43B:
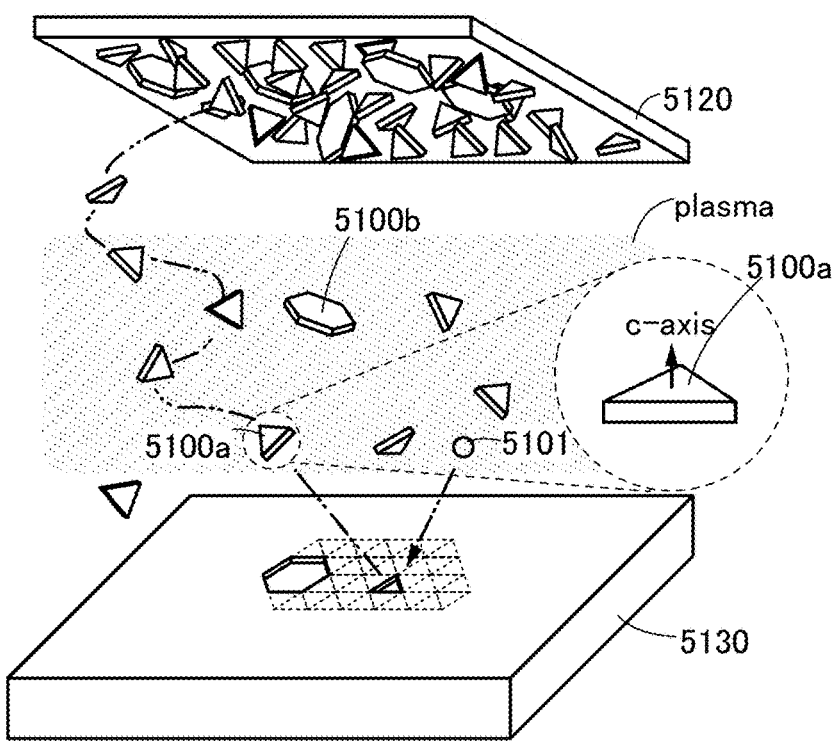

As shown in FIGS. 43A and 43B, the pellet 5100 flies like a kite in plasma and flutters up to the substrate 5120. Since the pellets 5100 are charged, when the pellet 5100 gets close to a region where another pellet 5100 has already been deposited, repulsion is generated. Here, above the substrate 5120, a magnetic field in a direction parallel to the top surface of the substrate 5120 (also referred to as a horizontal magnetic field) is generated. A potential difference is given between the substrate 5120 and the target 5130, and accordingly, current flows from the substrate 5120 toward the target 5130. Thus, the pellet 5100 is given a force (Lorentz force) on the top surface of the substrate 5120 by an effect of the magnetic field and the current. This is explainable with Fleming's left-hand rule.

The mass of the pellet 5100 is larger than that of an atom. Therefore, to move the pellet 5100 over the top surface of the substrate 5120, it is important to apply some force to the pellet 5100 from the outside. One kind of the force may be force which is generated by the action of a magnetic field and current. In order to apply a sufficient force to the pellet 5100 so that the pellet 5100 moves over a top surface of the substrate 5120, it is preferable to provide, on the top surface, a region where the magnetic field in a direction parallel to the top surface of the substrate 5120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate 5120 is 1.5 times or higher, preferably twice or higher, further preferably 3 times or higher, still further preferably 5 times or higher as high as the magnetic field in a direction perpendicular to the top surface of the substrate 5120.

At this time, the magnets and the substrate 5120 are moved or rotated relatively, whereby the direction of the horizontal magnetic field on the top surface of the substrate 5120 continues to change. Therefore, the pellet 5100 can be moved in various directions on the top surface of the substrate 5120 by receiving forces in various directions.

Furthermore, as shown in FIG. 43A, when the substrate 5120 is heated, resistance between the pellet 5100 and the substrate 5120 due to friction or the like is low. As a result, the pellet 5100 glides above the top surface of the substrate 5120. The glide of the pellet 5100 is caused in a state where its flat plane faces the substrate 5120. Then, when the pellet 5100 reaches the side surface of another pellet 5100 that has been already deposited, the side surfaces of the pellets 5100 are bonded. At this time, the oxygen atom on the side surface of the pellet 5100 is released. With the released oxygen atom, oxygen vacancies in a CAAC-OS might be filled; thus, the CAAC-OS has a low density of defect states. Note that the temperature of the top surface of the substrate 5120 is, for example, higher than or equal to 100° C. and lower than 500° C., higher than or equal to 150° C. and lower than 450° C., or higher than or equal to 170° C. and lower than 400° C. Hence, even when the substrate 5120 has a large size, it is possible to deposit a CAAC-OS.

Furthermore, the pellet 5100 is heated on the substrate 5120, whereby atoms are rearranged, and the structure distortion caused by the collision of the ion 5101 can be reduced. The pellet 5100 whose structure distortion is reduced is substantially single crystal. Even when the pellets 5100 are heated after being bonded, expansion and contraction of the pellet 5100 itself hardly occur, which is caused by turning the pellet 5100 into substantially single crystal. Thus, formation of defects such as a grain boundary due to expansion of a space between the pellets 5100 can be prevented, and accordingly, generation of crevasses can be prevented.

The CAAC-OS does not have a structure like a board of a single crystal oxide semiconductor but has arrangement with a group of pellets 5100 (nanocrystals) like stacked bricks or blocks. Furthermore, a grain boundary does not exist between the pellets 5100. Therefore, even when deformation such as shrink occurs in the CAAC-OS owing to heating during deposition, heating or bending after deposition, it is possible to relieve local stress or release distortion. Therefore, this structure is suitable for a flexible semiconductor device. Note that the nc-OS has arrangement in which pellets 5100 (nanocrystals) are randomly stacked.

When the target 5130 is sputtered with the ion 5101, in addition to the pellets 5100, zinc oxide or the like may be separated. The zinc oxide is lighter than the pellet 5100 and thus reaches the top surface of the substrate 5120 before the pellet 5100. As a result, the zinc oxide forms a zinc oxide layer 5102 with a thickness greater than or equal to 0.1 nm and less than or equal to 10 nm, greater than or equal to 0.2 nm and less than or equal to 5 nm, or greater than or equal to 0.5 nm and less than or equal to 2 nm. FIGS. 45A to 45D are cross-sectional schematic views.

Figure 45A:
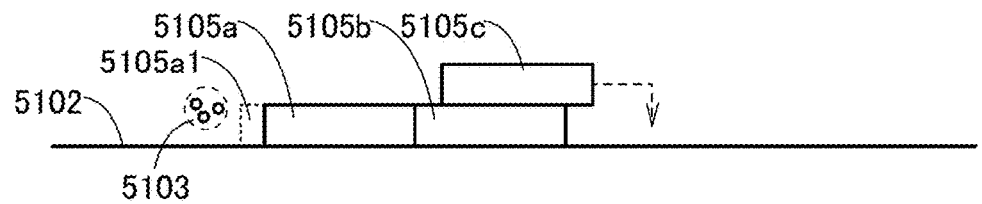
FIGS. 45A to 45D are schematic views showing a deposition model of a CAAC-OS.

As illustrated in FIG. 45A, a pellet 5105a and a pellet 5105b are deposited over the zinc oxide layer 5102. Here, side surfaces of the pellet 5105a and the pellet 5105b are in contact with each other. In addition, a pellet 5105c is deposited over the pellet 5105b, and then glides over the pellet 5105b. Furthermore, a plurality of particles 5103 separated from the target together with the zinc oxide is crystallized by heat from the substrate 5120 to form a region 5105a1 on another side surface of the of the pellet 5105a. Note that the plurality of particles 5103 may contain oxygen, zinc, indium, gallium, or the like.

Figure 45B:
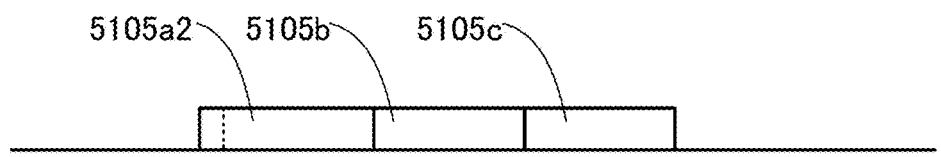

Then, as illustrated in FIG. 45B, the region 5105a1 grows to part of the pellet 5105a to form a pellet 5105a2. In addition, a side surface of the pellet 5105c is in contact with another side surface of the pellet 5105b.

Figure 45C:
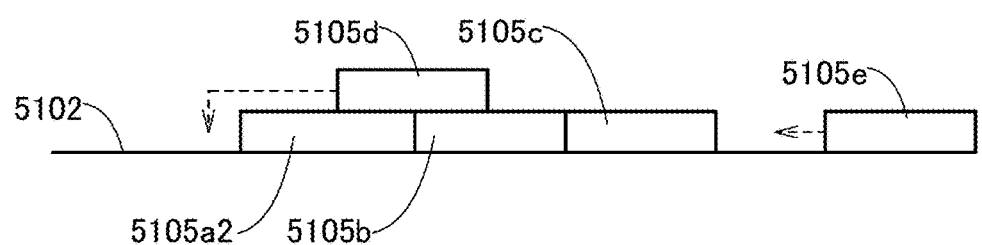

Next, as illustrated in FIG. 45C, a pellet 5105d is deposited over the pellet 5105a2 and the pellet 5105b, and then glides over the pellet 5105a2 and the pellet 5105b. Furthermore, a pellet 5105e glides toward another side surface of the pellet 5105c over the zinc oxide layer 5102.

Figure 45D:
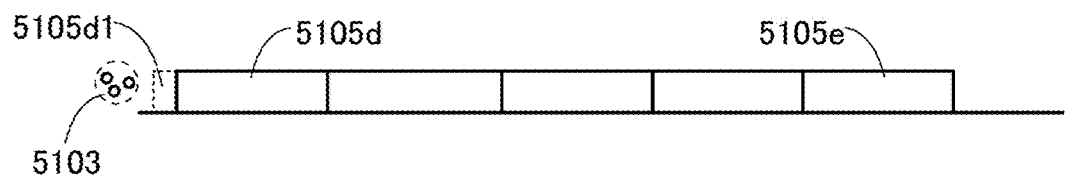

Then, as illustrated in FIG. 45D, the pellet 5105d is placed so that a side surface of the pellet 5105d is in contact with a side surface of the pellet 5105a2. Furthermore, a side surface of the pellet 5105e is in contact with another side surface of the pellet 5105c. A plurality of particles 5103 separated from the target 5130 together with the zinc oxide is crystallized by heat from the substrate 5120 to form a region 5105d1 on another side surface of the pellet 5105d.

As described above, deposited pellets are placed to be in contact with each other and then growth is caused at side surfaces of the pellets, whereby a CAAC-OS is formed over the substrate 5120. Therefore, each pellet of the CAAC-OS is larger than that of the nc-OS. A difference in size between (3) and (2) in FIG. 42 corresponds to the amount of growth after deposition.

When spaces between pellets are extremely small, the pellets may form a large pellet. The large pellet has a single crystal structure. For example, the size of the pellet may be greater than or equal to 10 nm and less than or equal to 200 nm, greater than or equal to 15 nm and less than or equal to 100 nm, or greater than or equal to 20 nm and less than or equal to 50 nm, when seen from the above. In this case, in an oxide semiconductor used for a minute transistor, a channel formation region might be fit inside the large pellet. That is, the region having a single crystal structure can be used as the channel formation region. Furthermore, when the size of the pellet is increased, the region having a single crystal structure can be used as the channel formation region, the source region, and the drain region of the transistor.

In this manner, when the channel formation region or the like of the transistor is formed in a region having a single crystal structure, the frequency characteristics of the transistor can be increased in some cases.

As shown in such a model, the pellets 5100 are considered to be deposited on the substrate 5120. Thus, a CAAC-OS can be deposited even when a formation surface does not have a crystal structure; therefore, a growth mechanism in this case is different from epitaxial growth. In addition, laser crystallization is not needed for formation of a CAAC-OS, and a uniform film can be formed even over a large-sized glass substrate or the like. For example, even when the top surface (formation surface) of the substrate 5120 has an amorphous structure (e.g., the top surface is formed of amorphous silicon oxide), a CAAC-OS can be formed.

In addition, it is found that in formation of the CAAC-OS, the pellets 5100 are arranged in accordance with the top surface shape of the substrate 5120 that is the formation surface even when the formation surface has unevenness. For example, in the case where the top surface of the substrate 5120 is flat at the atomic level, the pellets 5100 are arranged so that flat planes parallel to the a-b plane face downwards. In the case where the thicknesses of the pellets 5100 are uniform, a layer with a uniform thickness, flatness, and high crystallinity is formed. By stacking n layers (n is a natural number), the CAAC-OS can be obtained.

In the case where the top surface of the substrate 5120 has unevenness, a CAAC-OS in which n layers (n is a natural number) in each of which the pellets 5100 are arranged along the unevenness are stacked is formed. Since the substrate 5120 has unevenness, a gap is easily generated between the pellets 5100 in the CAAC-OS in some cases. Note that, even in such a case, owing to intermolecular force, the pellets 5100 are arranged so that a gap between the pellets is as small as possible even on the unevenness surface. Therefore, even when the formation surface has unevenness, a CAAC-OS with high crystallinity can be obtained.

Since a CAAC-OS is deposited in accordance with such a model, the sputtered particle preferably has a pellet shape with a small thickness. Note that when the sputtered particles have a dice shape with a large thickness, planes facing the substrate 5120 vary; thus, the thicknesses and orientations of the crystals cannot be uniform in some cases.

According to the deposition model described above, a CAAC-OS with high crystallinity can be formed even on a formation surface with an amorphous structure.

<Transistor 2>

Next, a method for manufacturing a transistor with a partly different shape is described. FIG. 14A, FIG. 15A, FIG. 16A, FIG. 17A, and FIG. 18A are top views illustrating a method for manufacturing a transistor. FIG. 14B, FIG. 15B, FIG. 16B, FIG. 17B, and FIG. 18B are each a cross-sectional view taken along dashed dotted lines F1-F2 and F3-F4 shown in the corresponding top view.

First, a substrate 500 is prepared. For the substrate 500, the description of the substrate 400 is referred to.

Next, an insulator is formed. The insulator can be formed by a sputtering method, a CVD method, an MBE method, a PLD method, an ALD method, or the like.

Next, a resist or the like is formed over the insulator and processing is performed using the resist, whereby an insulator 503 is formed.

Any of the processing methods illustrated in FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D may be used for processing the insulator to form the insulator 503.

Next, a conductor is formed. The conductor can be formed by a sputtering method, a CVD method, an MBE method, a PLD method, an ALD method, or the like.

Figure 14A:
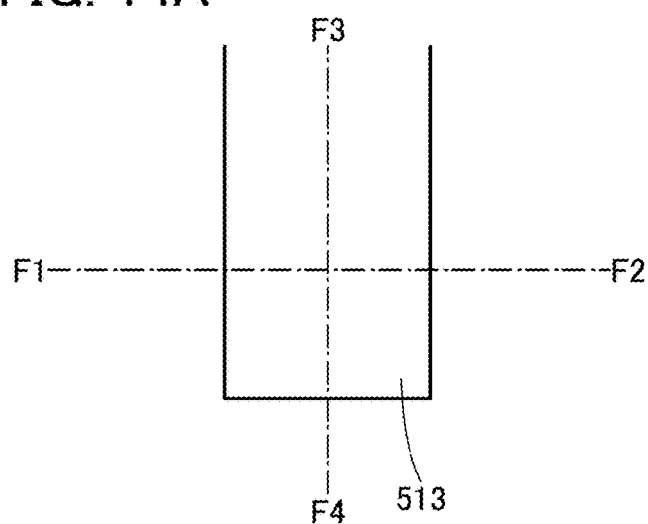
FIGS. 14A and 14B are a top view and a cross-sectional view illustrating a method for manufacturing a transistor of one embodiment of the present invention.
Figure 14B:
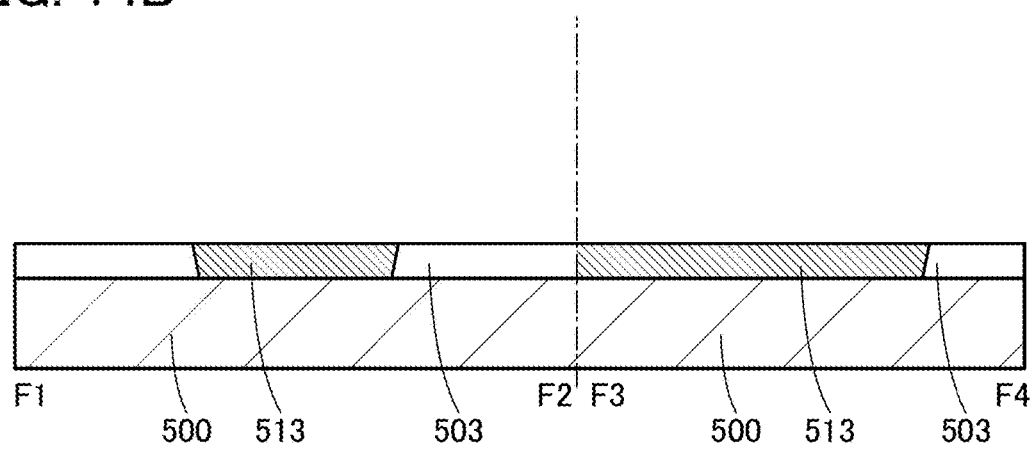

Next, etching is performed from the top surface of the conductor toward the bottom surface thereof so that the etched surface is parallel to the bottom surface of the substrate 500; thus, a conductor 513 can be formed (embedded) in a groove of the insulator 503 (see FIGS. 14A and 14B). When the conductor 513 is formed in this way, the top surface of the conductor 513 can be positioned at substantially the same level as the top surface of the insulator 503. Therefore, a defect in shape in a later step can be inhibited.

For the insulator 503, the description of the insulator 402 is referred to. For the conductor 513, the description of the conductor 413 is referred to.

Next, an insulator 502 is deposited. The insulator 502 can be formed by a sputtering method, a CVD method, an MBE method, a PLD method, an ALD method, or the like. For the insulator 502, the description of the insulator 402 is referred to.

Next, a semiconductor 536 is formed. The semiconductor 536 can be formed by a sputtering method, a CVD method, an MBE method, a PLD method, an ALD method, or the like. For the semiconductor 536, the description of the semiconductor 406 is referred to.

Next, heat treatment is preferably performed.

Next, a conductor 546 is formed. The conductor 546 can be formed by a sputtering method, a CVD method, an MBE method, a PLD method, an ALD method, or the like. For the conductor 546, the description of the conductor 416 is referred to.

Figure 15A:
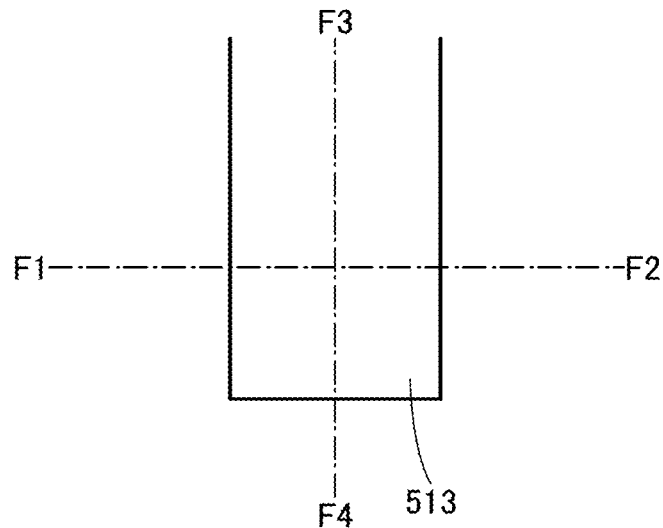
FIGS. 15A and 15B are a top view and a cross-sectional view illustrating a method for manufacturing a transistor of one embodiment of the present invention.
Figure 15B:
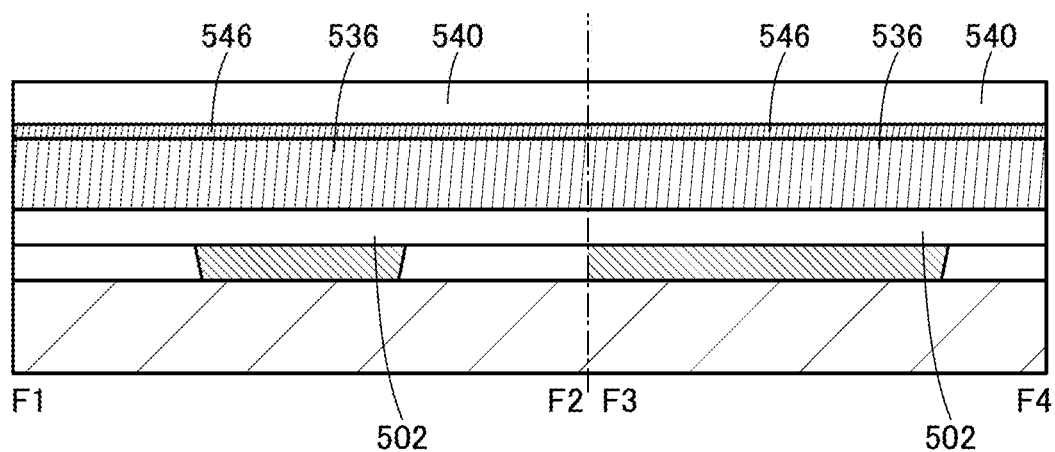

Next, an insulator 540 is formed (see FIGS. 15A and 15B). The insulator 540 can be formed by a sputtering method, a CVD method, an MBE method, a PLD method, an ALD method, or the like. For the insulator 540, description of an insulator 510 is referred to.

Figure 16A:
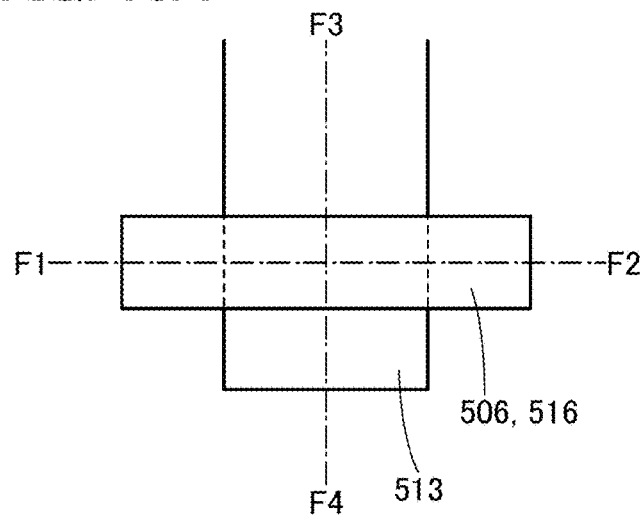
FIGS. 16A and 16B are a top view and a cross-sectional view illustrating a method for manufacturing a transistor of one embodiment of the present invention.
Figure 16B:
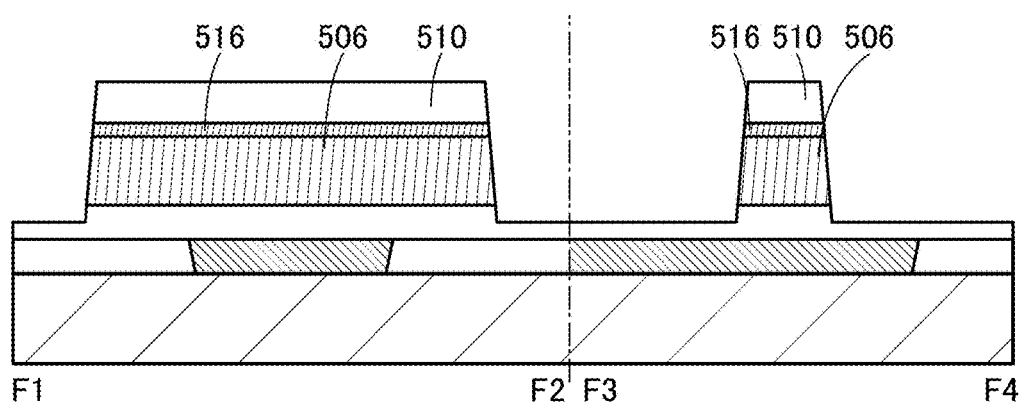

Then, a resist or the like is formed over the insulator 540 and processing is performed using the resist, whereby the insulator 510, a conductor 516, and a semiconductor 506 are formed (see FIGS. 16A and 16B). At this time, the conductor 516 and/or the semiconductor 506 may be formed in such a manner that processing is performed using the insulator 510 after the resist is removed. Furthermore, part of the insulator 502 over which the semiconductor 506 is not provided may be etched. Thus, the insulator 502 has a projection.

At this time, any of the processing methods illustrated in FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D may be used. For example, in each of FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D, the layer 116 and the layer 110 may be replaced with the conductor 516 and the insulator 510, respectively.

Figure 17A:
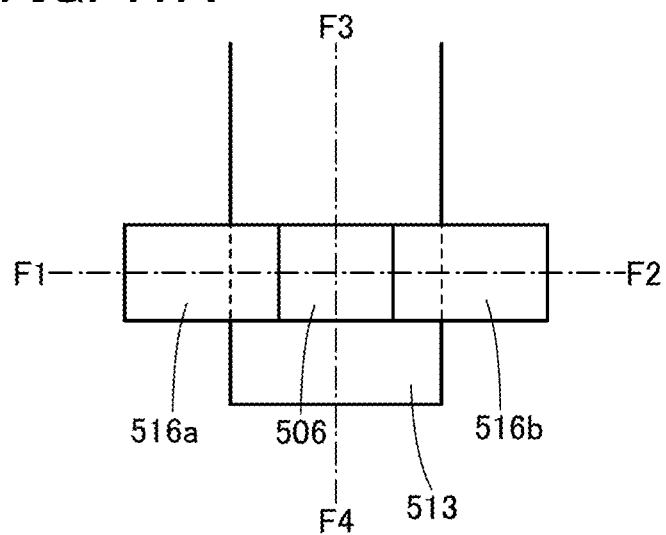
FIGS. 17A and 17B are a top view and a cross-sectional view illustrating a method for manufacturing a transistor of one embodiment of the present invention.
Figure 17B:
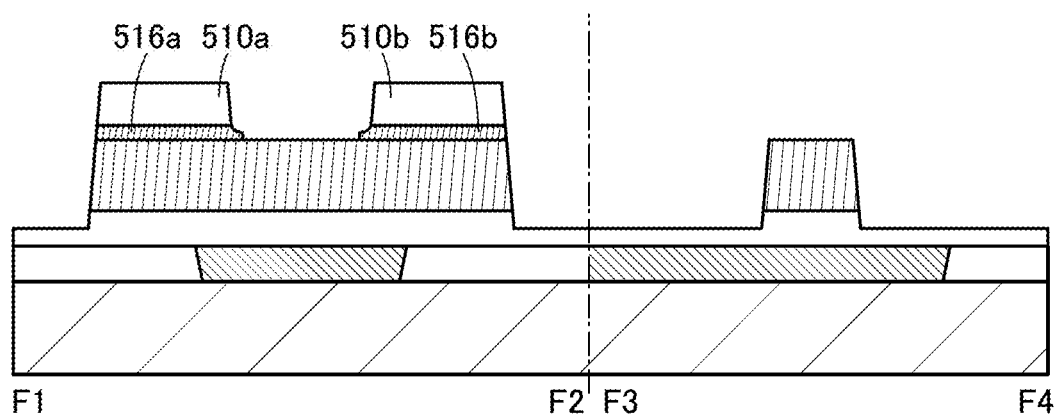

Next, a resist or the like is formed over the insulator 510 and processing is performed using the resist, whereby insulators 510a and 510b and conductors 516a and 516b are formed (see FIGS. 17A and 17B). Here, the case where the insulator 510 and the conductor 516 are processed using a method similar to the processing method in FIGS. 4A to 4E is illustrated. Note that the conductors 516a and 516b and the insulators 510a and 510b may be processed to have any of the shapes in FIGS. 11A and 11B, FIGS. 51A to 51C, FIGS. 52A to 52C, FIGS. 53A to 53C, and the like.

Next, an insulator is formed. The insulator can be formed by a sputtering method, a CVD method, an MBE method, a PLD method, an ALD method, or the like.

Next, a conductor is formed. The conductor can be formed by a sputtering method, a CVD method, an MBE method, a PLD method, an ALD method, or the like.

Then, a resist or the like is formed over the conductor and processing is performed using the resist, whereby a conductor 504 is formed. In addition, the insulator is processed using the resist or the conductor 504, whereby an insulator 512 is formed (see FIGS. 18A and 18B). Here, the processing is performed so that the insulator 512 and the conductor 504 have the same shape when seen from the above; however, the shapes are not limited thereto. For example, the insulator 512 and the conductor 504 may be processed using different resists. For example, after the insulator 512 is formed, the conductor to be the conductor 404 may be formed; or after the conductor 504 is formed, a resist or the like may be formed over the insulator to be the insulator 512.

At this time, any of the processing methods illustrated in FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D may be used. For example, in each of FIGS. 1A to 1E, FIGS. 2A to 2E, FIGS. 3A to 3D, FIGS. 4A to 4E, FIGS. 5A to 5E, FIGS. 6A to 6E, and FIGS. 7A to 7D, the layer 116 and the layer 110 may be replaced with the insulator to be the insulator 512 and the conductor to be the conductor 504, respectively.

For the insulator 512, the description of the insulator 412 is referred to. For the conductor 504, the description of the conductor 404 is referred to.

Next, an insulator may be formed. The insulator can be formed by a sputtering method, a CVD method, an MBE method, a PLD method, an ALD method, or the like.

The insulator may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. The insulator may be formed to have a single-layer structure or a stacked-layer structure including an insulator containing, for example, aluminum oxide, silicon nitride oxide, silicon nitride, gallium oxide, yttrium oxide, zirconium oxide, lanthanum oxide, neodymium oxide, hafnium oxide, or tantalum oxide.

The insulator preferably has a function of a barrier layer. The insulator has, for example, a function of blocking oxygen and/or hydrogen. For example, the insulator preferably has a higher capability of blocking oxygen and/or hydrogen than any of the insulator 502 and the insulator 512.

Through the above process, the transistor of one embodiment of the present invention can be manufactured.

Figure 18A:
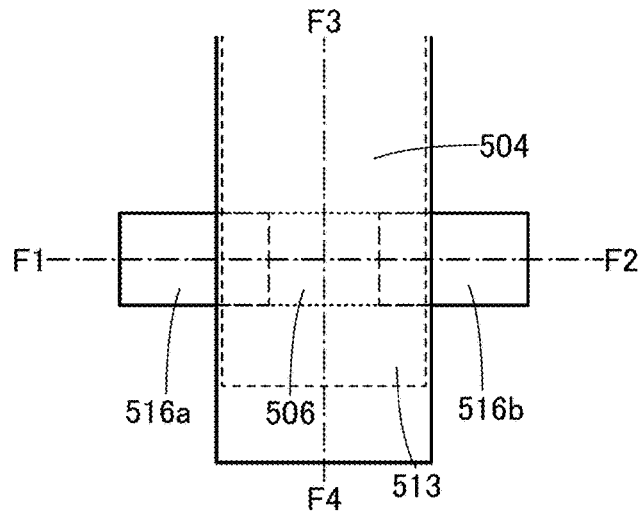
FIGS. 18A and 18B are a top view and cross-sectional views illustrating a method for manufacturing a transistor of one embodiment of the present invention.
Figure 18B:
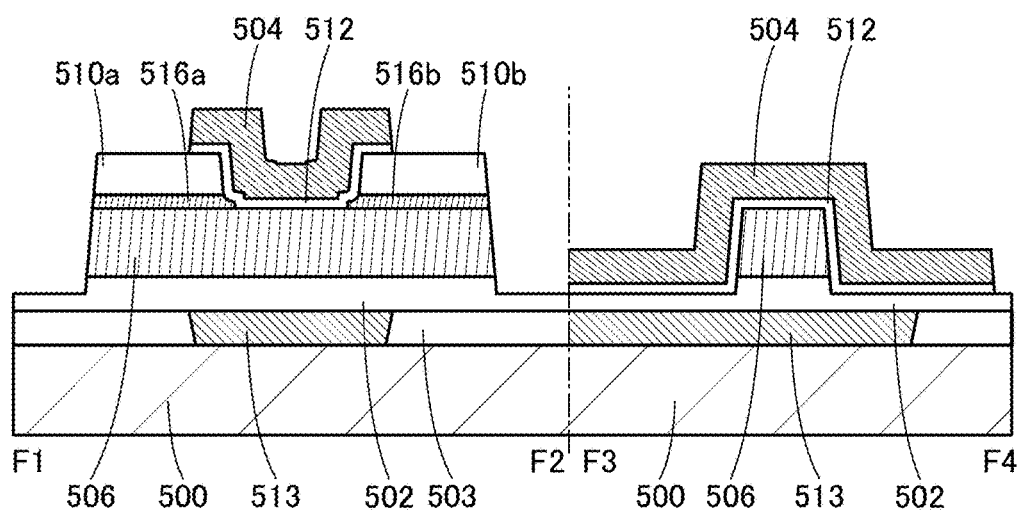

In the transistor illustrated in FIG. 18B, the insulator 510a is provided between the conductor 516a and the conductor 504, and the insulator 510b is provided between the conductor 516b and the conductor 504. Thus, parasitic capacitance due to the conductor 516a, the conductor 516b, or the like is small. Therefore, a semiconductor device using the transistor illustrated in FIG. 18B has high frequency characteristics. When the length of part of the conductor 516a which protrudes beyond the insulator 510a is greater than or equal to 70% and less than or equal to 130%, preferably greater than or equal to 80% and less than or equal to 120%, further preferably greater than or equal to 90% and less than or equal to 110% of the thickness of the insulator 512, parasitic capacitance and on-state resistance can be reduced. The same applies to the conductor 516b.

As illustrated in FIG. 18B, the transistor has an s-channel structure. The electric field from the conductor 504 is less likely to be inhibited by the conductor 516a, the conductor 516b, and the like at the side surface of the semiconductor 506.

Figure 19A:
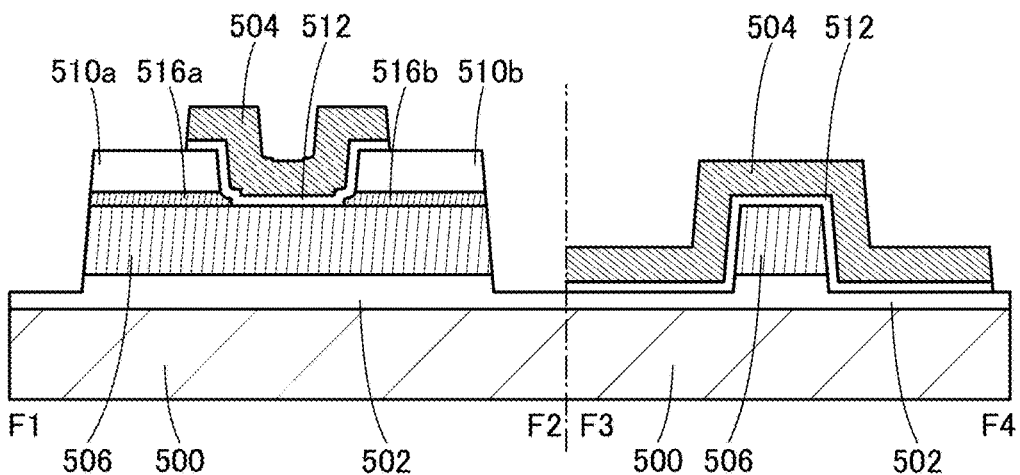
FIGS. 19A to 19C are cross-sectional views illustrating a method for manufacturing a transistor of one embodiment of the present invention.
Figure 19B:
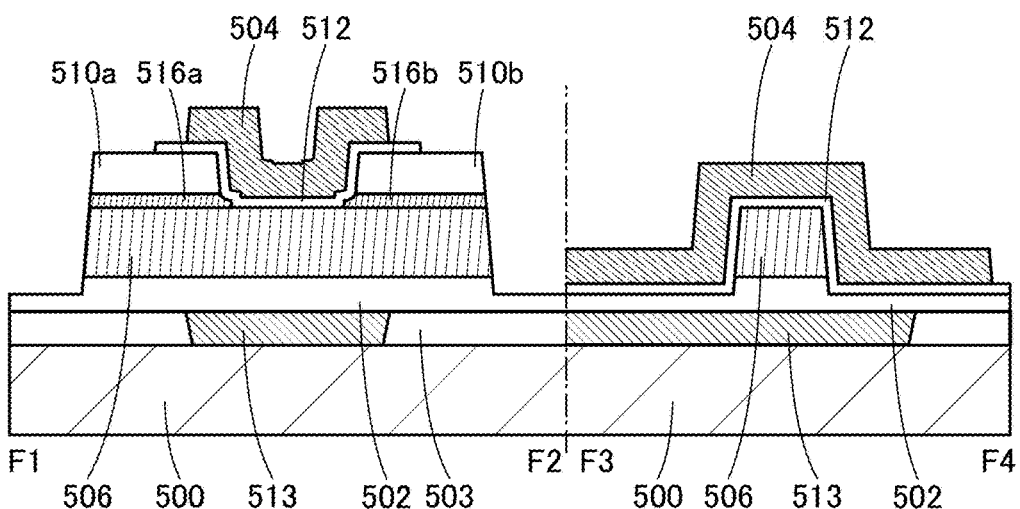
Figure 19C:
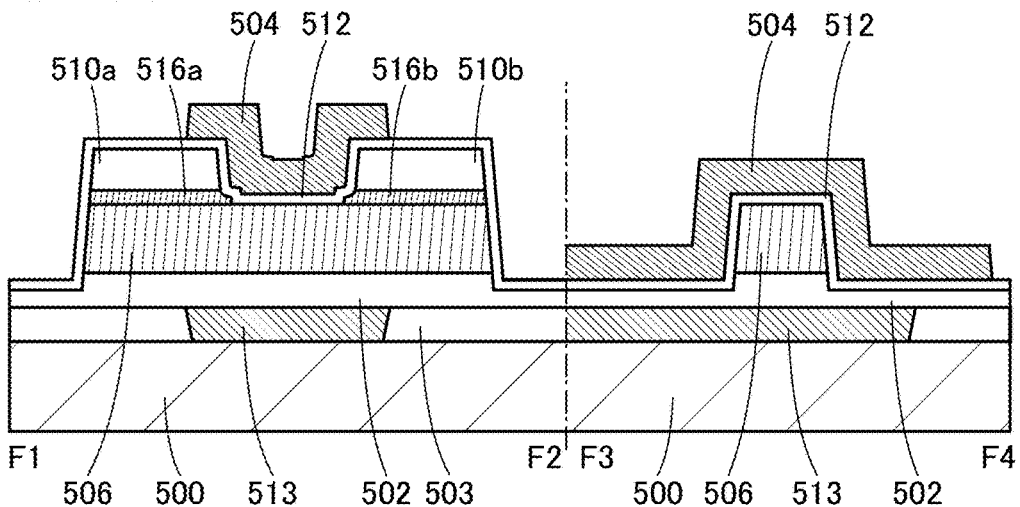

Note that the conductor 513 is not necessarily formed (see FIG. 19A). In addition, the insulator 512 may protrude from the conductor 504 (see FIG. 19B). Furthermore, the insulator to be the insulator 512 is not necessarily processed (see FIG. 19C).

<Circuit>

An example of a circuit of a semiconductor device including a transistor or the like of one embodiment of the present invention is described below.

<CMOS Inverter>

Figure 20A:
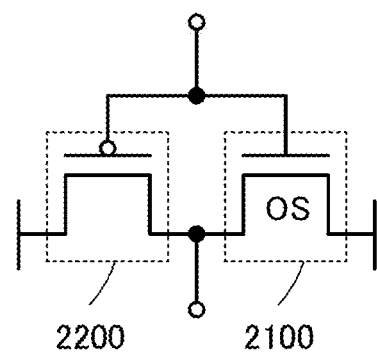
FIGS. 20A and 20B are circuit diagrams illustrating a semiconductor device of one embodiment of the present invention.

A circuit diagram in FIG. 20A shows a configuration of a so-called CMOS inverter in which a p-channel transistor 2200 and an n-channel transistor 2100 are connected to each other in series and in which gates of them are connected to each other.

<Structure 1 of Semiconductor Device>

Figure 21:
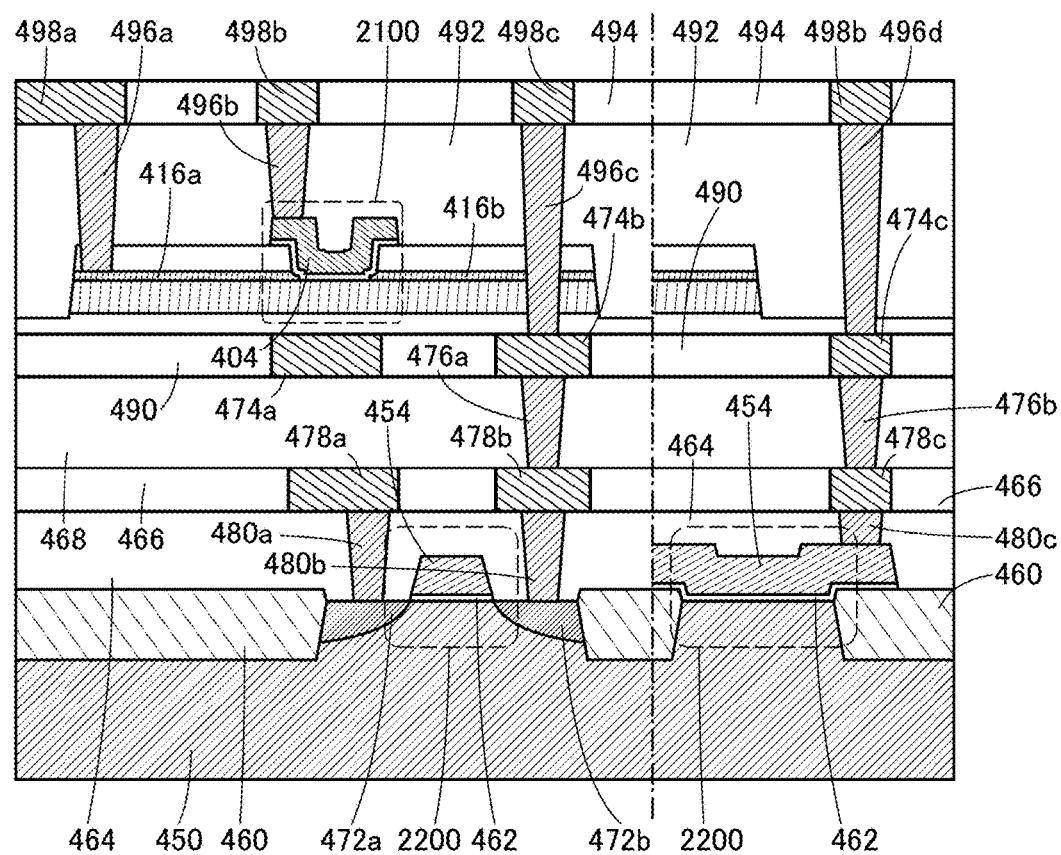
FIG. 21 is a cross-sectional view illustrating a semiconductor device of one embodiment of the present invention.

FIG. 21 is a cross-sectional view of the semiconductor device of FIG. 20A. The semiconductor device shown in FIG. 21 includes the transistor 2200 and the transistor 2100. The transistor 2100 is placed above the transistor 2200. Although an example where the transistor shown in FIGS. 18A and 18B is used as the transistor 2100 is shown, a semiconductor device of one embodiment of the present invention is not limited thereto. For example, any of the transistors illustrated in FIGS. 11A and 11B, FIGS. 12A to 12C, FIGS. 19A to 19C, FIGS. 51A to 51C, FIGS. 52A to 52C, and FIGS. 53A to 53C can be used as the transistor 2100. Therefore, the description regarding the above-mentioned transistors is referred to for the transistor 2100 as appropriate.

The transistor 2200 shown in FIG. 21 is a transistor using a semiconductor substrate 450. The transistor 2200 includes a region 472a in the semiconductor substrate 450, a region 472b in the semiconductor substrate 450, an insulator 462, and a conductor 454.

In the transistor 2200, the regions 472a and 472b have functions of a source region and a drain region. The insulator 462 has a function of a gate insulator. The conductor 454 has a function of a gate electrode. Thus, the resistance of a channel formation region can be controlled by a potential applied to the conductor 454. In other words, conduction or non-conduction between the region 472a and the region 472b can be controlled by the potential applied to the conductor 454.

For the semiconductor substrate 450, a single-material semiconductor substrate of silicon, germanium, or the like or a compound semiconductor substrate of silicon carbide, silicon germanium, gallium arsenide, indium phosphide, zinc oxide, gallium oxide, or the like may be used, for example. A single crystal silicon substrate is preferably used as the semiconductor substrate 450.

For the semiconductor substrate 450, a semiconductor substrate including impurities imparting n-type conductivity is used. However, a semiconductor substrate including impurities imparting p-type conductivity may be used as the semiconductor substrate 450. In that case, a well including impurities imparting the n-type conductivity may be provided in a region where the transistor 2200 is formed. Alternatively, the semiconductor substrate 450 may be an i-type semiconductor substrate.

A top surface of the semiconductor substrate 450 preferably has a (110) plane. Thus, on-state characteristics of the transistor 2200 can be improved.

The regions 472a and 472b are regions including impurities imparting the p-type conductivity. Accordingly, the transistor 2200 has a structure of a p-channel transistor.

Note that the transistor 2200 is apart from an adjacent transistor by a region 460 and the like. The region 460 is an insulating region.

The semiconductor device shown in FIG. 21 includes an insulator 464, an insulator 466, an insulator 468, a conductor 480a, a conductor 480b, a conductor 480c, a conductor 478a, a conductor 478b, a conductor 478c, a conductor 476a, a conductor 476b, a conductor 474a, a conductor 474b, a conductor 474c, a conductor 496a, a conductor 496b, a conductor 496c, a conductor 496d, a conductor 498a, a conductor 498b, a conductor 498c, an insulator 490, an insulator 492, and an insulator 494.

The insulator 464 is placed over the transistor 2200. The insulator 466 is placed over the insulator 464. The insulator 468 is placed over the insulator 466. The insulator 490 is placed over the insulator 468. The transistor 2100 is placed over the insulator 490. The insulator 492 is placed over the transistor 2100. The insulator 494 is placed over the insulator 492.

The insulator 464 includes an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 490 includes an opening overlapping a channel formation region of the transistor 2100, an opening reaching the conductor 476a, and an opening reaching the conductor 476b. In the openings, the conductor 474a, the conductor 474b, and the conductor 474c are embedded.

The conductor 474a may have a function of a gate electrode of the transistor 2100. The electrical characteristics of the transistor 2100, such as the threshold voltage, may be controlled by application of a predetermined potential to the conductor 474a, for example. The conductor 474a may be electrically connected to the conductor 404 having a function of the gate electrode of the transistor 2100, for example. In that case, on-state current of the transistor 2100 can be increased. Furthermore, a punch-through phenomenon can be suppressed; thus, the electrical characteristics of the transistor 2100 in a saturation region can be stable.

The insulator 492 includes an opening reaching the conductor 474b through the conductor 416b that is one of a source electrode and a drain electrode of the transistor 2100, an opening reaching the conductor 416a that is the other of the source electrode and the drain electrode of the transistor 2100, an opening reaching the conductor 404 that is the gate electrode of the transistor 2100, and an opening reaching the conductor 474c. In the openings, the conductor 496a, the conductor 496b, the conductor 496c, and the conductor 496d are embedded. Note that in some cases, the openings are provided through any of components of the transistor 2100 or the like.

The insulator 494 includes an opening reaching the conductor 496a, an opening reaching the conductor 496b and the conductor 496d, and an opening reaching the conductor 496c. In the openings, the conductor 498a, the conductor 498b, and the conductor 498c are embedded.

The insulators 464, 466, 468, 490, 492, and 494 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

The insulator 401 may be formed using, for example, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide.

The insulator that has a function of blocking oxygen and impurities such as hydrogen is preferably included in at least one of the insulators 464, 466, 468, 490, 492, and 494. When an insulator that has a function of blocking oxygen and impurities such as hydrogen is placed near the transistor 2100, the electrical characteristics of the transistor 2100 can be stable.

An insulator with a function of blocking oxygen and impurities such as hydrogen may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Each of the conductor 480a, the conductor 480b, the conductor 480c, the conductor 478a, the conductor 478b, the conductor 478c, the conductor 476a, the conductor 476b, the conductor 474a, the conductor 474b, the conductor 474c, the conductor 496a, the conductor 496b, the conductor 496c, the conductor 496d, the conductor 498a, the conductor 498b, and the conductor 498c may be formed to have, for example, a single-layer structure or a stacked-layer structure including a conductor containing one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

Figure 22:
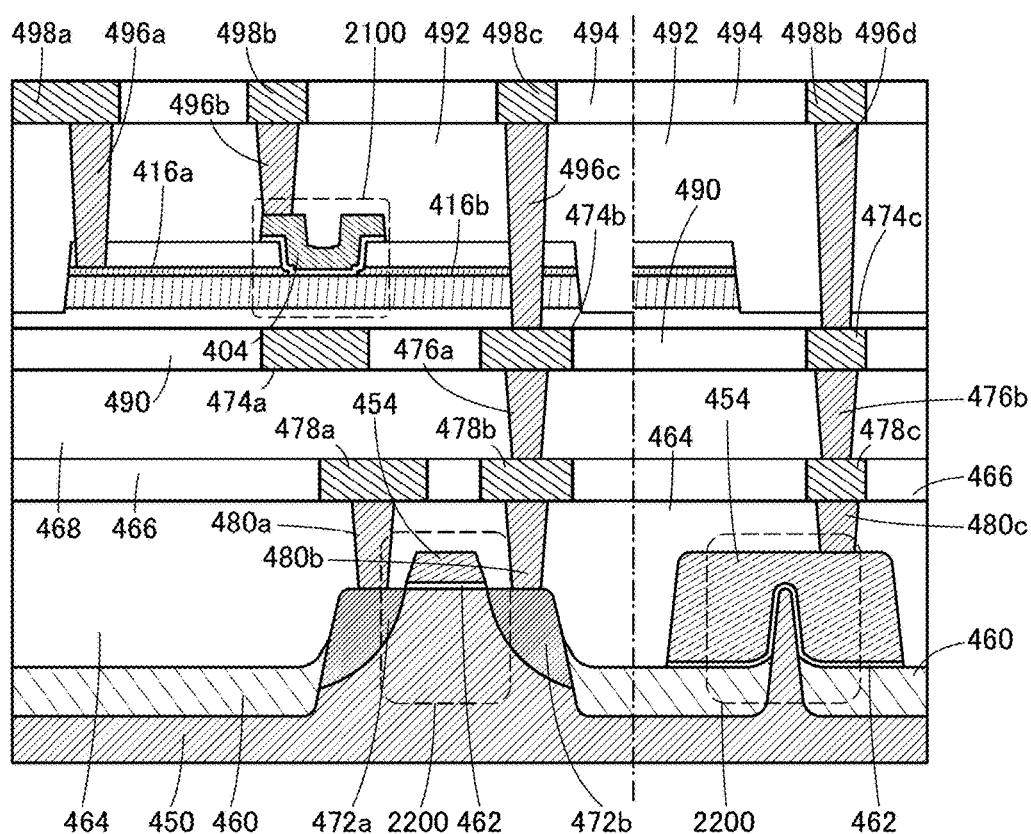
FIG. 22 is a cross-sectional view illustrating a semiconductor device of one embodiment of the present invention.

Note that a semiconductor device in FIG. 22 is the same as the semiconductor device in FIG. 21 except the structure of the transistor 2200. Therefore, the description of the semiconductor device in FIG. 21 is referred to for the semiconductor device in FIG. 22. In the semiconductor device in FIG. 22, the transistor 2200 is a FIN-type transistor. The effective channel width is increased in the FIN-type transistor 2200, whereby the on-state characteristics of the transistor 2200 can be improved. In addition, since contribution of the electric field of the gate electrode can be increased, the off-state characteristics of the transistor 2200 can be improved.

Figure 23:
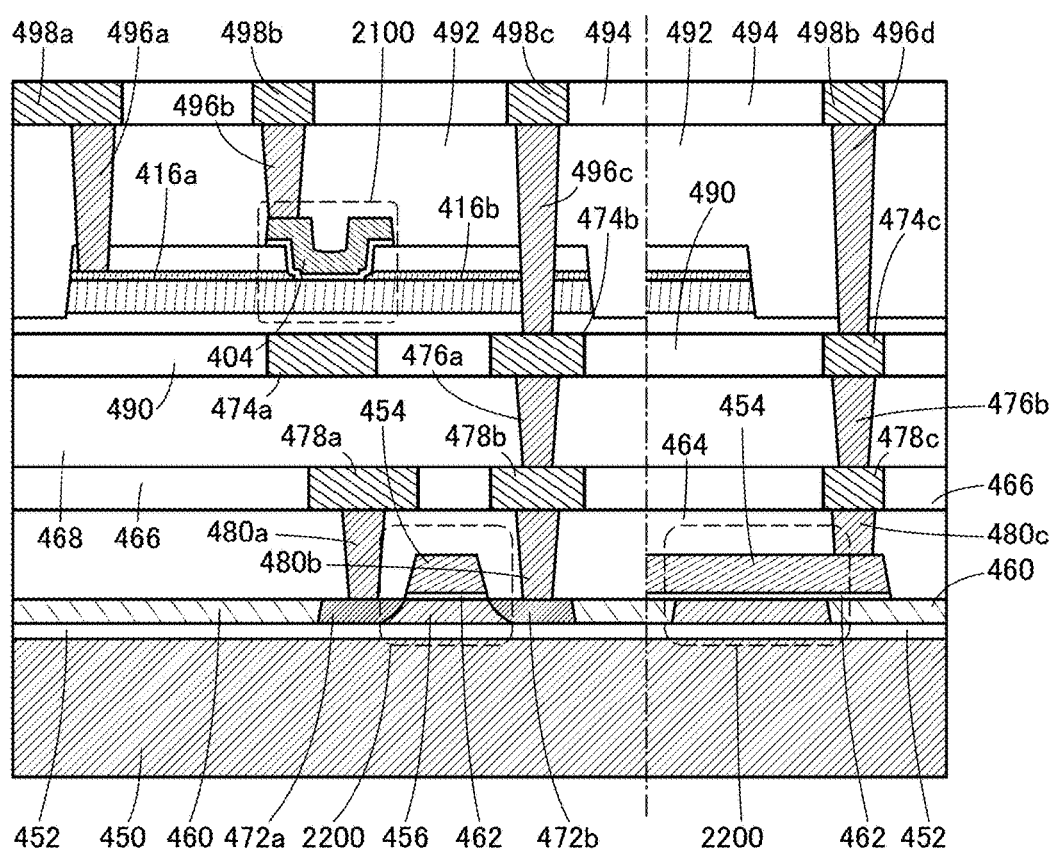
FIG. 23 is a cross-sectional view illustrating a semiconductor device of one embodiment of the present invention.

Note that a semiconductor device in FIG. 23 is the same as the semiconductor device in FIG. 21 except the structure of the transistor 2200. Therefore, the description of the semiconductor device in FIG. 21 is referred to for the semiconductor device in FIG. 23. Specifically, in the semiconductor device in FIG. 23, the transistor 2200 is formed using an SOI substrate. In the structure in FIG. 23, a region 456 is apart from the semiconductor substrate 450 with an insulator 452 provided therebetween. Since the SOI substrate is used, a punch-through phenomenon and the like can be suppressed; thus, the off-state characteristics of the transistor 2200 can be improved. Note that the insulator 452 can be formed by turning part of the semiconductor substrate 450 into an insulator. For example, silicon oxide can be used as the insulator 452.

In each of the semiconductor devices shown in FIG. 21, FIG. 22, and FIG. 23, a p-channel transistor is formed utilizing a semiconductor substrate, and an n-channel transistor is formed above that; therefore, an occupation area of the element can be reduced. That is, the integration degree of the semiconductor device can be improved. In addition, the manufacturing process can be simplified compared to the case where an n-channel transistor and a p-channel transistor are formed utilizing the same semiconductor substrate; therefore, the productivity of the semiconductor device can be increased. Moreover, the yield of the semiconductor device can be improved. For the p-channel transistor, some complicated steps such as formation of lightly doped drain (LDD) regions, formation of a shallow trench structure, or distortion design can be omitted in some cases. Therefore, the productivity and yield of the semiconductor device can be increased in some cases, compared to a semiconductor device where an n-channel transistor is formed utilizing the semiconductor substrate.

<CMOS Analog Switch>

Figure 20B:
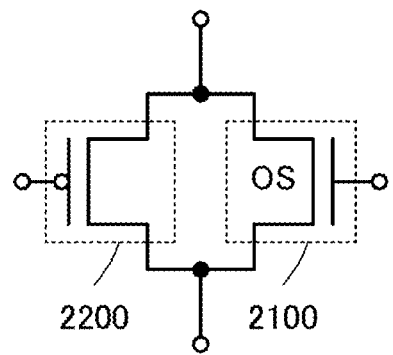

A circuit diagram in FIG. 20B shows a configuration in which sources of the transistors 2100 and 2200 are connected to each other and drains of the transistors 2100 and 2200 are connected to each other. With such a configuration, the transistors can function as a so-called CMOS analog switch.

<Memory Device 1>

Figure 24A:
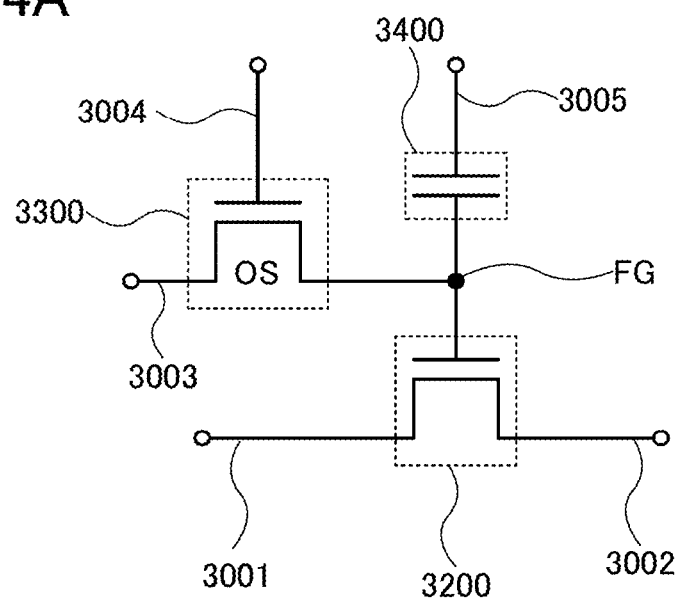
FIGS. 24A and 24B are circuit diagrams illustrating a memory device of one embodiment of the present invention.
Figure 24B:
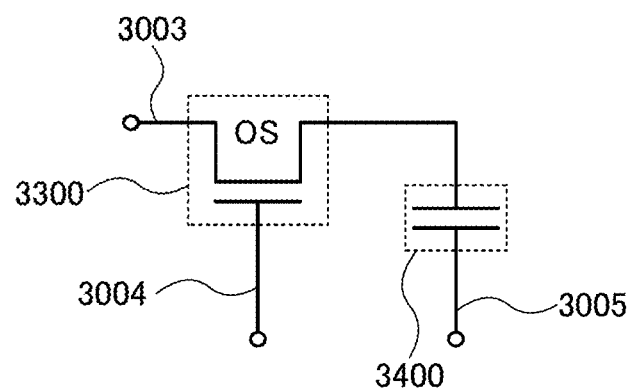

An example of a semiconductor device (memory device) which includes the transistor of one embodiment of the present invention, which can retain stored data even when not powered, and which has an unlimited number of write cycles is shown in FIGS. 24A and 24B.

The semiconductor device illustrated in FIG. 24A includes a transistor 3200 using a first semiconductor, a transistor 3300 using a second semiconductor, and a capacitor 3400. Note that any of the above-described transistors can be used as the transistor 3300.

Note that the transistor 3300 is preferably a transistor with a low off-state current. For example, a transistor using an oxide semiconductor can be used as the transistor 3300. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 24A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 24A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is off, so that the transistor 3300 is turned off. Thus, the charge is held at the node FG (retaining).

Since the off-state current of the transistor 3300 is low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to make the transistor 3200 be in "on state." Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is brought into "on state." In the case where the low-level charge is supplied to the node FG in writing, even when the potential of the fifth wiring 3005 is $V_0$ ($<V_{th\_L}$), the transistor 3200 still remains in "off state." Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is in "off state" regardless of the charge supplied to the node FG, that is, a potential lower than $V_{th\_H}$. Alternatively, the fifth wiring 3005 may be supplied with a potential at which the transistor 3200 is brought into "on state" regardless of the charge supplied to the node FG, that is, a potential higher than $V_{th\_L}$.

<Structure 2 of Semiconductor Device>

Figure 25:
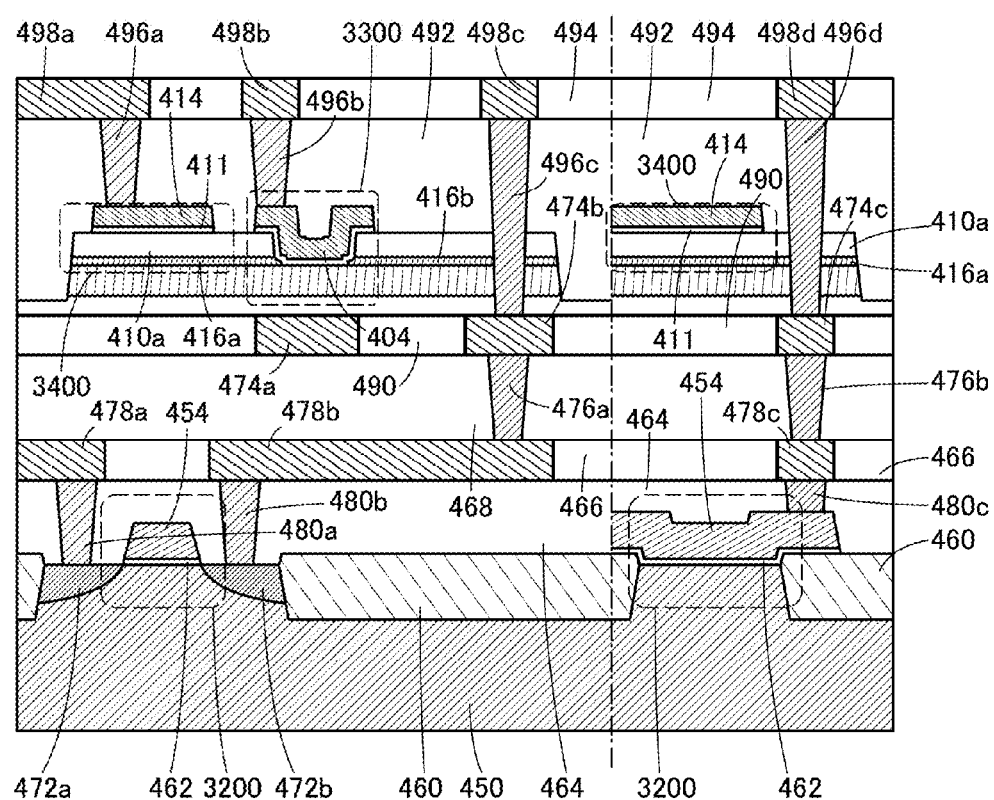
FIG. 25 is a cross-sectional view illustrating a semiconductor device of one embodiment of the present invention.

FIG. 25 is a cross-sectional view of the semiconductor device of FIG. 24A. The semiconductor device shown in FIG. 25 includes the transistor 3200, the transistor 3300, and the capacitor 3400. The transistor 3300 and the capacitor 3400 are placed above the transistor 3200. Note that for the transistor 3300, the description of the above transistor 2100 is referred to. Furthermore, for the transistor 3200, the description of the transistor 2200 in FIG. 21 is referred to. Note that although the transistor 2200 is illustrated as a p-channel transistor in FIG. 21, the transistor 3200 may be an n-channel transistor.

The transistor 3200 illustrated in FIG. 25 is a transistor using a semiconductor substrate 450. The transistor 3200 includes a region 472a in the semiconductor substrate 450, a region 472b in the semiconductor substrate 450, an insulator 462, and a conductor 454.

The semiconductor device illustrated in FIG. 25 includes insulators 464, 466, and 468, conductors 480a, 480b, 480c, 478a, 478b, 478c, 476a, 476b, 474a, 474b, 474c, 496a, 496b, 496c, 496d, 498a, 498b, 498c, and 498d, and insulators 490, 492, and 494.

The insulator 464 is provided over the transistor 3200. The insulator 466 is provided over the insulator 464. The insulator 468 is provided over the insulator 466. The insulator 490 is provided over the insulator 468. The transistor 3300 is provided over the insulator 490. The insulator 492 is provided over the transistor 3300. The insulator 494 is provided over the insulator 492.

The insulator 464 has an opening reaching the region 472a, an opening reaching the region 472b, and an opening reaching the conductor 454. In the openings, the conductor 480a, the conductor 480b, and the conductor 480c are embedded.

The insulator 466 includes an opening reaching the conductor 480a, an opening reaching the conductor 480b, and an opening reaching the conductor 480c. In the openings, the conductor 478a, the conductor 478b, and the conductor 478c are embedded.

The insulator 468 includes an opening reaching the conductor 478b and an opening reaching the conductor 478c. In the openings, the conductor 476a and the conductor 476b are embedded.

The insulator 490 includes an opening overlapping the channel formation region of the transistor 3300, an opening reaching the conductor 476a, and an opening reaching the conductor 476b. In the openings, the conductors 474a, the conductor 474b, and the conductor 474c are embedded.

The conductor 474a may have a function as a bottom gate electrode of the transistor 3300. Alternatively, for example, electric characteristics such as the threshold voltage of the transistor 3300 may be controlled by application of a predetermined potential to the conductor 474a. Further alternatively, for example, the conductor 474a and the conductor 404 that is the top gate electrode of the transistor 3300 may be electrically connected to each other. Thus, the on-state current of the transistor 3300 can be increased. A punch-through phenomenon can be suppressed; thus, stable electric characteristics in the saturation region of the transistor 3300 can be obtained.

The insulator 492 includes an opening reaching the conductor 474b through the conductor 416b that is one of a source electrode and a drain electrode of the transistor 3300, an opening reaching the conductor 414 that is the other of the source electrode and the drain electrode of the transistor 3300, an opening reaching the conductor 404 that is the gate electrode of the transistor 3300, and an opening reaching the conductor 474c through the conductor 416a that is the other of the source electrode and the drain electrode of the transistor 3300. In the openings, the conductor 496a, the conductor 496b, the conductor 496c, and the conductor 496d are embedded. Note that in some cases, a component of the transistor 3300 or the like is through other components.

The insulator 494 includes an opening reaching the conductor 496a, an opening reaching the conductors 496b, an opening reaching the conductor 496c, and an opening reaching the conductor 496d. In the openings, the conductors 498a 498b, 498c, and 498d are embedded.

At least one of the insulators 464, 466, 468, 490, 492, and 494 preferably has a function of blocking oxygen and impurities such as hydrogen. When an insulator that has a function of blocking oxygen and impurities such as hydrogen is placed near the transistor 3300, the electrical characteristics of the transistor 3300 can be stable.

The conductor 498d may be formed to have a single-layer structure or a stacked-layer structure including a conductor containing, for example, one or more kinds selected from boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound of the above element may be used, for example, and a conductor containing aluminum, a conductor containing copper and titanium, a conductor containing copper and manganese, a conductor containing indium, tin, and oxygen, a conductor containing titanium and nitrogen, or the like may be used.

The source or drain of the transistor 3200 is electrically connected to the conductor 416b that is one of a source electrode and a drain electrode of the transistor 3300 through the conductor 480b, the conductor 478b, the conductor 476a, the conductor 474b, and the conductor 496c. The conductor 454 that is the gate electrode of the transistor 3200 is electrically connected to the conductor 416a that is the other of the source electrode and the drain electrode of the transistor 3300 through the conductor 480c, the conductor 478c, the conductor 476b, the conductor 474c, and the conductor 496d.

The capacitor 3400 includes an electrode electrically connected to the other of the source electrode and the drain electrode of the transistor 3300, the conductor 414, and an insulator 411. Because the insulator 411 can be formed by the same step as a gate insulator of the transistor 3300, productivity can be increased. When a layer formed by the same step as a gate electrode of the transistor 3300 is used as the conductor 414, productivity can be increased.

For the structures of other components, the description of FIG. 21 and the like can be referred to as appropriate.

Figure 26:
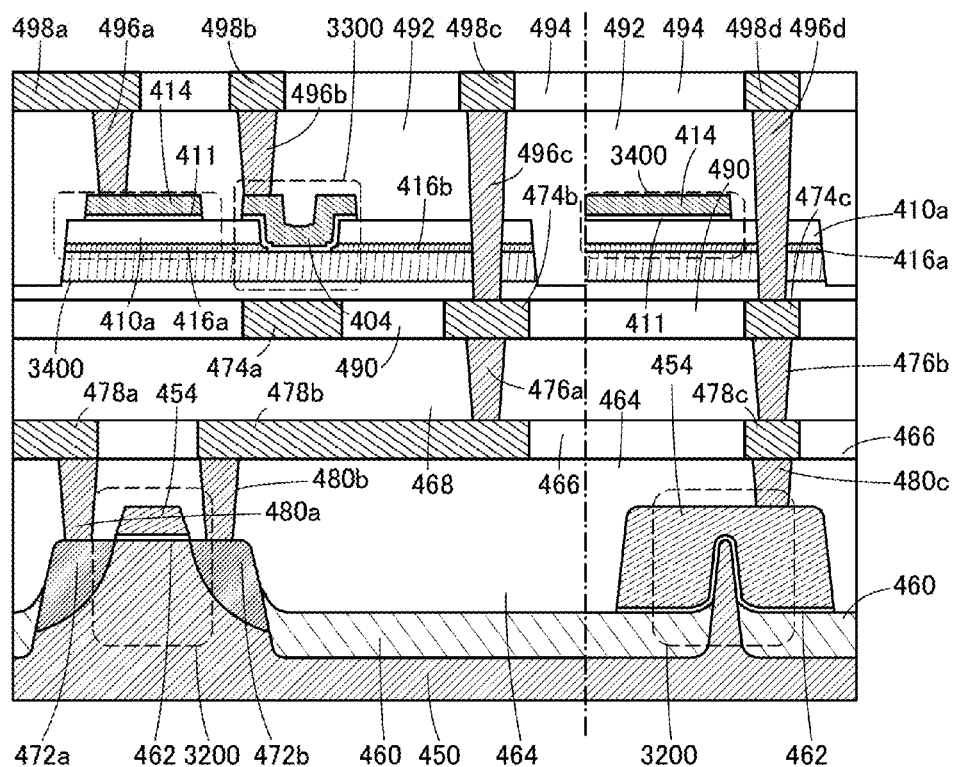
FIG. 26 is a cross-sectional view illustrating a semiconductor device of one embodiment of the present invention.

A semiconductor device in FIG. 26 is the same as the semiconductor device in FIG. 25 except the structure of the transistor 3200. Therefore, the description of the semiconductor device in FIG. 25 is referred to for the semiconductor device in FIG. 26. Specifically, in the semiconductor device in FIG. 26, the transistor 3200 is a FIN-type transistor. For the FIN-type transistor 3200, the description of the transistor 2200 in FIG. 22 is referred to. Note that although the transistor 2200 is illustrated as a p-channel transistor in FIG. 22, the transistor 3200 may be an n-channel transistor.

Figure 27:
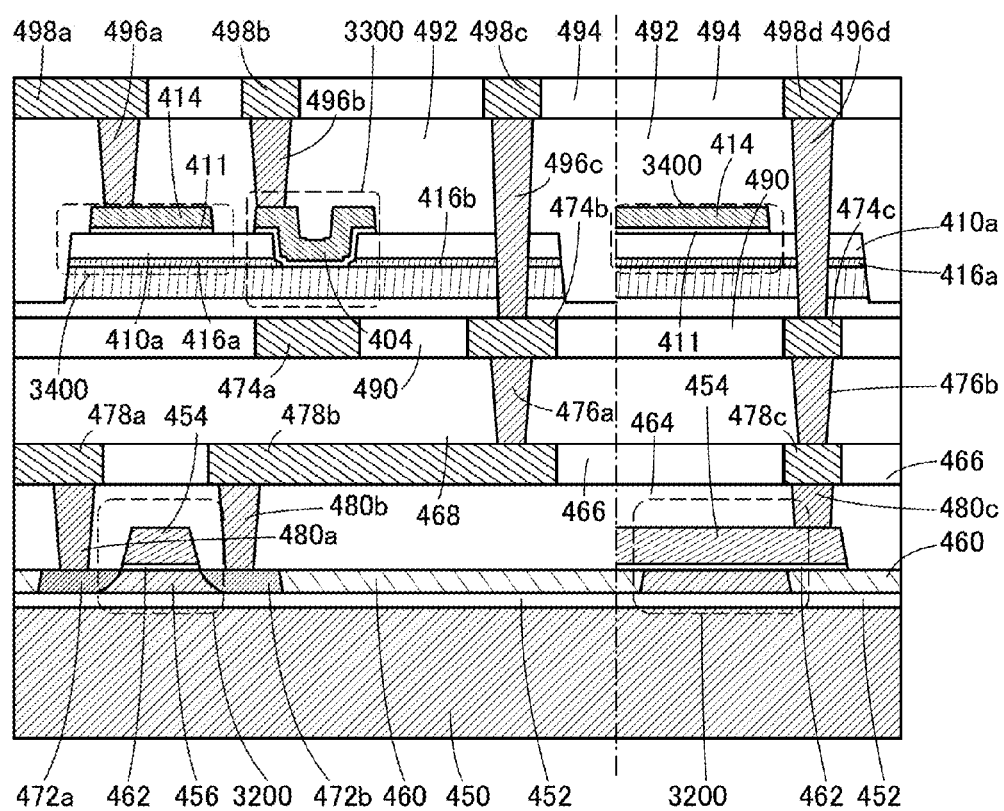
FIG. 27 is a cross-sectional view illustrating a semiconductor device of one embodiment of the present invention.

A semiconductor device in FIG. 27 is the same as the semiconductor device in FIG. 25 except a structure of the transistor 3200. Therefore, the description of the semiconductor device in FIG. 25 is referred to for the semiconductor device in FIG. 27. Specifically, in the semiconductor device in FIG. 27, the transistor 3200 is provided in the semiconductor substrate 450 that is an SOI substrate. For the transistor 3200, which is provided in the semiconductor substrate 450 that is an SOI substrate, the description of the transistor 2200 in FIG. 23 is referred to. Note that although the transistor 2200 is illustrated as a p-channel transistor in FIG. 23, the transistor 3200 may be an n-channel transistor.

<Memory Device 2>

The semiconductor device in FIG. 24B is different from the semiconductor device in FIG. 24A in that the transistor 3200 is not provided. Also in this case, data can be written and retained in a manner similar to that of the semiconductor device in FIG. 24A.

Reading of data in the semiconductor device in FIG. 24B is described. When the transistor 3300 is brought into on state, the third wiring 3003 which is in a floating state and the capacitor 3400 are brought into conduction, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having a low off-state current, the semiconductor device described above can retain stored data for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the on/off state of the transistor, whereby high-speed operation can be achieved.

<Imaging Device>

An imaging device of one embodiment of the present invention is described below.

Figure 28A:
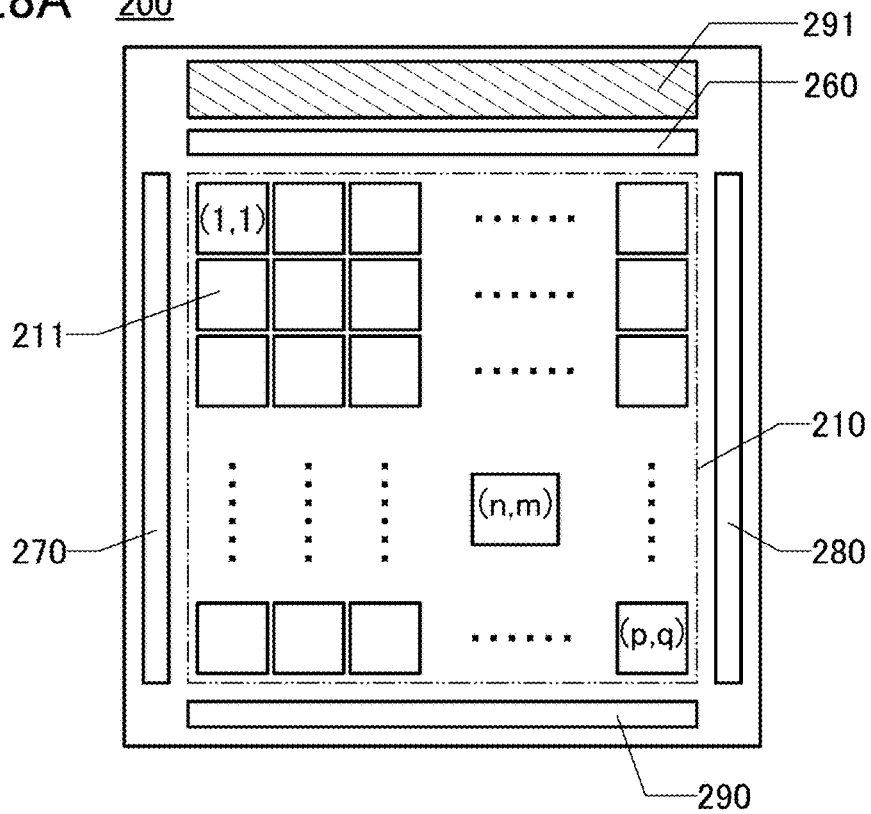
FIGS. 28A and 28B are top views each illustrating a semiconductor device of one embodiment of the present invention.

FIG. 28A is a plan view illustrating an example of an imaging device 200 of one embodiment of the present invention. The imaging device 200 includes a pixel portion 210 and peripheral circuits for driving the pixel portion 210 (a peripheral circuit 260, a peripheral circuit 270, a peripheral circuit 280, and a peripheral circuit 290). The pixel portion 210 includes a plurality of pixels 211 arranged in a matrix with p rows and q columns (p and q are each a natural number greater than or equal to 2). The peripheral circuit 260, the peripheral circuit 270, the peripheral circuit 280, and the peripheral circuit 290 are each connected to a plurality of pixels 211, and a signal for driving the plurality of pixels 211 is supplied. In this specification and the like, in some cases, "a peripheral circuit" or "a driver circuit" indicate all of the peripheral circuits 260, 270, 280, and 290. For example, the peripheral circuit 260 can be regarded as part of the peripheral circuit.

The imaging device 200 preferably includes a light source 291. The light source 291 can emit detection light P1.

The peripheral circuit includes at least one of a logic circuit, a switch, a buffer, an amplifier circuit, and a converter circuit. The peripheral circuit may be provided over a substrate where the pixel portion 210 is formed. Part or the whole of the peripheral circuit may be mounted using a semiconductor device such as an IC. Note that as the peripheral circuit, one or more of the peripheral circuits 260, 270, 280, and 290 may be omitted.

Figure 28B:
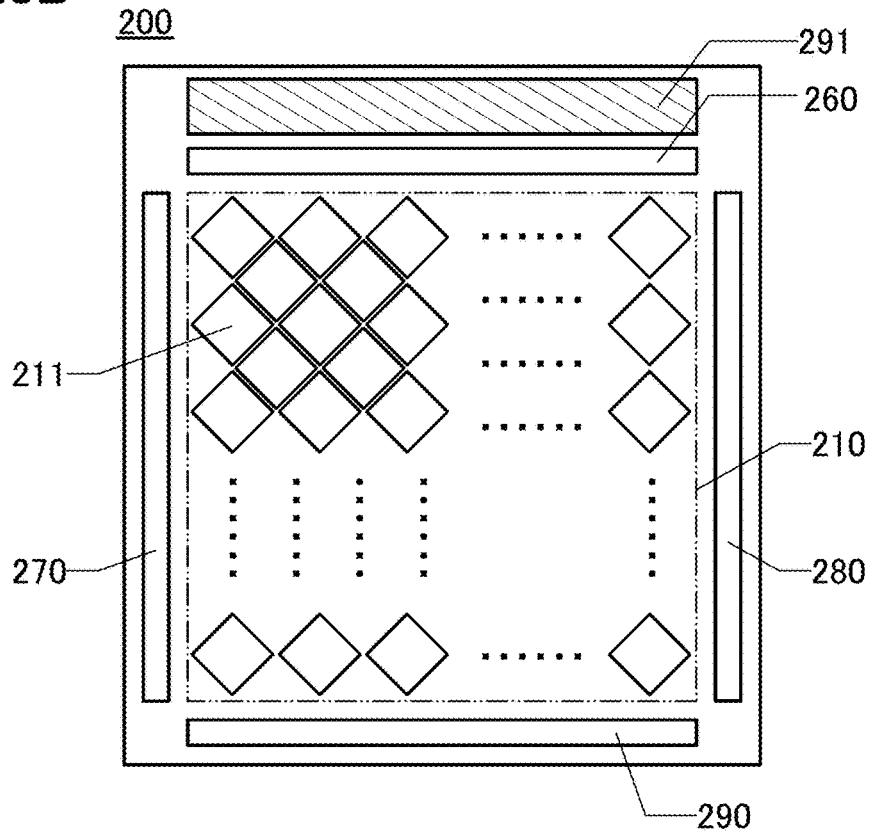

As illustrated in FIG. 28B, the pixels 211 may be provided to be inclined in the pixel portion 210 included in the imaging device 200. When the pixels 211 are obliquely arranged, the distance between pixels (pitch) can be shortened in the row direction and the column direction. Accordingly, the quality of an image taken with the imaging device 200 can be improved.

<Configuration Example 1 of Pixel>

The pixel 211 included in the imaging device 200 is formed with a plurality of subpixels 212, and each subpixel 212 is combined with a filter which transmits light with a specific wavelength band (color filter), whereby data for achieving color image display can be obtained.

Figure 29A:
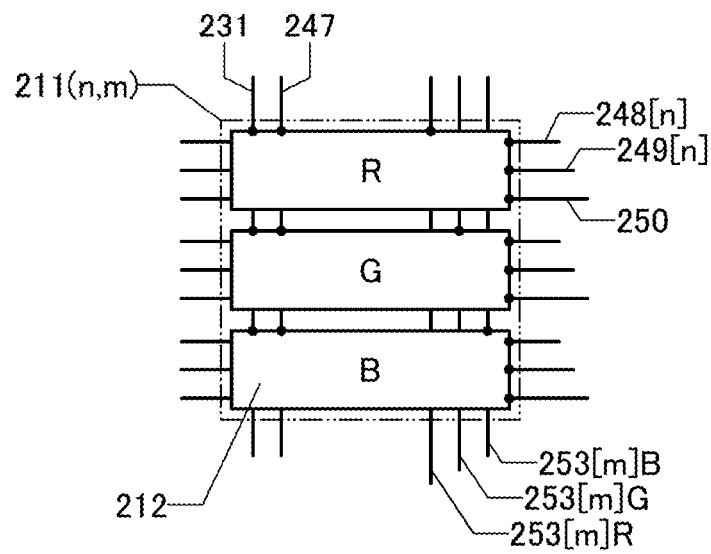
FIGS. 29A and 29B are block diagrams illustrating a semiconductor device of one embodiment of the present invention.

FIG. 29A is a plan view showing an example of the pixel 211 with which a color image is obtained. The pixel 211 illustrated in FIG. 29A includes a subpixel 212 provided with a color filter transmitting light with a red (R) wavelength band (also referred to as a subpixel 212R), a subpixel 212 provided with a color filter transmitting light with a green (G) wavelength band (also referred to as a subpixel 212G), and a subpixel 212 provided with a color filter transmitting light with a blue (B) wavelength band (also referred to as a subpixel 212B). The subpixel 212 can function as a photosensor.

The subpixel 212 (the subpixel 212R, the subpixel 212G, and the subpixel 212B) is electrically connected to a wiring 231, a wiring 247, a wiring 248, a wiring 249, and a wiring 250. In addition, the subpixel 212R, the subpixel 212G, and the subpixel 212B are connected to respective wirings 253 which are independent from one another. In this specification and the like, for example, the wiring 248 and the wiring 249 that are connected to the pixel 211 in the n-th row are referred to as a wiring 248[n] and a wiring 249[n]. For example, the wiring 253 connected to the pixel 211 in the m-th column is referred to as a wiring 253[m]. Note that in FIG. 29A, the wirings 253 connected to the subpixel 212R, the subpixel 212G, and the subpixel 212B in the pixel 211 in the m-th column are referred to as a wiring 253[m]R, a wiring 253[m]G, and a wiring 253 [m]B. The subpixels 212 are electrically connected to the peripheral circuit through the above wirings.

Figure 29B:
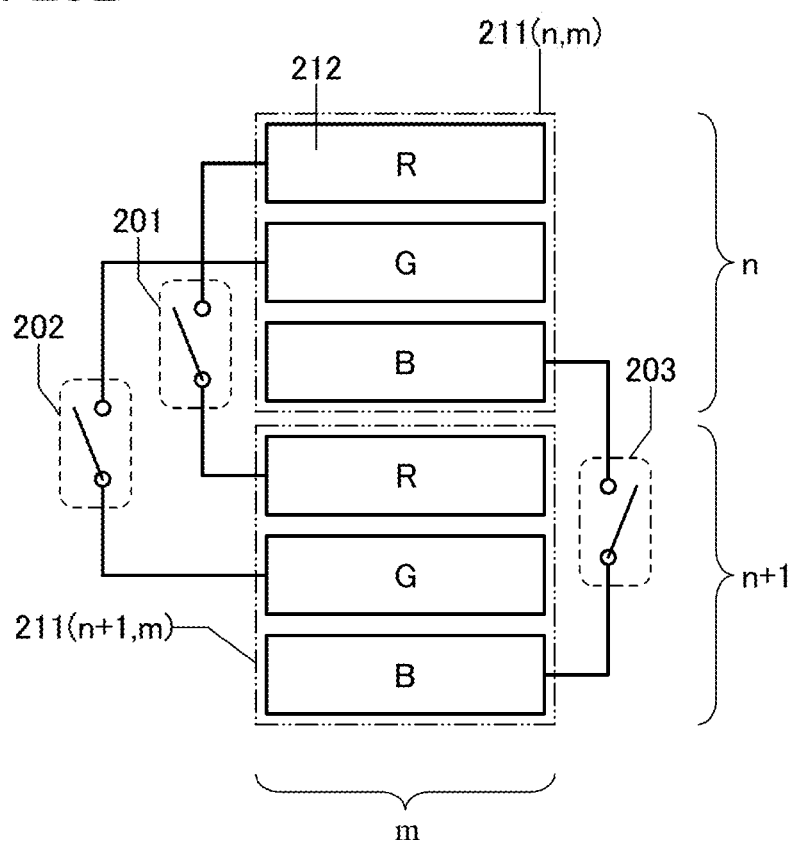

The imaging device 200 has a structure in which the subpixel 212 is electrically connected to the subpixel 212 in an adjacent pixel 211 which is provided with a color filter transmitting light with the same wavelength band as the subpixel 212, via a switch. FIG. 29B shows a connection example of the subpixels 212: the subpixel 212 in the pixel 211 arranged in an n-th (n is an integer greater than or equal to 1 and less than or equal to p) row and an m-th (m is an integer greater than or equal to 1 and less than or equal to q) column and the subpixel 212 in the adjacent pixel 211 arranged in an (n+1)-th row and the m-th column. In FIG. 29B, the subpixel 212R arranged in the n-th row and the m-th column and the subpixel 212R arranged in the (n+1)-th row and the m-th column are connected to each other via a switch 201. The subpixel 212G arranged in the n-th row and the m-th column and the subpixel 212G arranged in the (n+1)-th row and the m-th column are connected to each other via a switch 202. The subpixel 212B arranged in the n-th row and the m-th column and the subpixel 212B arranged in the (n+1)-th row and the m-th column are connected to each other via a switch 203.

The color filter used in the subpixel 212 is not limited to red (R), green (G), and blue (B) color filters, and color filters that transmit light of cyan (C), yellow (Y), and magenta (M) may be used. By provision of the subpixels 212 that sense light with three different wavelength bands in one pixel 211, a full-color image can be obtained.

The pixel 211 including the subpixel 212 provided with a color filter transmitting yellow (Y) light may be provided, in addition to the subpixels 212 provided with the color filters transmitting red (R), green (G), and blue (B) light. The pixel 211 including the subpixel 212 provided with a color filter transmitting blue (B) light may be provided, in addition to the subpixels 212 provided with the color filters transmitting cyan (C), yellow (Y), and magenta (M) light. When the subpixels 212 sensing light with four different wavelength bands are provided in one pixel 211, the reproducibility of colors of an obtained image can be increased.

For example, in FIG. 29A, in regard to the subpixel 212 sensing a red wavelength band, the subpixel 212 sensing a green wavelength band, and the subpixel 212 sensing a blue wavelength band, the pixel number ratio (or the light receiving area ratio) thereof is not necessarily 1:1:1. For example, the Bayer arrangement in which the pixel number ratio (the light receiving area ratio) is set at red:green:blue=1:2:1 may be employed. Alternatively, the pixel number ratio (the light receiving area ratio) of red and green to blue may be 1:6:1.

Although the number of subpixels 212 provided in the pixel 211 may be one, two or more subpixels are preferably provided. For example, when two or more subpixels 212 sensing the same wavelength band are provided, the redundancy is increased, and the reliability of the imaging device 200 can be increased.

When an infrared (IR) filter that transmits infrared light and absorbs or reflects visible light is used as the filter, the imaging device 200 that senses infrared light can be achieved.

Furthermore, when a neutral density (ND) filter (dark filter) is used, output saturation which occurs when a large amount of light enters a photoelectric conversion element (light-receiving element) can be prevented. With a combination of ND filters with different dimming capabilities, the dynamic range of the imaging device can be increased.

Besides the above-described filter, the pixel 211 may be provided with a lens. An arrangement example of the pixel 211, a filter 254, and a lens 255 is described with cross-sectional views in FIGS. 30A and 30B. With the lens 255, the photoelectric conversion element can receive incident light efficiently. Specifically, as illustrated in FIG. 30A, light 256 enters a photoelectric conversion element 220 through the lens 255, the filter 254 (a filter 254R, a filter 254G, and a filter 254B), a pixel circuit 230, and the like which are provided in the pixel 211.

As indicated by a region surrounded with dashed-dotted lines; however, part of the light 256 indicated by arrows might be blocked by some wirings 257. Thus, a preferable structure is that the lens 255 and the filter 254 are provided on the photoelectric conversion element 220 side, so that the photoelectric conversion element 220 can efficiently receive the light 256 as illustrated in FIG. 30B. When the light 256 enters the photoelectric conversion element 220 from the photoelectric conversion element 220 side, the imaging device 200 with high sensitivity can be provided.

Figure 30A:
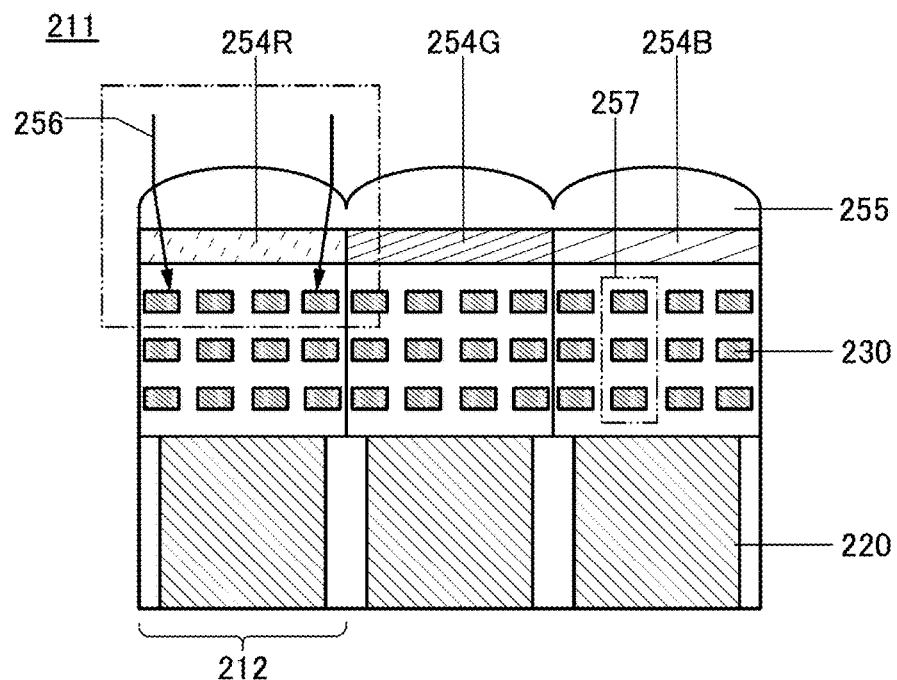
FIGS. 30A and 30B are cross-sectional views each illustrating a semiconductor device of one embodiment of the present invention.
Figure 30B:
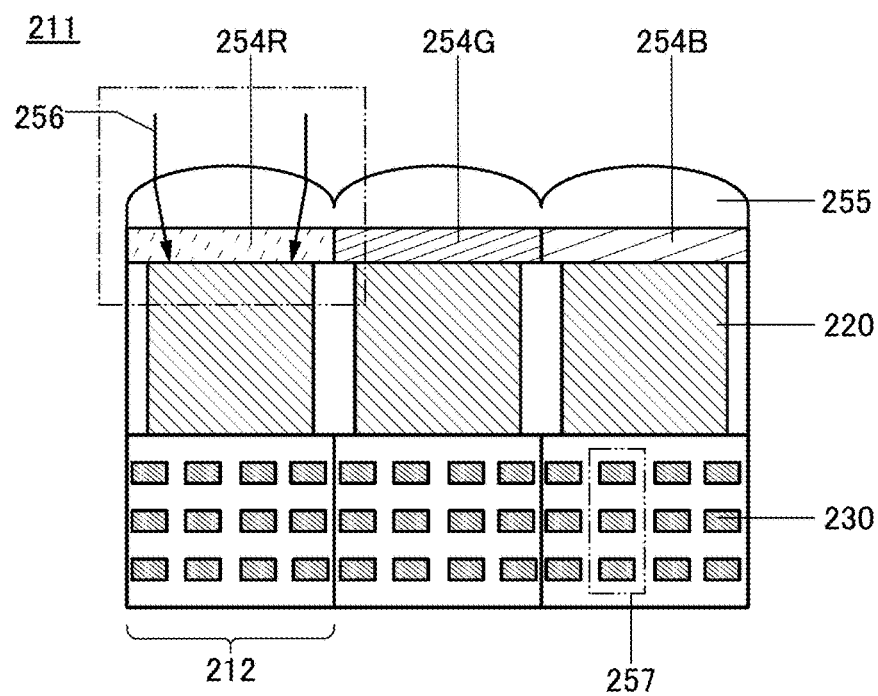

As the photoelectric conversion element 220 illustrated in FIGS. 30A and 30B, a photoelectric conversion element in which a p-n junction or a p-i-n junction is formed may be used.

The photoelectric conversion element 220 may be formed using a substance that has a function of absorbing a radiation and generating electric charges. Examples of the substance that has a function of absorbing a radiation and generating electric charges include selenium, lead iodide, mercury iodine, gallium arsenide, cadmium telluride, and cadmium zinc alloy.

For example, when selenium is used for the photoelectric conversion element 220, the photoelectric conversion element 220 can have a light absorption coefficient in a wide wavelength range, such as visible light, ultraviolet light, infrared light, X-rays, and gamma rays.

One pixel 211 included in the imaging device 200 may include the subpixel 212 with a first filter in addition to the subpixel 212 illustrated in FIGS. 29A and 29B.

<Configuration Example 2 of Pixel>

An example of a pixel including a transistor using silicon and a transistor using an oxide semiconductor is described below.

Figure 31A:
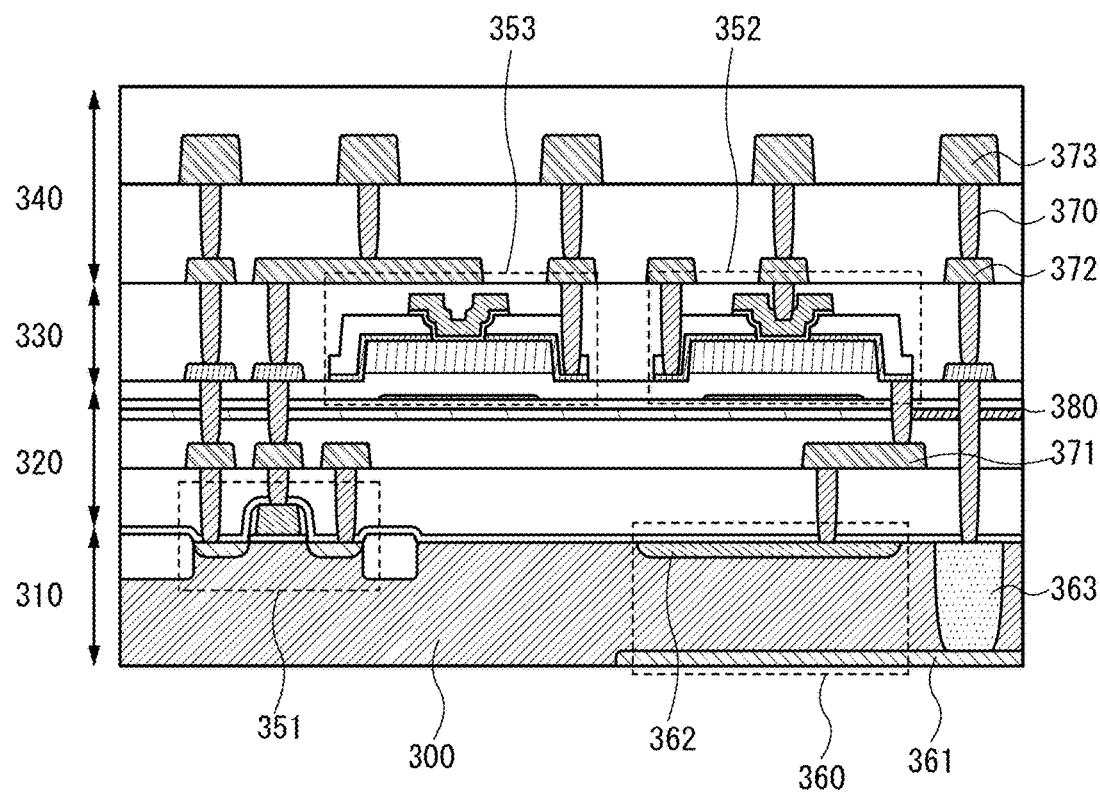
FIGS. 31A and 31B are cross-sectional views each illustrating a semiconductor device of one embodiment of the present invention.
Figure 31B:
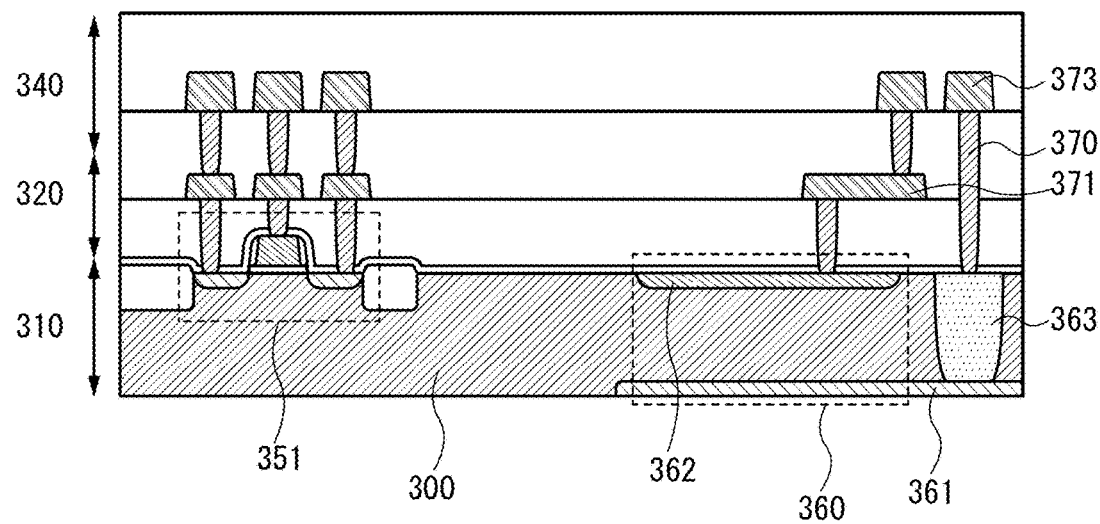

FIGS. 31A and 31B are each a cross-sectional view of an element included in an imaging device. The imaging device illustrated in FIG. 31A includes a transistor 351 including silicon over a silicon substrate 300, transistors 352 and 353 which include an oxide semiconductor and are stacked over the transistor 351, and a photodiode 360 provided in a silicon substrate 300. The transistors and the photodiode 360 are electrically connected to various plugs 370 and wirings 371. In addition, an anode 361 of the photodiode 360 is electrically connected to the plug 370 through a low-resistance region 363.

The imaging device includes a layer 310 including the transistor 351 provided on the silicon substrate 300 and the photodiode 360 provided in the silicon substrate 300, a layer 320 which is in contact with the layer 310 and includes the wirings 371, a layer 330 which is in contact with the layer 320 and includes the transistors 352 and 353, and a layer 340 which is in contact with the layer 330 and includes a wiring 372 and a wiring 373.

In the example of cross-sectional view in FIG. 31A, a light-receiving surface of the photodiode 360 is provided on the side opposite to a surface of the silicon substrate 300 where the transistor 351 is formed. With this structure, a light path can be secured without an influence of the transistors and the wirings. Thus, a pixel with a high aperture ratio can be formed. Note that the light-receiving surface of the photodiode 360 can be the same as the surface where the transistor 351 is formed.

In the case where a pixel is formed with use of transistors using an oxide semiconductor, the layer 310 may include the transistor using an oxide semiconductor. Alternatively, the layer 310 may be omitted, and the pixel may include only transistors using an oxide semiconductor.

In the case where a pixel is formed with use of transistors using silicon, the layer 330 may be omitted. An example of a cross-sectional view in which the layer 330 is not provided is shown in FIG. 31B. In the case where the layer 330 is not provided, the wiring 372 of the layer 340 can be omitted.

Note that the silicon substrate 300 may be an SOI substrate. Furthermore, the silicon substrate 300 can be replaced with a substrate made of germanium, silicon germanium, silicon carbide, gallium arsenide, aluminum gallium arsenide, indium phosphide, gallium nitride, or an organic semiconductor.

Here, an insulator 380 is provided between the layer 310 including the transistor 351 and the photodiode 360 and the layer 330 including the transistors 352 and 353. However, there is no limitation on the position of the insulator 380.

Hydrogen in an insulator provided in the vicinity of a channel formation region of the transistor 351 terminates dangling bonds of silicon; accordingly, the reliability of the transistor 351 can be improved. In contrast, hydrogen in the insulator provided in the vicinity of the transistor 352, the transistor 353, and the like becomes one of factors generating a carrier in the oxide semiconductor. Thus, the hydrogen may cause a reduction of the reliability of the transistor 352, the transistor 353, and the like. Therefore, in the case where the transistor using an oxide semiconductor is provided over the transistor using a silicon-based semiconductor, it is preferable that the insulator 380 having a function of blocking hydrogen be provided between the transistors. When the hydrogen is confined below the insulator 380, the reliability of the transistor 351 can be improved. In addition, the hydrogen can be prevented from being diffused from a part below the insulator 380 to a part above the insulator 380; thus, the reliability of the transistor 352, the transistor 353, and the like can be increased.

As the insulator 380, an insulator having a function of blocking oxygen or hydrogen is used, for example.

In the cross-sectional view in FIG. 31A, the photodiode 360 in the layer 310 and the transistor in the layer 330 can be formed so as to overlap each other. Thus, the degree of integration of pixels can be increased. In other words, the resolution of the imaging device can be increased.

As illustrated in FIG. 32A1 and FIG. 32B1, part or the whole of the imaging device can be bent. FIG. 32A1 illustrates a state in which the imaging device is bent in the direction of a dashed-dotted line X1-X2. FIG. 32A2 is a cross-sectional view illustrating a portion indicated by the dashed-dotted line X1-X2 in FIG. 32A1. FIG. 32A3 is a cross-sectional view illustrating a portion indicated by a dashed-dotted line Y1-Y2 in FIG. 32A1.

FIG. 32B1 illustrates a state where the imaging device is bent in the direction of a dashed-dotted chain X3-X4 and the direction of a dashed-dotted line Y3-Y4. FIG. 32B2 is a cross-sectional view illustrating a portion indicated by the dashed-dotted line X3-X4 in FIG. 32B1. FIG. 32B3 is a cross-sectional view illustrating a portion indicated by the dashed-dotted line Y3-Y4 in FIG. 32B1.

The bent imaging device enables the curvature of field and astigmatism to be reduced. Thus, the optical design of lens and the like, which is used in combination of the imaging device, can be facilitated. For example, the number of lens used for aberration correction can be reduced; accordingly, a reduction of size or weight of electronic devices using the imaging device, and the like, can be achieved. In addition, the quality of a captured image can be improved.

<CPU>

A CPU including a semiconductor device such as any of the above-described transistors or the above-described memory device is described below.

Figure 33:
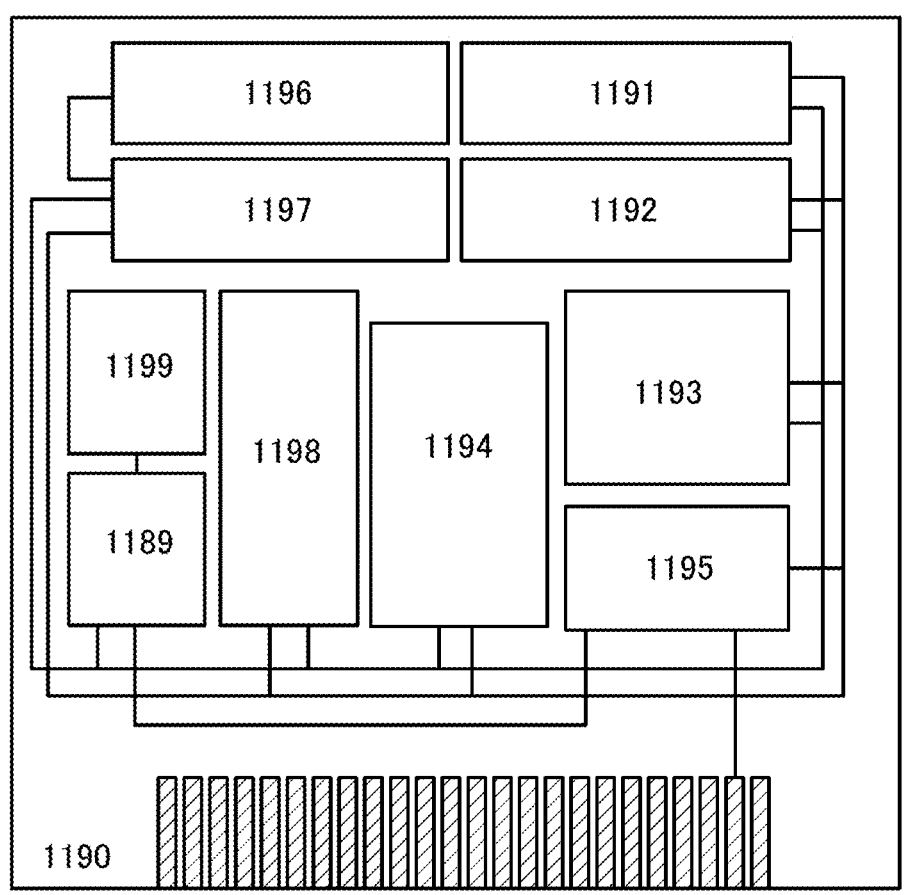
FIG. 33 is a block diagram illustrating a semiconductor device of one embodiment of the present invention.

FIG. 33 is a block diagram illustrating a configuration example of a CPU including any of the above-described transistors as a component.

The CPU illustrated in FIG. 33 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and a ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 27 is just an example in which the configuration has been simplified, and an actual CPU may have a variety of configurations depending on the application. For example, the CPU may have the following configuration: a structure including the CPU illustrated in FIG. 33 or an arithmetic circuit is considered as one core; a plurality of such cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 33, a memory cell is provided in the register 1196. For the memory cell of the register 1196, any of the above-described transistors, the above-described memory device, or the like can be used.

In the CPU illustrated in FIG. 33, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retention by the flip-flop is selected, a power supply voltage is supplied to the memory cell in the register 1196. When data retention by the capacitor is selected, the data is rewritten in the capacitor, and supply of a power supply voltage to the memory cell in the register 1196 can be stopped.

Figure 34:
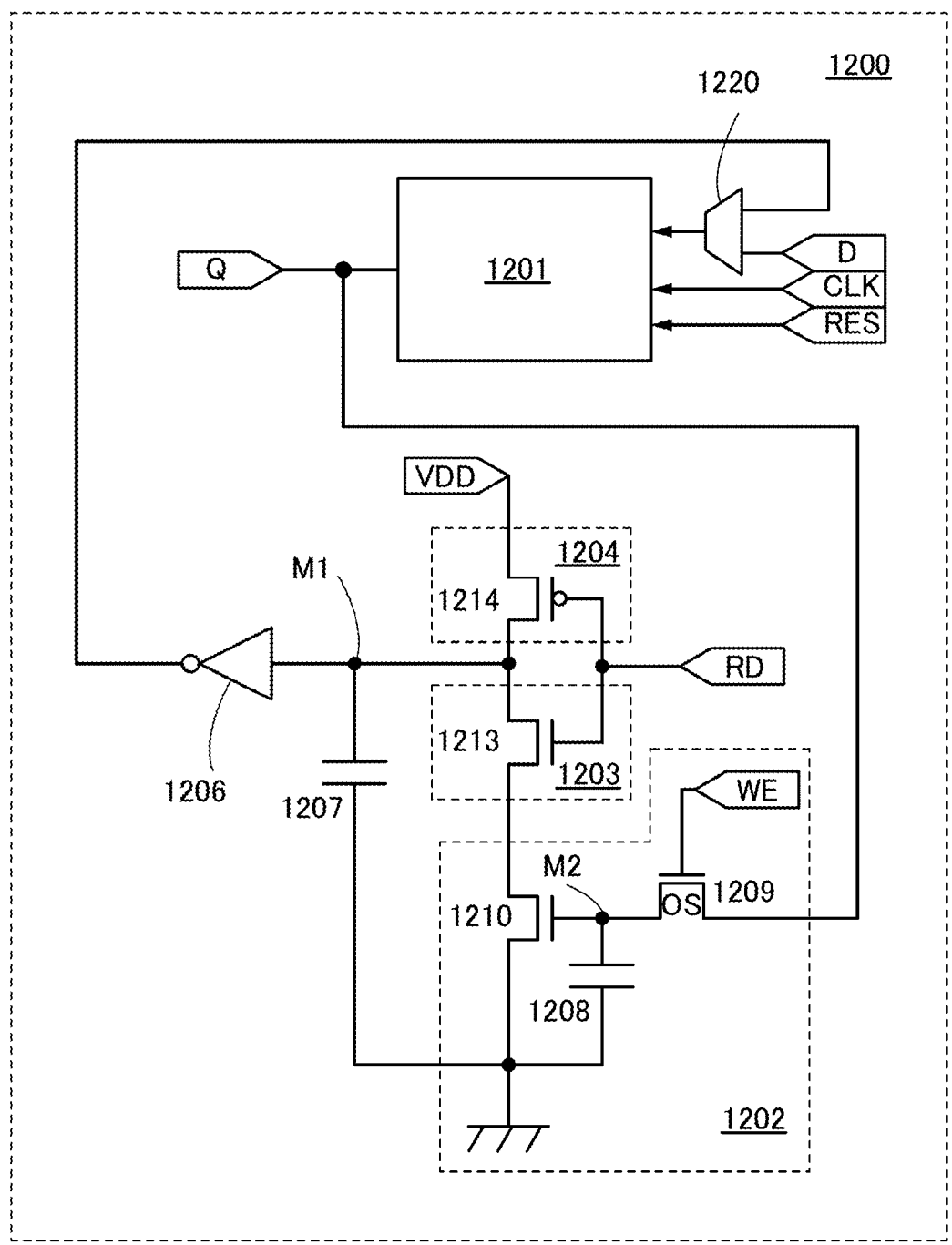
FIG. 34 is a circuit diagram illustrating a semiconductor device of one embodiment of the present invention.

FIG. 34 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to the gate of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 34 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 34, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 34, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor may be included besides the transistor 1209, and a transistor in which a channel is formed in a film formed using a semiconductor other than an oxide semiconductor or in the substrate 1190 can be used for the rest of the transistors.

As the circuit 1201 in FIG. 34, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency (RF) device.

<Display Device>

A display device of one embodiment of the present invention is described below with reference to FIGS. 35A to 35C and FIGS. 36A and 36B.

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or TCP; a module in which a printed wiring board is provided at the end of TCP; and a module in which an integrated circuit (IC) is mounted directly on a display element by a COG method.

Figure 35A:
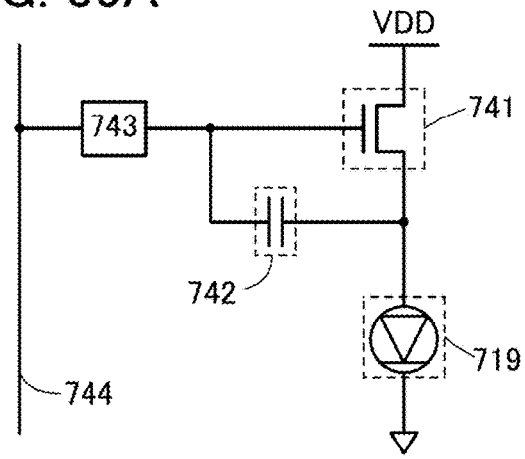
FIGS. 35A to 35C are a circuit diagram, a top view, and a cross-sectional view illustrating a semiconductor device of one embodiment of the present invention.
Figure 35B:
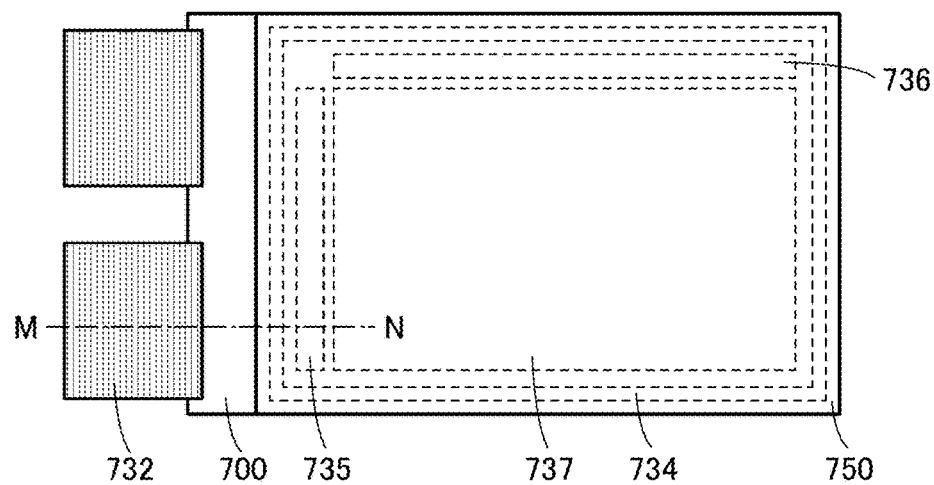
Figure 35C:
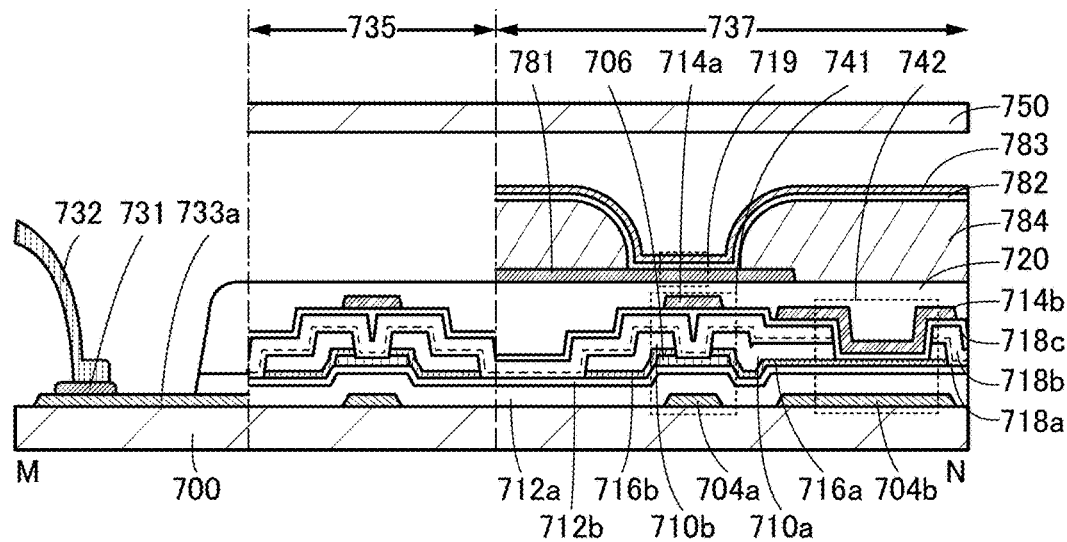

FIGS. 35A to 35C illustrate an example of an EL display device of one embodiment of the present invention. FIG. 35A is a circuit diagram of a pixel in an EL display device. FIG. 35B is a plan view showing the whole of the EL display device.

FIG. 35A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Further, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Further, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 35A includes a switching element 743, a transistor 741, a capacitor 742, and a light-emitting element 719.

Note that FIG. 35A and the like each illustrate an example of a circuit structure; therefore, a transistor can be provided additionally. In contrast, for each node in FIG. 35A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A drain of the transistor 741 is supplied with a power supply potential VDD. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, any of the above-described transistors can be used, for example.

FIG. 35B is a plan view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 35C is a cross-sectional view of the EL display device taken along part of dashed-dotted line M-N in FIG. 35B.

FIG. 35C illustrates a structure of the transistor 741 including a conductor 704a over the substrate 700; an insulator 712a over the conductor 704a; an insulator 712b over the insulator 712a; a semiconductor 706 that is over the insulator 712b and overlaps the conductor 704a; a conductor 716a and a conductor 716b in contact with the semiconductor 706; an insulator 710a over the conductor 716a; an insulator 710b over the conductor 716b; an insulator 718a over the semiconductor 706, the conductor 716a, the conductor 716b, the insulator 710a, and the insulator 710b; an insulator 718b over the insulator 718a; an insulator 718c over the insulator 718b; and a conductor 714a that is over the insulator 718c and overlaps the semiconductor 706. Note that the structure of the transistor 741 is just an example; the transistor 741 may have a structure different from that illustrated in FIG. 35C.

Thus, in the transistor 741 illustrated in FIG. 35C, the conductor 704a serves as a gate electrode, the insulator 712a and the insulator 712b serve as a gate insulator, the conductor 716a serves as a source electrode, the conductor 716b serves as a drain electrode, the insulator 718a, the insulator 718b, and the insulator 718c serve as a gate insulator, and the conductor 714a serves as a gate electrode. Note that in some cases, electrical characteristics of the semiconductor 706 change if light enters the semiconductor 706. To prevent this, it is preferable that one or more of the conductor 704a, the conductor 716a, the conductor 716b, and the conductor 714a have a light-blocking property.

Note that the interface between the insulator 718a and the insulator 718b is indicated by a broken line. This means that the boundary between them is not clear in some cases. For example, in the case where the insulator 718a and the insulator 718b are formed using insulators of the same kind, the insulator 718a and the insulator 718b are not distinguished from each other in some cases depending on an observation method.

FIG. 35C illustrates a structure of the capacitor 742 including a conductor 704b over the substrate; the insulator 712a over the conductor 704b; the insulator 712b over the insulator 712a; the conductor 716a that is over the insulator 712b and overlaps the conductor 704b; the insulator 718a over the conductor 716a; the insulator 718b over the insulator 718a; the insulator 718c over the insulator 718b; and a conductor 714b that is over the insulator 718c and overlaps the conductor 716a. In this structure, part of the insulator 718a and part of the insulator 718b are removed in a region where the conductor 716a and the conductor 714b overlap each other.

In the capacitor 742, each of the conductor 704b and the conductor 714b serves as one electrode, and the conductor 716a serves as the other electrode.

Thus, the capacitor 742 can be formed using a film of the transistor 741. The conductor 704a and the conductor 704b are preferably conductors of the same kind, in which case the conductor 704a and the conductor 704b can be formed through the same step. Furthermore, the conductor 714a and the conductor 714b are preferably conductors of the same kind, in which case the conductor 714a and the conductor 714b can be formed through the same step.

The capacitor 742 illustrated in FIG. 35C has a large capacitance per area occupied by the capacitor. Therefore, the EL display device illustrated in FIG. 35C has high display quality. Note that although the capacitor 742 illustrated in FIG. 35C has the structure in which the part of the insulator 718a and the part of the insulator 718b are removed to reduce the thickness of the region where the conductor 716a and the conductor 714b overlap with each other, the structure of the capacitor according to one embodiment of the present invention is not limited to the structure. For example, a structure in which a part of the insulator 718c is removed to reduce the thickness of the region where the conductor 716a and the conductor 714b overlap with each other may be used.

An insulator 720 is provided over the transistor 741 and the capacitor 742. Here, the insulator 720 may have an opening portion reaching the conductor 716a that serves as the source electrode of the transistor 741. A conductor 781 is provided over the insulator 720. The conductor 781 may be electrically connected to the transistor 741 through the opening portion in the insulator 720.

A partition wall 784 having an opening portion reaching the conductor 781 is provided over the conductor 781. A light-emitting layer 782 in contact with the conductor 781 through the opening portion provided in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 36A:
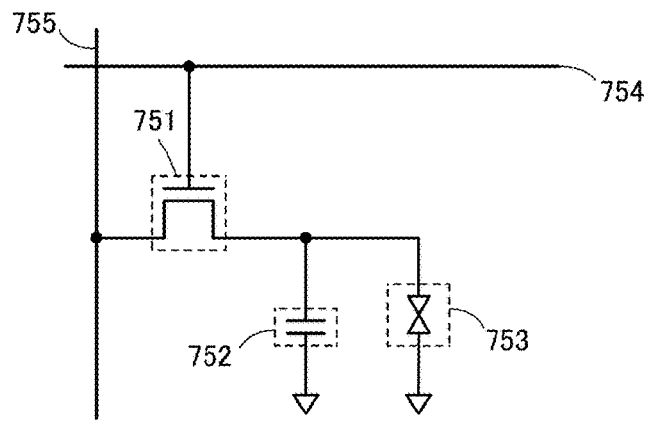
FIGS. 36A and 36B are a circuit diagram and a cross-sectional view illustrating a semiconductor device of one embodiment of the present invention.

FIG. 36A is a circuit diagram illustrating a configuration example of a pixel of a liquid crystal display device. A pixel shown in FIGS. 36A and 36B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring to which a common potential is supplied. The common potential supplied to the wiring electrically connected to the other electrode of the capacitor 752 may be different from that supplied to the other electrode of the liquid crystal element 753.

Figure 36B:
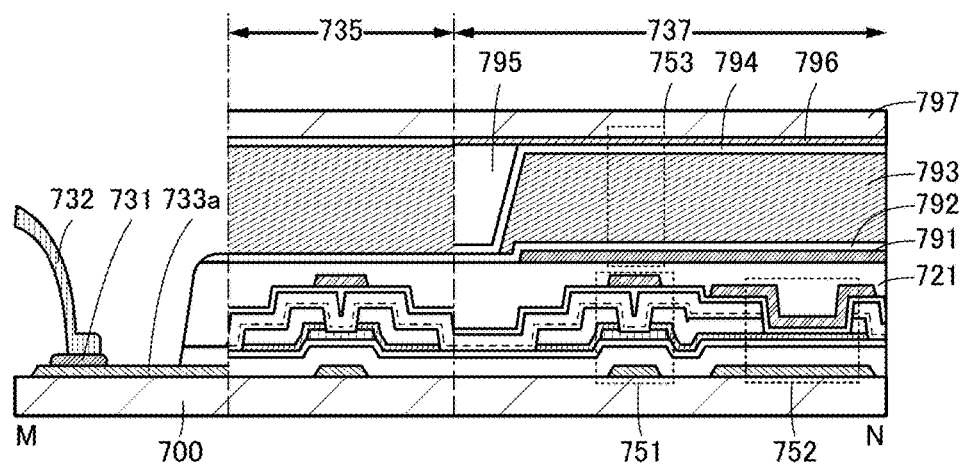

Note that the description of the liquid crystal display device is made on the assumption that the plan view of the liquid crystal display device is similar to that of the EL display device. FIG. 36B is a cross-sectional view of the liquid crystal display device taken along dashed-dotted line M-N in FIG. 35B. In FIG. 36B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 36B corresponds to, but is not limited to, the structure of the capacitor 742 in FIG. 35C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening portion reaching the transistor 751. A conductor 791 is provided over the insulator 721. The conductor 791 is electrically connected to the transistor 751 through the opening portion in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of an EL element (e.g., an EL element including organic and inorganic materials, an organic EL element, or an inorganic EL element), a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Display media whose contrast, luminance, reflectivity, transmittance, or the like is changed by electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes. Thus, the power consumption can be further reduced.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an MN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 37A to 37F illustrate specific examples of these electronic devices.

Figure 37A:
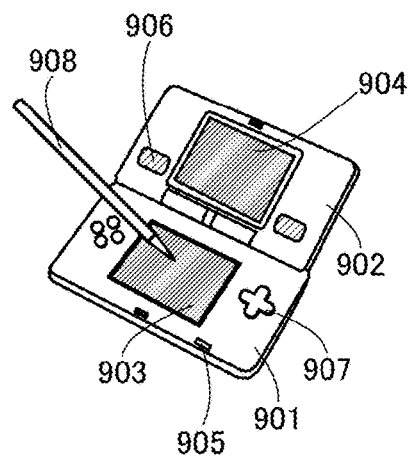
FIGS. 37A to 37F are perspective views each illustrating an electronic device of one embodiment of the present invention.

FIG. 37A illustrates a portable game console including a housing 901, a housing 902, a display portion 903, a display portion 904, a microphone 905, a speaker 906, an operation key 907, a stylus 908, and the like. Although the portable game console in FIG. 37A has the two display portions 903 and 904, the number of display portions included in a portable game console is not limited to this.

Figure 37B:
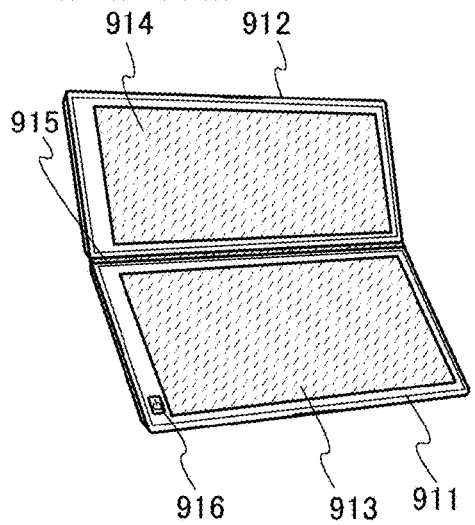

FIG. 37B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched in accordance with the angle at the joint 915 between the first housing 911 and the second housing 912. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 37C:
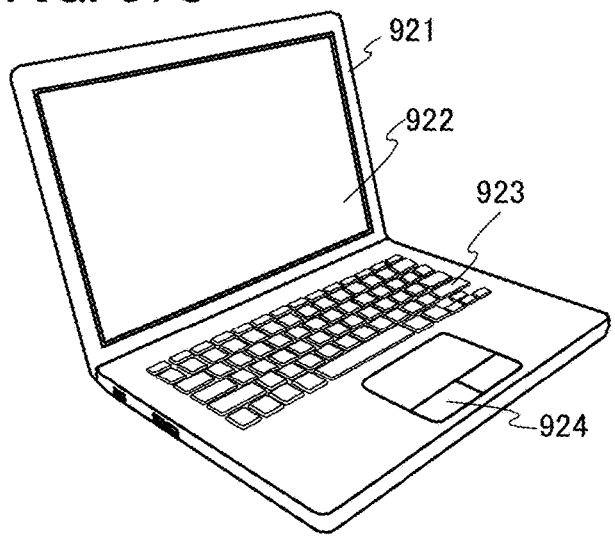

FIG. 37C illustrates a laptop personal computer, which includes a housing 921, a display portion 922, a keyboard 923, a pointing device 924, and the like.

Figure 37D:
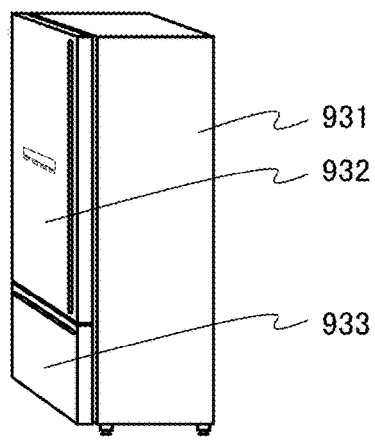

FIG. 37D illustrates an electric refrigerator-freezer, which includes a housing 931, a door for a refrigerator 932, a door for a freezer 933, and the like.

Figure 37E:
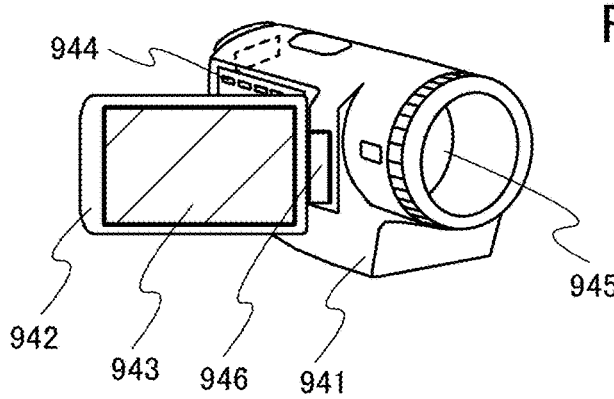

FIG. 37E illustrates a video camera, which includes a first housing 941, a first housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 37F:
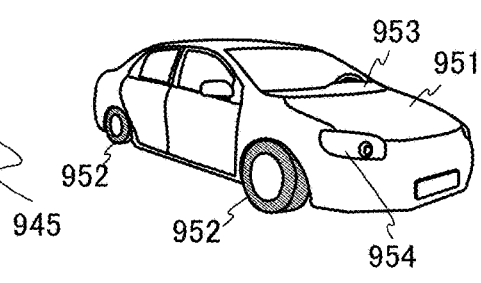

FIG. 37F illustrates a car including a car body 951, wheels 952, a dashboard 953, lights 954, and the like.

Example 1

In this example, an example in which the processing method of one embodiment of the present invention is used is described.

First, a 126.6-mm-square silicon substrate was prepared. Next, a 400-nm-thick silicon oxide was formed by a thermal oxidation method. Then, a 40-nm-thick In—Ga—Zn oxide was formed by a sputtering method. After that, a 50-nm-thick tungsten film was formed by a sputtering method.

Subsequently, a 170-nm-thick BARC was formed. Next, a resist was formed. Then, a resist was exposed to light using a photomask. After that, the resist was developed to form a groove with a size of 300 nm.

Subsequently, plasma was generated using a trifluoromethane gas at a flow rate of 50 sccm and a helium gas at a flow rate of 100 sccm, and plasma treatment was performed. Note that the pressure was 5.5 Pa, the substrate temperature was 70° C., the ICP power was 475 W, the bias power was 300 W, and the process time was 80 seconds. At that time, an organic substance was attached to the side surfaces of the resists and the BARCs in a manner similar to that illustrated in FIG. 6C.

Next, plasma was generated using a chlorine gas at a flow rate of 45 sccm, a carbon tetrafluoride gas at a flow rate of 55 sccm, and an oxygen gas at a flow rate of 55 sccm, and plasma treatment was performed to etch the tungsten film. Note that the pressure was 0.67 Pa, the ICP power was 3000 W, the bias power was 110 W, and the process time was 15 seconds (the conditions are referred to as Condition A for etching tungsten). At this time, the tungsten film was etched in a manner similar to that illustrated in FIG. 6D.

Figure 46A:
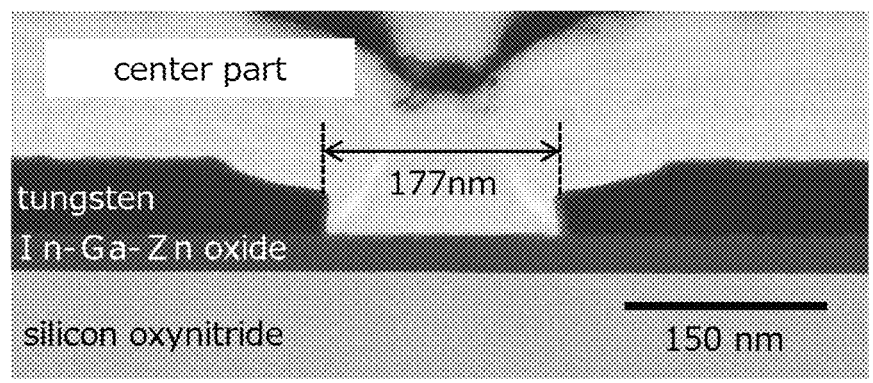
FIGS. 46A and 46B are STEM images.
Figure 46B:
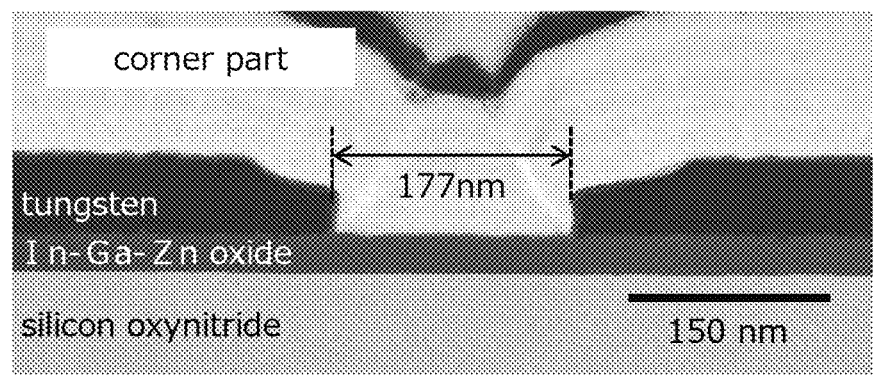

Next, the organic substance, the resists, and the BARCs were removed by plasma ashing and wet etching, so that a shape as illustrated in FIG. 6E was obtained. The results are shown in FIGS. 46A and 46B. Note that FIG. 46A shows a cross-sectional scanning transmission electron microscope (STEM) image of a center part of the silicon substrate, and FIG. 46B is a cross-sectional STEM image of a corner part of the silicon substrate.

Both in FIGS. 46A and 46B, the distance between the tungsten films was 177 nm. That is, a groove smaller than the groove in the resist was able to be formed in the tungsten film.

In addition, similar evaluation was also performed in the case where the conditions for etching tungsten film were changed. Specifically, plasma was generated using a carbon tetrafluoride gas at a flow rate of 60 sccm and an oxygen gas at a flow rate of 40 sccm, and plasma treatment was performed to etch the tungsten film. Note that the pressure was 2 Pa, the ICP power was 1000 W, the bias power was 25 W, and the process time was 35 seconds (the conditions are referred to as Condition B for etching tungsten)

Figure 47A:
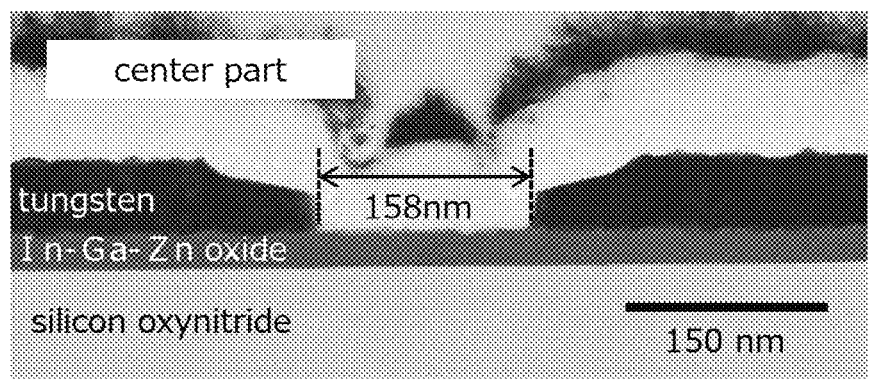
FIGS. 47A and 47B are STEM images.
Figure 47B:
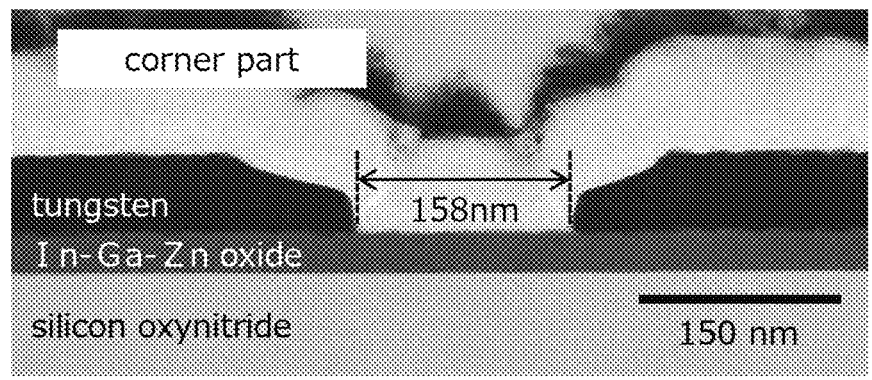

Next, the organic substance, the resists, and the BARCs were removed by plasma ashing and wet etching. The results are shown in FIGS. 47A and 47B. Note that FIG. 47A shows a cross-sectional STEM image of a center part of the silicon substrate, and FIG. 47B is a cross-sectional STEM image of a corner part of the silicon substrate.

Both in FIGS. 47A and 47B, the distance between the tungsten films was 158 nm. Also under this condition, a groove smaller than the groove in the resist was able to be formed in the tungsten film.

Example 2

In this example, a transistor with a reduced channel length was fabricated with the use of the tungsten films described in Example 1 as the source and drain electrodes of the transistor.

Figure 48A:
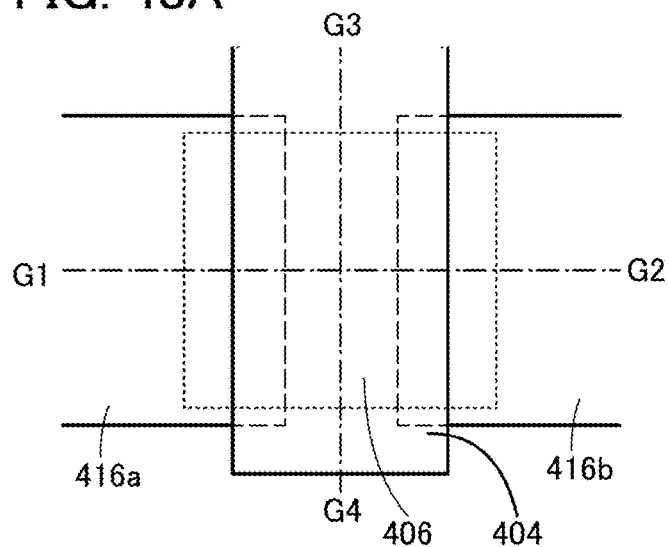
FIGS. 48A and 48B are a top view and a cross-sectional view of a transistor.
Figure 48B:
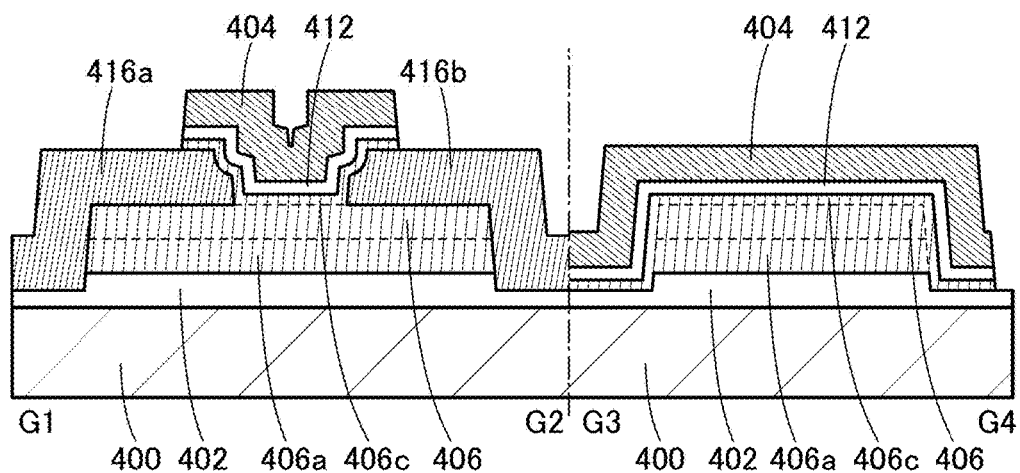

FIGS. 48A and 48B illustrate the structure of the fabricated transistor. FIG. 48A is a top view of the transistor, and FIG. 48B is a cross-sectional view thereof taken along dashed dotted lines G1-G2 and G3-G4 in FIG. 48A. Since the structure of the transistor in FIGS. 48A and 48B is similar to that of the transistor illustrated in FIG. 12A, the same reference numerals are used. Furthermore, in a manner similar to that illustrated in FIGS. 13C and 13D, the semiconductors 406a and 406c were provided above and below the semiconductor 406.

A 126.6-mm-square silicon substrate was used as the substrate 400. As the insulator 402, a stack of a 100-nm-thick silicon oxide and a 300-nm-thick silicon oxynitride was used. As the semiconductor 406a, a 20-nm-thick In—Ga—Zn oxide formed using an In—Ga—Zn oxide target with an atomic ratio of In:Ga:Zn=1:3:4 was used. As the semiconductor 406, a 20-nm-thick In—Ga—Zn oxide formed using an In—Ga—Zn oxide target with an atomic ratio of In:Ga:Zn=1:1:1 was used. As the semiconductor 406c, a 5-nm-thick In—Ga—Zn oxide formed using an In—Ga—Zn oxide target with an atomic ratio of In:Ga:Zn=1:3:4 was used. As each of the conductors 416a and 416b, 50-nm-thick tungsten was used. As the insulator 412, a 10-nm-thick silicon oxynitride was used. As the conductor 404, 30-nm-thick tantalum nitride and 135-nm-thick tungsten were used.

Figure 49A:
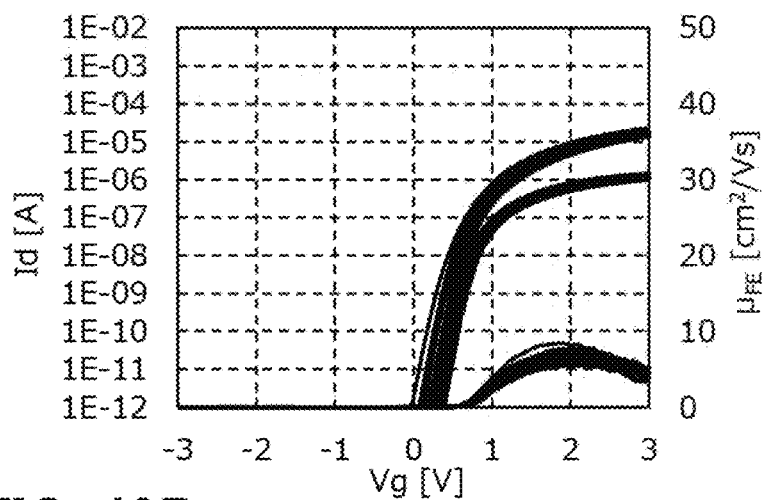
FIGS. 49A and 49B show Id-Vg characteristics of transistors.
Figure 49B:
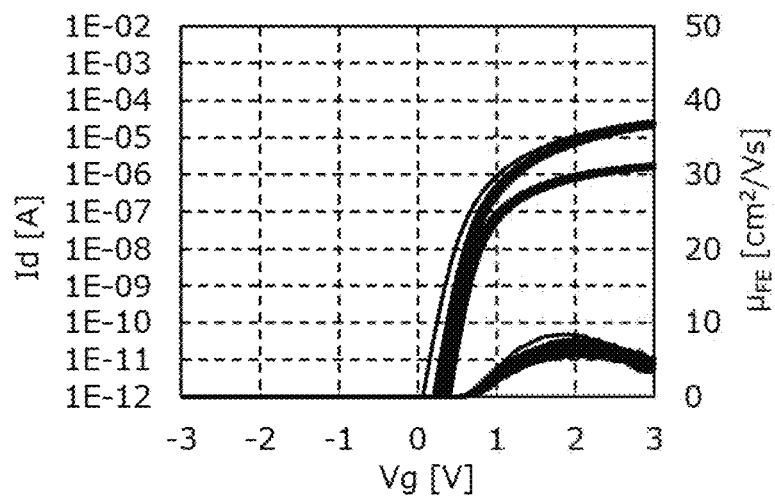

Id-Vg characteristics of 25 transistors fabricated using Condition A for etching tungsten, at a drain voltage Vd of 0.1 V or 1.8 V, were measured. Note that, Id means a drain current and Vg means gate voltage. FIG. 49A shows Id-Vg characteristics of transistors with a channel length of 180 nm and a channel width of 500 nm. FIG. 49B shows Id-Vg characteristics of transistors with a channel length of 180 nm and a channel width of 800 nm.

Figure 50A:
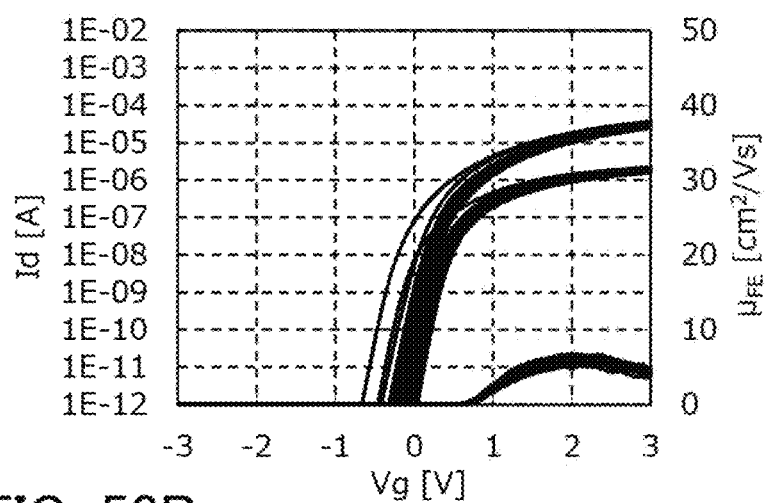
FIGS. 50A and 50B show Id-Vg characteristics of transistors.
Figure 50B:
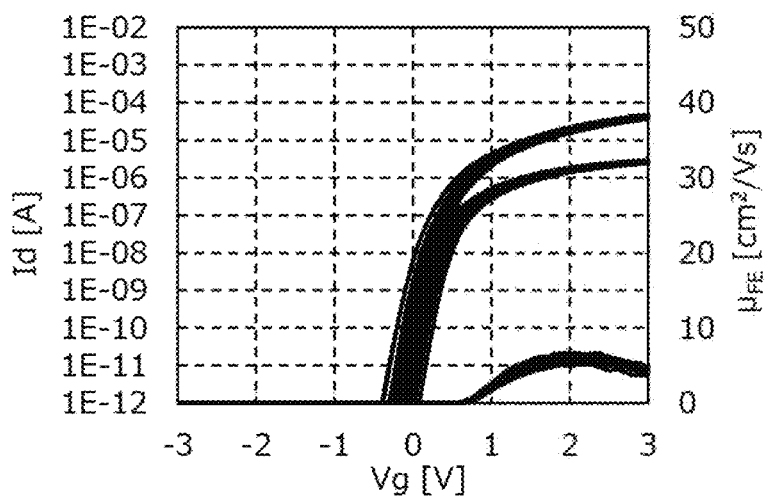

Id-Vg characteristics of 25 transistors fabricated using Condition B for etching tungsten, at a drain voltage Vd of 0.1 V or 1.8 V, were measured. FIG. 50A shows Id-Vg characteristics of transistors with a channel length of 180 nm and a channel width of 500 nm. FIG. 50B shows Id-Vg characteristics of transistors with a channel length of 180 nm and a channel width of 800 nm.

According to FIGS. 49A and 49B and FIGS. 50A and 50B, the transistors fabricated in this example have small variation and favorable electrical characteristics. In particular, the transistors fabricated using Condition A for etching tungsten had small variation. That is, the shapes on the 126.6-mm-square silicon substrate are uniform.

EXPLANATION OF REFERENCE

110: layer; 110a: layer; 110b: layer; 116: layer; 116a: layer; 116b: layer; 120: BARC; 122: resist; 124: organic substance; 200: imaging device; 201: switch; 202: switch; 203: switch; 210: pixel portion; 211: pixel; 212: subpixel; 212B: subpixel; 212G: subpixel; 212R: subpixel; 220: photoelectric conversion element; 230: pixel circuit; 231: wiring; 247: wiring; 248: wiring; 249: wiring; 250: wiring; 253: wiring; 254: filter; 254B: filter; 254G: filter; 254R: filter; 255: lens; 256: light; 257: wiring; 260: peripheral circuit; 270: peripheral circuit; 280: peripheral circuit; 290: peripheral circuit; 291: light source; 300: silicon substrate; 310: layer; 320: layer; 330: layer; 340: layer; 351: transistor; 352: transistor; 353: transistor; 360: photodiode; 361: anode; 363: low-resistance region; 370: plug; 371: wiring; 372: wiring; 373: wiring; 380: insulator; 400: substrate; 401: insulator; 402: insulator; 404: conductor; 406: semiconductor; 406a: semiconductor; 406c: semiconductor; 410: insulator; 410a: insulator; 410b: insulator; 411: insulator; 412: insulator; 413: conductor; 414: conductor; 416: conductor; 416a: conductor; 416b: conductor; 450: semiconductor substrate; 452: insulator; 454: conductor; 456: region; 460: region; 462: insulator; 464: insulator; 466: insulator; 468: insulator; 472a: region; 472b: region; 474a: conductor; 474b: conductor; 474c: conductor; 476a: conductor; 476b: conductor; 478a: conductor; 478b: conductor; 478c: conductor; 480a: conductor; 480b: conductor; 480c: conductor; 490: insulator; 492: insulator; 494: insulator; 496a: conductor; 496b: conductor; 496c: conductor; 496d: conductor; 498a: conductor; 498b: conductor; 498c: conductor; 498d: conductor; 500: substrate; 502: insulator; 503: insulator; 504: conductor; 506: semiconductor; 510: insulator; 510a: insulator; 510b: insulator; 512: insulator; 513: conductor; 516: conductor; 516a: conductor; 516b: conductor; 536: semiconductor; 540: insulator; 546: conductor; 700: substrate; 704a: conductor; 704b: conductor; 706: semiconductor; 710a: insulator; 710b: insulator; 712a: insulator; 712b: insulator; 714a: conductor; 714b: conductor; 716a: conductor; 716b: conductor; 718a: insulator; 718b: insulator; 718c: insulator; 719: light-emitting element; 720: insulator; 721: insulator; 731: terminal; 732: FPC; 733a: wiring; 734: sealant; 735: driver circuit; 736: driver circuit; 737: pixel; 741: transistor; 742: capacitor; 743: switching element; 744: signal line; 750: substrate; 751: transistor; 752: capacitor; 753: liquid crystal element; 754: scan line; 755: signal line; 781: conductor; 782: light-emitting layer; 783: conductor; 784: partition wall; 791: conductor; 792: insulator; 793: liquid crystal layer; 794: insulator; 795: spacer; 796: conductor; 797: substrate; 901: housing; 902: housing; 903: display portion; 904: display portion; 905: microphone; 906: speaker; 907: operation key; 908: stylus; 911: housing; 912: housing; 913: display portion; 914: display portion; 915: joint; 916: operation key; 921: housing; 922: display portion; 923: keyboard; 924: pointing device; 931: housing; 932: refrigerator door; 933: freezer door; 941: housing; 942: housing; 943: display portion; 944: operation key; 945: lens; 946: joint; 951: car body; 952: wheel; 953: dashboard; 954: light; 1189: ROM interface; 1190: substrate; 1191: ALU; 1192: ALU controller; 1193: instruction decoder; 1194: interrupt controller; 1195: timing controller; 1196: register; 1197: register controller; 1198: bus interface; 1199: ROM; 1200: memory element; 1201: circuit; 1202: circuit; 1203: switch; 1204: switch; 1206: logic element; 1207: capacitor; 1208: capacitor; 1209: transistor; 1210: transistor; 1213: transistor; 1214: transistor; 1220: circuit; 2100: transistor; 2200: transistor; 3001: wiring; 3002: wiring; 3003: wiring; 3004: wiring; 3005: wiring; 3200: transistor; 3300: transistor; 3400: capacitor; 5100: pellet; 5100a: pellet; 5100b: pellet; 5101: ion; 5102: zinc oxide layer; 5103: particle; 5105a: pellet; 5105a1: region; 5105a2: pellet; 5105b: pellet; 5105c: pellet; 5105d: pellet; 5105d1: region; 5105e: pellet; 5120: substrate; 5130: target; 5161: region.

This application is based on Japanese Patent Application serial no. 2014-191690 filed with Japan Patent Office on Sep. 19, 2014, the entire contents of which are hereby incorporated by reference.

The invention claimed is:

1. A method for manufacturing a semiconductor device, comprising the steps of:
forming a semiconductor over a substrate;
forming a first conductor over the semiconductor;
forming a first insulator over the first conductor;
forming a resist over the first insulator;
performing light exposure and development on the resist so that a first region and a second region of the resist remain and a part of the first insulator is exposed;
applying a bias in a direction perpendicular to a top surface of the substrate and generating plasma using a gas containing carbon and halogen;
depositing and etching an organic substance with the plasma;
etching the first insulator using the organic substance, the first region, and the second region as masks to form a second insulator and a third insulator and expose the first conductor;
etching the first conductor using the second insulator and the third insulator as masks to form a second conductor and a third conductor and expose the semiconductor;
removing the organic substance, the first region, and the second region;
forming a fourth insulator over an exposed part of the semiconductor; and
forming a fourth conductor over the fourth insulator,
wherein an etching rate of the organic substance is higher than a deposition rate of the organic substance in the part of the first insulator, and
wherein the deposition rate of the organic substance is higher than the etching rate of the organic substance in a side surface of the first region.

2. The method for manufacturing a semiconductor device, according to claim 1, wherein a distance between the second conductor and the third conductor is less than or equal to 80% of a distance between the first region and the second region.

3. The method for manufacturing a semiconductor device, according to claim 1, comprising the step of forming a bottom anti-reflective coating before the forming of the resist.

4. A method for manufacturing a semiconductor device, comprising the steps of:
forming a semiconductor over a substrate;
forming a first conductor over the semiconductor;

forming a first insulator over the first conductor;
forming a resist over the first insulator;
performing light exposure and development on the resist so that a first region and a second region of the resist remain and a part of the first insulator is exposed;
applying a bias in a direction perpendicular to a top surface of the substrate and generating plasma using a gas containing carbon and halogen;
depositing and etching an organic substance with the plasma;
etching the first insulator using the organic substance, the first region, and the second region as masks to form a second insulator and a third insulator and expose the first conductor;
etching the first conductor using the second insulator and the third insulator as masks to form a second conductor and a third conductor and expose the semiconductor; and
forming a fourth conductor over the second insulator and the third insulator,
wherein an etching rate of the organic substance is higher than a deposition rate of the organic substance in the part of the first insulator, and
wherein the deposition rate of the organic substance is higher than the etching rate of the organic substance in a side surface of the first region.

5. The method for manufacturing a semiconductor device, according to claim 4, wherein a distance between the second conductor and the third conductor is less than or equal to 80% of a distance between the first region and the second region.

6. The method for manufacturing a semiconductor device, according to claim 4, comprising the step of forming a bottom anti-reflective coating before the forming of the resist.

7. A method for manufacturing a semiconductor device, comprising the steps of:
forming a semiconductor over a substrate;
forming a first conductor over the semiconductor;
forming a first insulator over the first conductor;
forming a resist over the first insulator;
performing light exposure and development on the resist so that a first region and a second region of the resist remain and a part of the first insulator is exposed;
applying a bias in a direction perpendicular to a top surface of the substrate and generating plasma using a gas containing carbon and halogen;
depositing and etching an organic substance with the plasma;
etching the first insulator using the organic substance, the first region, and the second region as masks to form a second insulator and a third insulator and expose the first conductor;
etching the first conductor using the second insulator and the third insulator as masks to form a second conductor and a third conductor and expose the semiconductor; and
forming a fourth conductor over the second insulator and the third insulator,
wherein an etching rate of the organic substance is higher than a deposition rate of the organic substance in the part of the first insulator.

8. The method for manufacturing a semiconductor device, according to claim 7, wherein a distance between the second conductor and the third conductor is less than or equal to 80% of a distance between the first region and the second region.

9. The method for manufacturing a semiconductor device, according to claim 7, comprising the step of forming a bottom anti-reflective coating before the forming of the resist.

10. A method for manufacturing a semiconductor device, comprising the steps of:
forming a first conductor over a semiconductor;
forming a first insulator over the first conductor;
forming a resist over the first insulator;
performing light exposure and development on the resist so that a first region and a second region of the resist remain and a part of the first insulator is exposed;
applying a bias and generating plasma using a gas containing carbon and halogen;
depositing and etching an organic substance with the plasma;
etching the first insulator using the organic substance, the first region, and the second region as masks to form a second insulator and a third insulator and expose the first conductor;
etching the first conductor using the second insulator and the third insulator as masks to form a second conductor and a third conductor and expose the semiconductor;
forming a fourth conductor over the second insulator and the third insulator,
wherein an etching rate of the organic substance is higher than a deposition rate of the organic substance in the part of the first insulator.

11. The method for manufacturing a semiconductor device, according to claim 10, wherein a distance between the second conductor and the third conductor is less than or equal to 80% of a distance between the first region and the second region.

12. The method for manufacturing a semiconductor device, according to claim 10, comprising the step of forming a bottom anti-reflective coating before the forming of the resist.

13. A method for manufacturing a semiconductor device, comprising the steps of:
forming a first conductor over a semiconductor;
forming a first insulator over the first conductor;
forming a resist over the first insulator;
performing light exposure and development on the resist so that a first region and a second region of the resist remain and a part of the first insulator is exposed;
applying a bias and generating plasma using a gas containing carbon and halogen;
depositing and etching an organic substance with the plasma;
etching the first insulator using the organic substance, the first region, and the second region as masks to expose the first conductor; and
forming a fourth conductor over the etched first insulator,
wherein a deposition rate of the organic substance is higher than an etching rate of the organic substance in a side surface of the first region.

14. The method for manufacturing a semiconductor device, according to claim 13, wherein the etched first insulator includes a second insulator and a third insulator.

15. The method for manufacturing a semiconductor device, according to claim 13, comprising the step of forming a bottom anti-reflective coating before the forming of the resist.

* * * * *